United States Patent
Licausi et al.

(10) Patent No.: US 9,812,351 B1
(45) Date of Patent: Nov. 7, 2017

(54) INTERCONNECTION CELLS HAVING VARIABLE WIDTH METAL LINES AND FULLY-SELF ALIGNED CONTINUITY CUTS

(71) Applicant: GLOBALFOUNDRIES Inc., Grand Cayman (KY)

(72) Inventors: Nicholas Vincent Licausi, Watervliet, NY (US); Guillaume Bouche, Albany, NY (US); Lars Wolfgang Liebmann, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/379,645

(22) Filed: Dec. 15, 2016

(51) Int. Cl.
*H01L 21/768* (2006.01)
*H01L 23/522* (2006.01)
(Continued)

(52) U.S. Cl.
CPC .. *H01L 21/76816* (2013.01); *H01L 21/76877* (2013.01); *H01L 23/528* (2013.01);
(Continued)

(58) Field of Classification Search
None
See application file for complete search history.

(56) References Cited

U.S. PATENT DOCUMENTS

| 6,455,436 B1 | 9/2002 | Ueda et al. |
| 7,183,142 B2 * | 2/2007 | Anderson ............. H01L 29/785 257/E27.112 |

(Continued)

OTHER PUBLICATIONS

U.S. Appl. No. 15/077,384, filed Mar. 22, 2016.
(Continued)

*Primary Examiner* — Karen Kusumakar
(74) *Attorney, Agent, or Firm* — Heslin Rothenberg Farley & Mesiti P.C.

(57) ABSTRACT

A method includes patterning a $1^{st}$ mandrel cell into a $1^{st}$ mandrel layer disposed above a dielectric layer of a semiconductor structure. The $1^{st}$ mandrel cell has $1^{st}$ mandrels, $1^{st}$ mandrel spaces and a mandrel cell pitch. A $2^{nd}$ mandrel cell is patterned into a $2^{nd}$ mandrel layer disposed above the $1^{st}$ mandrel layer. The $2^{nd}$ mandrel cell has $2^{nd}$ mandrels, $2^{nd}$ mandrel spaces, and the mandrel cell pitch. The $1^{st}$ and $2^{nd}$ mandrel cells are utilized to form metal line cells into the dielectric layer. The metal line cells have metal lines, spaces between the metal lines and a line cell pitch. The line cell pitch is equal to the mandrel cell pitch when the metal lines of the metal line cells are an even number. The line cell pitch is equal to half the mandrel cell pitch when the metal lines of the metal line cells are an odd number.

20 Claims, 41 Drawing Sheets

(51) Int. Cl.
  *H01L 23/528* (2006.01)
  *H01L 23/532* (2006.01)

(52) U.S. Cl.
  CPC ...... *H01L 23/5226* (2013.01); *H01L 23/5286* (2013.01); *H01L 23/53209* (2013.01); *H01L 23/53228* (2013.01); *H01L 23/53242* (2013.01); *H01L 23/53257* (2013.01)

(56) References Cited

U.S. PATENT DOCUMENTS

| | | |
|---|---|---|
| 8,298,943 B1 | 10/2012 | Arnold et al. |
| 8,518,824 B2 | 8/2013 | Arnold et al. |
| 8,999,848 B2 | 4/2015 | Lee et al. |
| 9,012,287 B2 | 4/2015 | Liaw |
| 9,123,656 B1 | 9/2015 | Hsieh et al. |
| 9,136,106 B2 * | 9/2015 | Wu .................. H01L 21/308 |
| 9,209,279 B1 | 12/2015 | Zhang et al. |
| 9,406,775 B1 | 8/2016 | Bouche et al. |
| 2005/0215040 A1 * | 9/2005 | Doyle .................. B82Y 10/00 438/585 |
| 2006/0055045 A1 | 3/2006 | Park et al. |
| 2008/0193658 A1 | 8/2008 | Millward |
| 2008/0227298 A1 | 9/2008 | Hirota |
| 2011/0240596 A1 | 10/2011 | Millward |
| 2011/0256723 A1 | 10/2011 | Lee et al. |
| 2011/0316125 A1 | 12/2011 | Thomas |
| 2012/0118854 A1 | 5/2012 | Smayling et al. |
| 2012/0132988 A1 | 5/2012 | Lui et al. |
| 2013/0196517 A1 | 8/2013 | Tsujita et al. |
| 2013/0244344 A1 | 9/2013 | Malmhall et al. |
| 2013/0329486 A1 | 12/2013 | Juengling |
| 2014/0038428 A1 * | 2/2014 | Huang ............ H01L 21/76816 438/780 |
| 2014/0054534 A1 | 2/2014 | Pellizzer et al. |
| 2014/0170853 A1 | 6/2014 | Shamma et al. |
| 2014/0258961 A1 | 9/2014 | Ke et al. |
| 2014/0273363 A1 | 9/2014 | Chiu et al. |
| 2014/0273464 A1 | 9/2014 | Shieh et al. |
| 2015/0056800 A1 | 2/2015 | Mebarki et al. |
| 2015/0072527 A1 | 3/2015 | Ng et al. |
| 2015/0087149 A1 | 3/2015 | He et al. |
| 2015/0108087 A1 | 4/2015 | Somervell et al. |
| 2015/0140811 A1 | 5/2015 | Huang et al. |
| 2015/0147882 A1 | 5/2015 | Yao et al. |
| 2015/0179652 A1 | 6/2015 | Wang et al. |
| 2015/0243654 A1 | 8/2015 | Zhong et al. |
| 2015/0318173 A1 | 11/2015 | Shih et al. |
| 2015/0339422 A1 | 11/2015 | Greco et al. |
| 2016/0049307 A1 | 2/2016 | Chen |
| 2016/0056075 A1 | 2/2016 | Wei et al. |
| 2016/0056104 A1 | 2/2016 | Bouche et al. |
| 2016/0064248 A1 | 3/2016 | Lee et al. |
| 2016/0086841 A1 | 3/2016 | Song et al. |
| 2016/0099178 A1 | 4/2016 | Zhana et al. |
| 2016/0225634 A1 * | 8/2016 | Anderson ........... H01L 21/3086 |
| 2016/0254191 A1 | 9/2016 | Tseng et al. |
| 2017/0221702 A1 | 8/2017 | Lee et al. |

OTHER PUBLICATIONS

U.S. Appl. No. 15/271,475, filed Sep. 21, 2016.
U.S. Appl. No. 15/271,497, filed Sep. 21, 2016.
U.S. Appl. No. 15/141,087, filed Apr. 28, 2016.
U.S. Appl. No. 15/379,605, filed Dec. 15, 2016.
U.S. Appl. No. 15/379,707, filed Dec. 15, 2016.
U.S. Appl. No. 15/379,740, filed Dec. 15, 2016.
U.S. Appl. No. 15/362,035, filed Nov. 28, 2016.
U.S. Appl. No. 15/271,519, filed Sep. 21, 2016.
U.S. Appl. No. 15/053,818, filed Feb. 25, 2016.
U.S. Appl. No. 15/077,480, filed Mar. 22, 2016.
U.S. Appl. No. 15/077,564, filed Mar. 22, 2016.

* cited by examiner

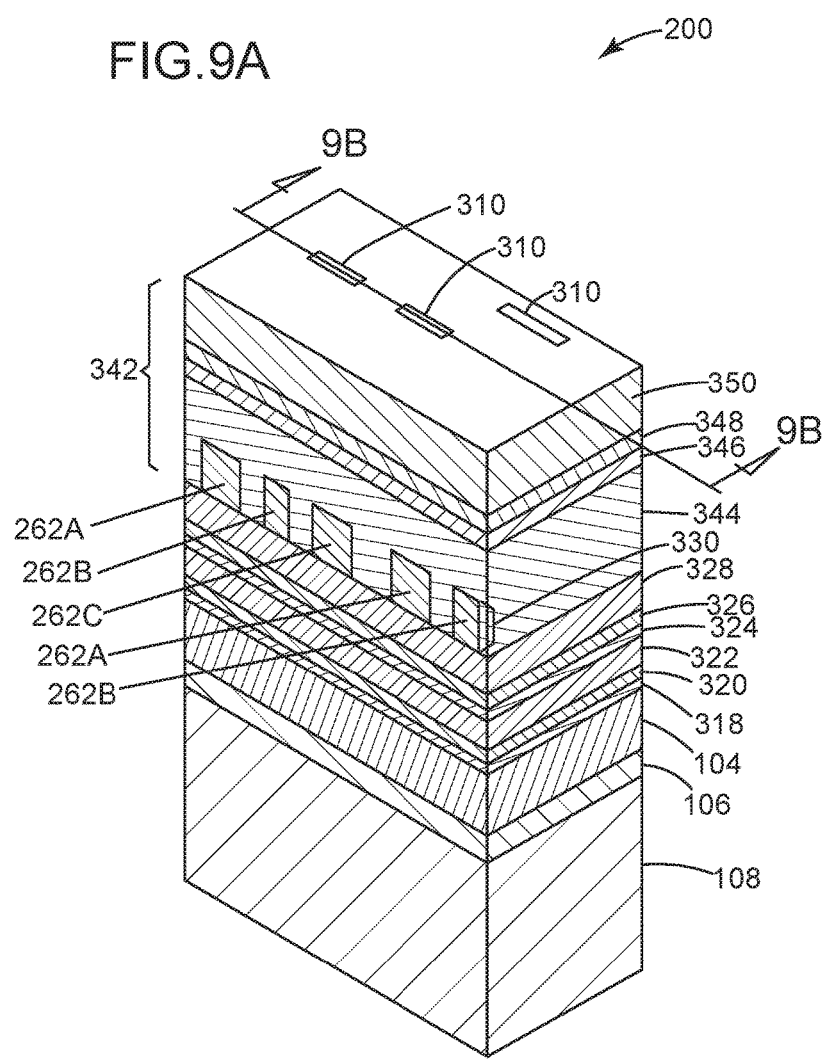

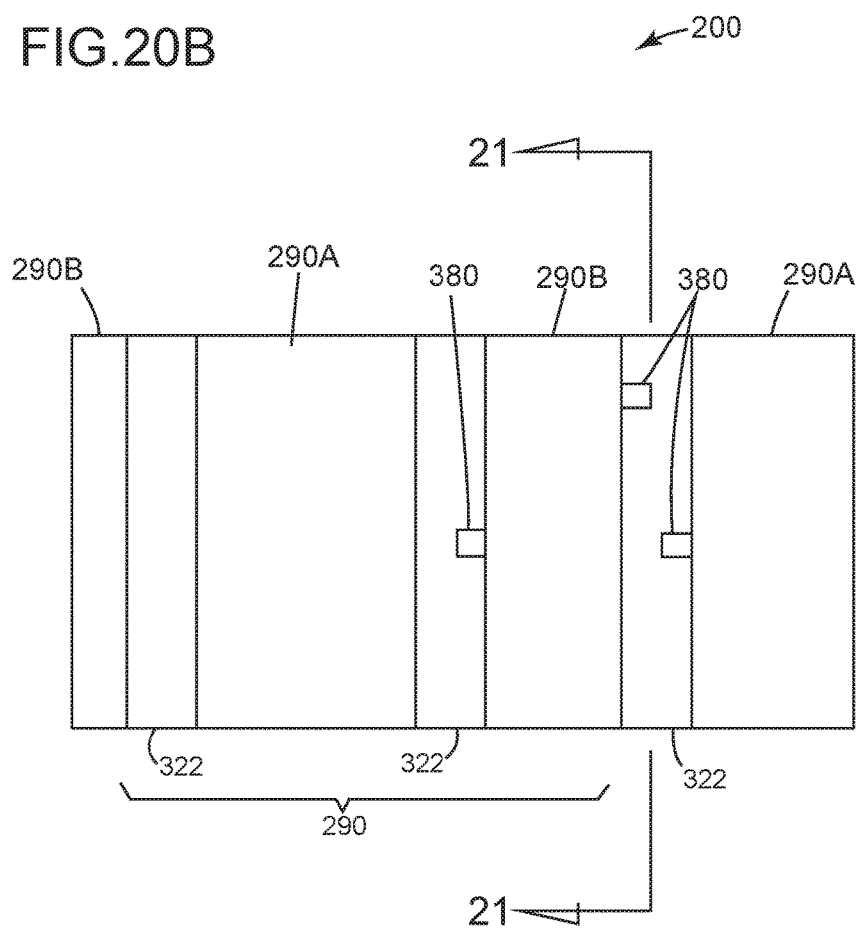

INTERCONNECTION CELLS HAVING VARIABLE WIDTH METAL LINES AND FULLY-SELF ALIGNED CONTINUITY CUTS

TECHNICAL FIELD

The present invention relates to semiconductor devices and methods of fabricating the same. More specifically, the invention relates to a method and apparatus of forming interconnection metal lines having variable line widths and fully-self aligned cuts for a semiconductor structure.

BACKGROUND

Self-aligned multiple patterning (SAMP) techniques (such as self-aligned double patterning (SADP) or self-aligned quadruple patterning (SAQP)) are currently used in ultra-high density integrated circuits to provide an electrical interconnection system which includes multiple arrays of parallel metal lines disposed in several levels of dielectric layers. The dielectric layers are typically interconnected through a system of metalized vias. Conventionally, within an array of metal lines, the direction longitudinal, or parallel, to the metal lines is designated the "Y" direction and the direction perpendicular, or lateral, to the metal lines is designated the "X" direction.

However, formation of interconnect systems having large arrays of multiple parallel metal lines in a Back-End-Of-Line (BEOL) process flow for a semiconductor fabrication often require the metal lines to have both variable pitch and variable line widths. This kind of variability in both pitch and line width is very difficult to achieve with a conventional SAMP process. This is particularly the case when the minimum pitch (i.e., the minimum distance between repetitive features in a semiconductor device structure) is less than or equal to 38 nm.

Typically, an interconnect system located in the back end, or BEOL portion, of a semiconductor structure will be composed of many cells of repetitive arrays of lines, wherein the overall cell pitch (or height) of each cell (i.e., the overall X direction distance across the cell) is a multiple of a minimum pitch, or track. The track (or minimum pitch) being equal to the minimum functionally allowable metal line width (in the X direction) plus the minimum space (in the X direction) between the lines. For example, a five track cell in an interconnection system where the minimum pitch is 36 nm would have an overall cell pitch that is five times 36 nm, for a total of 180 nm. By way of another example, a six track cell having a minimum pitch of 28 nm would have an overall cell pitch of six times 28 nm, for a total of 168 nm.

However, within those cells, different lines will have different functions and, therefore, will require different line widths. For example, power lines within a typical cell are primarily used to deliver power to devices (such as transistors) in a semiconductor structure and signal lines within that same cell are used to carry signals to and from the semiconductor devices. Since the power lines must carry much more current than the signal lines, the power lines must be significantly wider than the signal lines and therefore require a larger pitch. This type of variability is difficult to achieve in a conventional SAMP process.

Additionally, if the spaces between metal lines in a cell of a semiconductor interconnect system become too narrow due to, for example, lithographic variability, those unacceptably small spaces can lead to time delayed shorting between the lines. Time delayed shorting, or Time Delayed Dielectric Breakdown (TDDB), can occur when the spaces between lines become so small that the dielectric isolating material between the lines becomes stressed over an extended period of time by the electric fields being generated between the lines.

Additionally, in order to provide functionality between devices, such as transistors, capacitors and the like, in the integrated circuit, a plurality of continuity cuts (also referred to as continuity blocks) must be lithographically patterned into the signal lines and power lines of the cells at specific locations to direct current flow between the dielectric layers and the devices. Problematically however, lithographic misalignment, or overlay, is a significant issue at advanced technology node dimensions, such as when the technology class size is no greater than 10 nm or when the repetitive minimum pitch distance is no greater than 38 nm. Overlay is a measure of how well two lithographic layers (or steps) align. Overlay can be in the X or Y direction and is expressed in units of length.

The lithographically disposed continuity cuts must be large enough to make sure that they cut the signal line or power line they are supposed to without clipping any neighboring lines, taking into account worst case overlay variation conditions. However, for a pitch of 38 nm or less, the current state of the art overlay control is not precise enough to reliably prevent continuity cuts from over-extending into neighboring lines. The unwanted over-extension of continuity cuts into neighboring lines can, in the worst case condition, completely interrupt electrical continuity in the wrong line.

Additionally, a line that is inadvertently only partially cut (or notched) may still conduct for a time, but may over heat and prematurely fail over time. This inadvertent cutting and/or notching is particularly problematic for signal lines, which are much smaller in horizontal width than power lines.

Accordingly, there is a need for an apparatus, and method of forming the same, of cells of an interconnect system for a semiconductor structure, wherein the spaces between lines within the cell are not subject to lithographic variability. Additionally, there is a need for the lines within the cells to be variable in width and variable in pitch. There is a need, specifically, for such variable line widths and pitches where the cells have a track (or minimum pitch between lines) of 38 nm or less.

Additionally, there is a need for a method of patterning continuity cuts (or continuity blocks) within signal lines and power lines of the cells that are tolerant of lithographic misalignment. More specifically, there is a need for a method that is capable of patterning continuity cuts into the signal lines and power lines of the cells such that the cuts do not inadvertently cut or notch any of the neighboring lines.

BRIEF DESCRIPTION

The present invention offers advantages and alternatives over the prior art by providing an apparatus, and method of forming the same, of cells of an interconnect system for a semiconductor structure, wherein the spaces between metal lines within the cell are not subject to lithographic variability. Additionally, the lines within the cells are variable in width and variable in pitch. Additionally, the inventions includes a method of patterning continuity cuts within the metal lines that are fully self-aligned with the lines.

A method in accordance with one or more aspects of the present invention includes patterning a $1^{st}$ mandrel cell into a $1^{st}$ mandrel layer disposed above a dielectric layer of a semiconductor structure. The $1^{st}$ mandrel cell has at least one 1$^{st}$ mandrel, at least one 1$^{st}$ mandrel space and a mandrel cell pitch. A 2$^{nd}$ mandrel cell is patterned into a 2$^{nd}$ mandrel layer disposed above the 1$^{st}$ mandrel layer. The 2$^{nd}$ mandrel cell has at least one 2$^{nd}$ mandrel, at least one 2$^{nd}$ mandrel space, and substantially the same mandrel cell pitch. The 1$^{st}$ and 2$^{nd}$ mandrel cells are utilized to form a metal line cell into the dielectric layer, the metal line cell has metal lines, dielectric filled spaces between the metal lines and a line cell pitch. The line cell pitch is substantially equal to the mandrel cell pitch when the metal lines of the metal line cell are an even number. The line cell pitch is substantially equal to half the mandrel cell pitch when the metal lines of the metal line cell are an odd number.

Another method in accordance with one or more aspects of the present invention includes patterning a 1$^{st}$ mandrel cell into a 1$^{st}$ mandrel layer disposed above a dielectric layer of a semiconductor structure. The 1$^{st}$ mandrel cell has at least one 1$^{st}$ mandrel, at least one 1$^{st}$ mandrel space and a 1$^{st}$ mandrel cell pitch. A 2$^{nd}$ mandrel cell is patterned into a 2$^{nd}$ mandrel layer disposed above the 1$^{st}$ mandrel layer. The 2$^{nd}$ mandrel cell has at least one 2$^{nd}$ mandrel, at least one 2$^{nd}$ mandrel space and a 2$^{nd}$ mandrel cell pitch. The 1$^{st}$ and 2$^{nd}$ mandrel cells are utilized to form a metal line cell into the dielectric layer. The metal line cell has metal lines, dielectric filled spaces between the metal lines and a line cell pitch. The number of metal lines within the line cell are equal to the sum of the number of 1$^{st}$ mandrels within the 1$^{st}$ mandrel cell plus the number of 2$^{nd}$ mandrels within the 2$^{nd}$ mandrel cell when the metal lines of the metal line cell are an odd number. The number of metal lines within the line cell are equal to twice the sum of the number of 1$^{st}$ mandrels within the 1$^{st}$ mandrel cell plus the number of 2$^{nd}$ mandrels within the 2$^{nd}$ mandrel cell when the metal lines of the metal line cell are an even number.

Another method in accordance with one or more aspects of the present invention includes patterning a 1$^{st}$ mandrel cell into a 1$^{st}$ mandrel layer disposed above a dielectric layer of a semiconductor structure. The 1$^{st}$ mandrel cell has at least one 1$^{st}$ mandrel, at least one 1$^{st}$ mandrel space and a mandrel cell pitch. A 2$^{nd}$ mandrel cell is patterned into a 2$^{nd}$ mandrel layer disposed above the 1$^{st}$ mandrel layer. The 2$^{nd}$ mandrel cell has at least one 2$^{nd}$ mandrel, at least one 2$^{nd}$ mandrel space, and substantially the same mandrel cell pitch. The 2$^{nd}$ mandrel cell is positioned relative to the 1$^{st}$ mandrel cell such that the 2$^{nd}$ mandrels entirely overlay the 1$^{st}$ mandrel spaces. The 1$^{st}$ and 2$^{nd}$ mandrel cells are utilized to form a metal line cell into the dielectric layer, the metal line cell having metal lines, metal line spaces and a line cell pitch.

DRAWINGS

The invention will be more fully understood from the following detailed description taken in conjunction with the accompanying drawings, in which:

FIG. 1 is a cross-sectional side view of an exemplary embodiment of a semiconductor structure of an integrated circuit having a 5 track metal interconnect cell of signal lines and a power line in accordance with the present invention;

FIG. 2 is a cross sectional view of a plurality of the cells of FIG. 1 superimposed over an imaginary 5 track minimum pitch cell, a plurality of yet to be formed first mandrels and their associated 1$^{st}$ mandrel spacers superimposed over the cells of FIG. 1, and a plurality of yet to be formed 2$^{nd}$ mandrels and their associated 2$^{nd}$ mandrel spacers superimposed over the 1$^{st}$ mandrels in accordance with the present invention;

FIG. 3 is a cross-sectional side view of an exemplary embodiment of a semiconductor structure of an integrated circuit having 6 track metal interconnect cells of signal lines and a power lines in accordance with the present invention;

FIG. 4 is a cross sectional view of a plurality of the cells of FIG. 3 superimposed over an imaginary 6 track minimum pitch cell, a plurality of yet to be formed first mandrels and their associated 1$^{st}$ mandrel spacers superimposed over the cells of FIG. 3, and a plurality of yet to be formed 2$^{nd}$ mandrels and their associated 2$^{nd}$ mandrel spacers superimposed over the 1$^{st}$ mandrels in accordance with the present invention;

FIG. 5 is a top view of the plurality of cells of FIG. 4 having the yet to be formed 1$^{st}$ mandrels and 2$^{nd}$ mandrels superimposed thereon, and having yet to be formed 1$^{st}$, 2$^{nd}$ and 3$^{rd}$ openings also superimposed thereon in accordance with the present invention;

FIG. 6 is a perspective view of an exemplary embodiment of the semiconductor structure of FIG. 3 at an intermediate stage of manufacturing, wherein the structure is composed of a stack of layers including (from top to bottom) a 1$^{st}$ SiON cap layer, a 1$^{st}$ SOH layer, a 1$^{st}$ mandrel layer, 6$^{th}$, 5$^{th}$, 4$^{th}$, 3$^{rd}$, 2$^{nd}$ and 1$^{st}$ hardmask layers, a dielectric layer, an etch stop layer and buried layers in accordance with the present invention;

FIG. 7 is a perspective view of the structure of FIG. 6 with a 1$^{st}$ lithographic (litho) stack disposed thereon and 1$^{st}$ mandrel cells having 1$^{st}$ mandrels patterned into a resist layer of the 1$^{st}$ litho stack in accordance with the present invention;

FIG. 9A is a perspective view of the structure of FIG. 8 having a 2$^{nd}$ lithographic stack disposed thereon and 1$^{st}$ openings patterned into a resist layer of the 2$^{nd}$ lithographic stack in accordance with the present invention;

Figure 1:
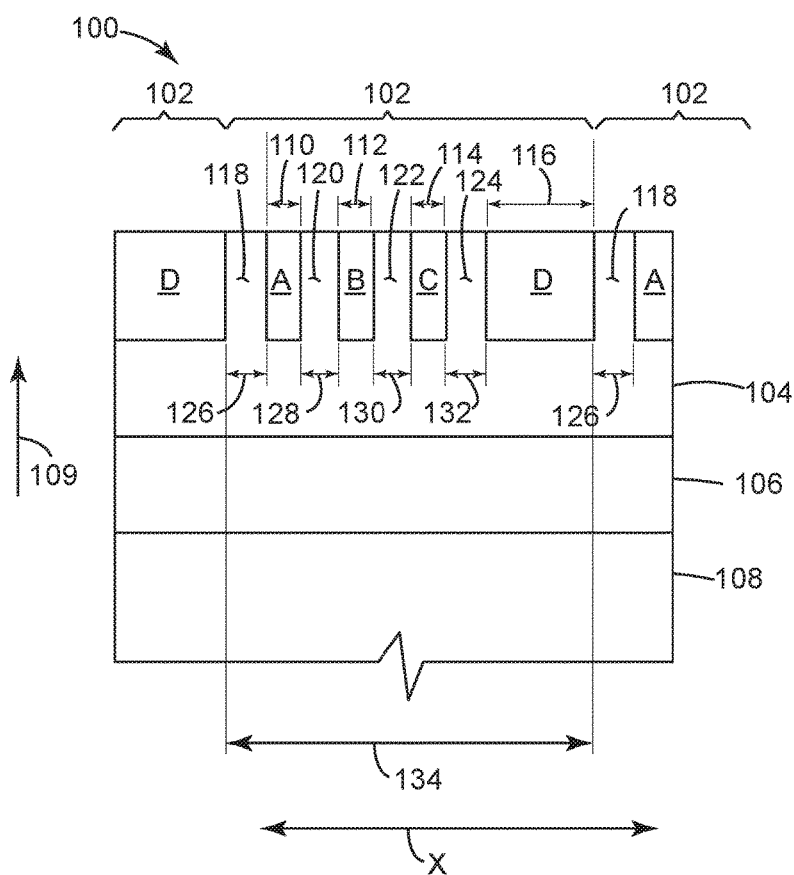
Figure 3:
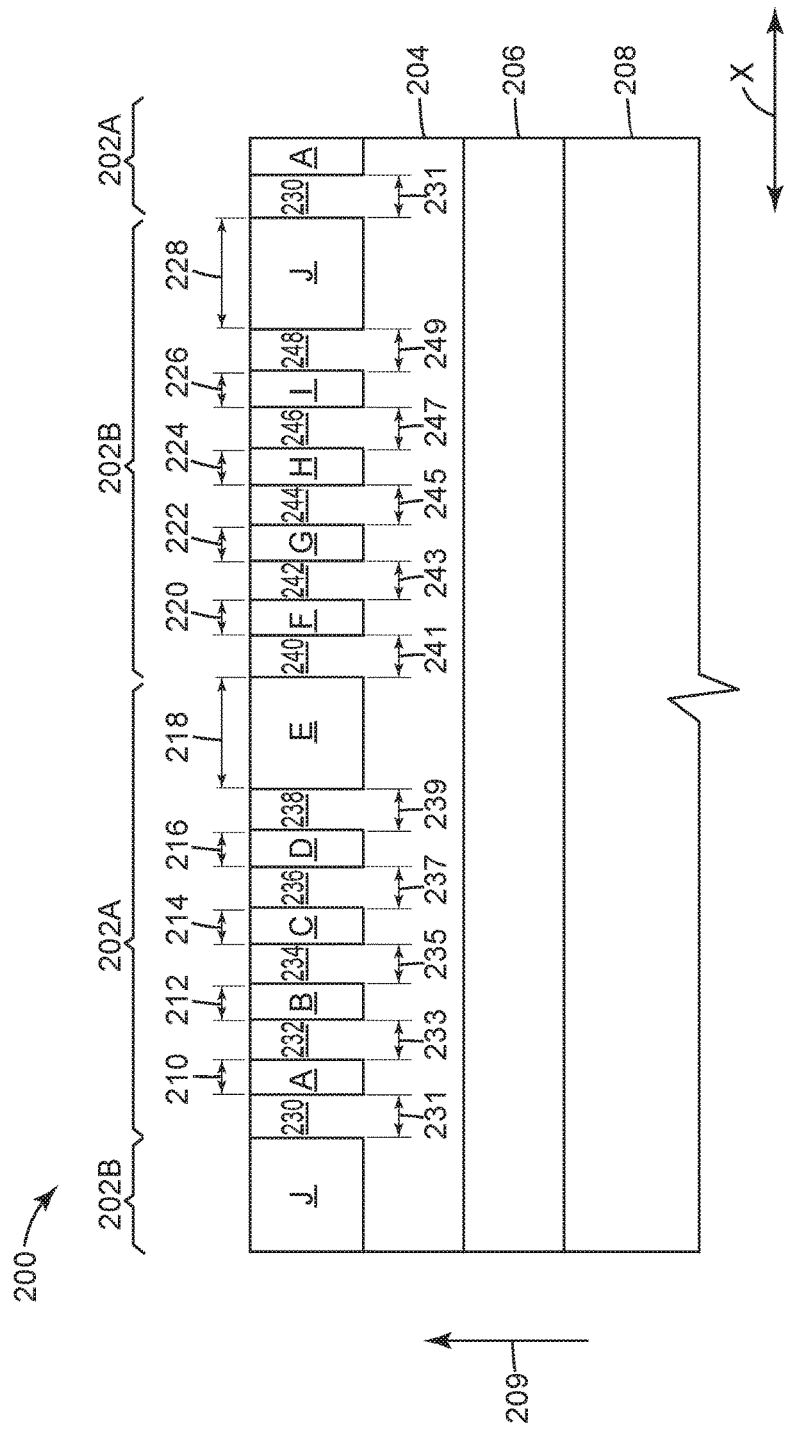
Figure 9B:
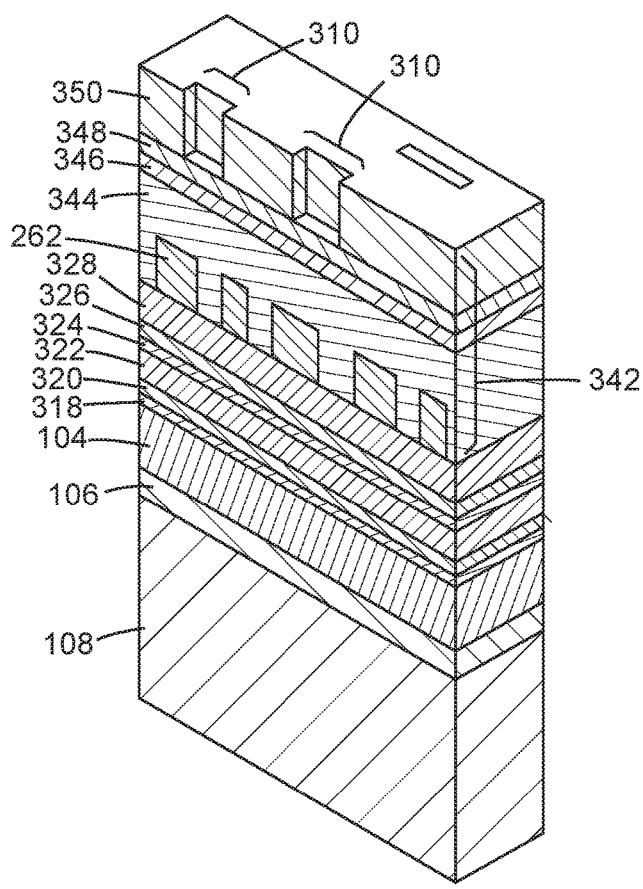
FIG. 9B is a cross sectional perspective view of FIG. 9A taken along the line 9B-9B in accordance with the present invention.
Figure 10:
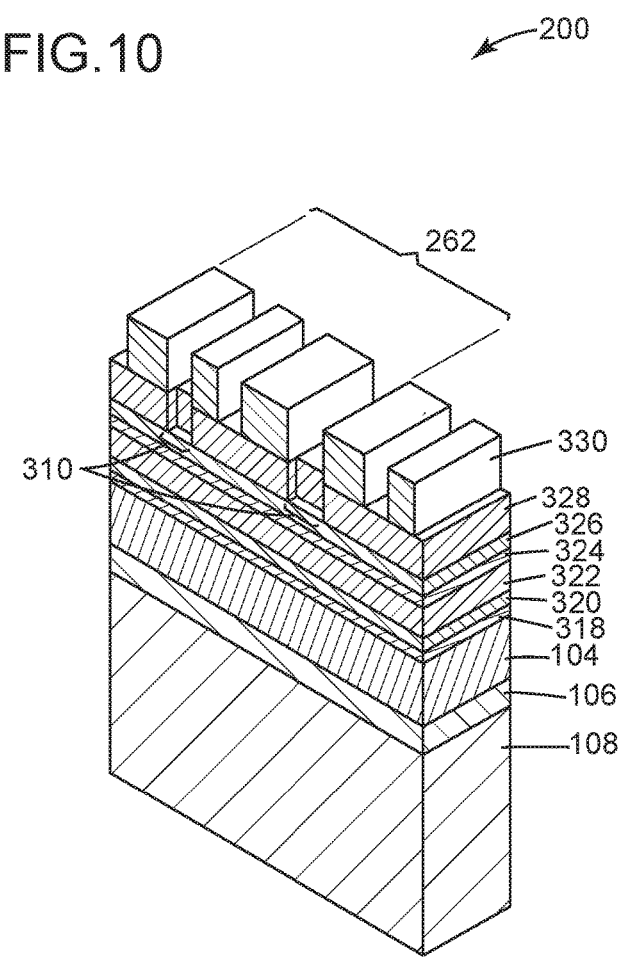
Figure 11A:
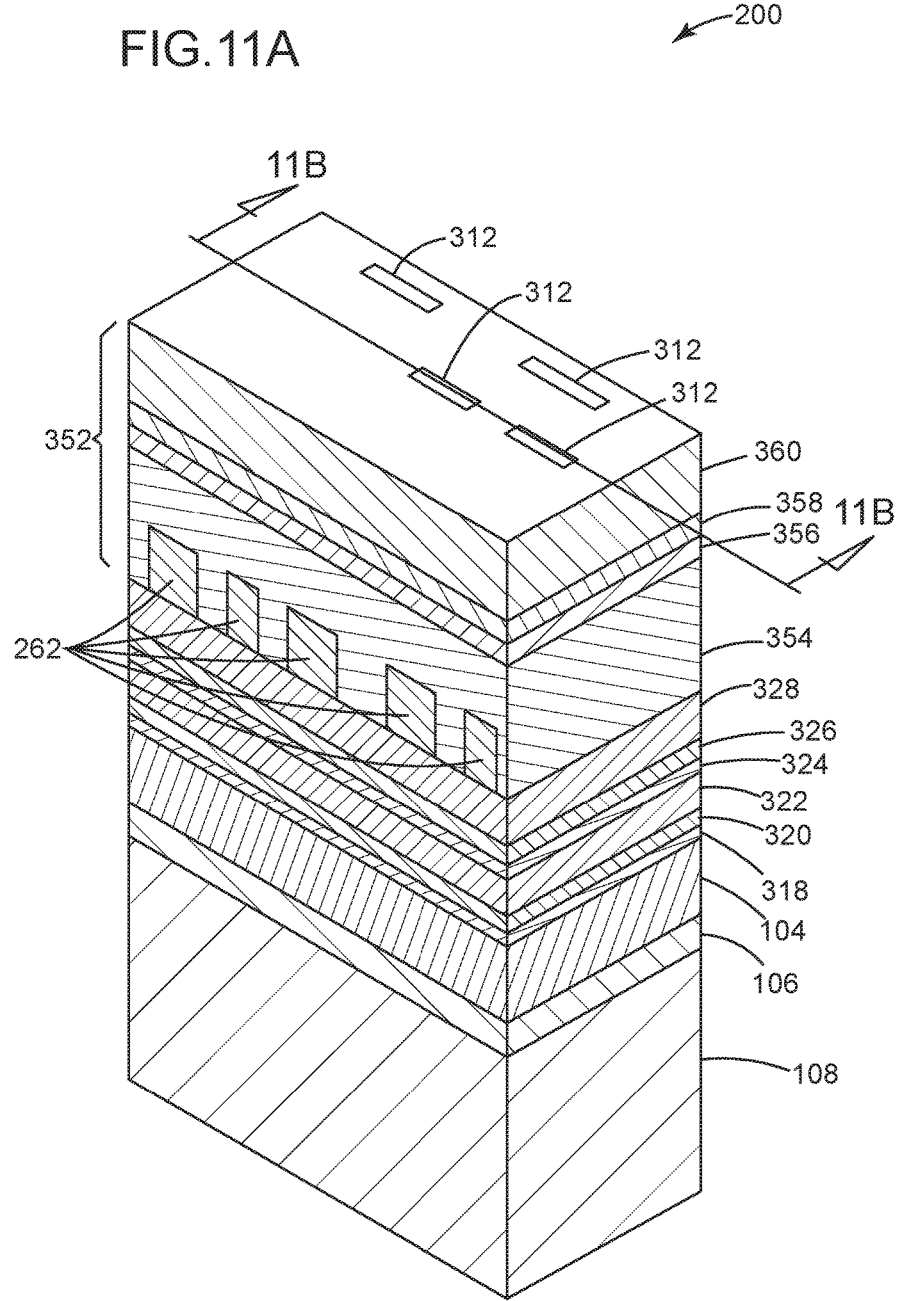
Figure 11B:
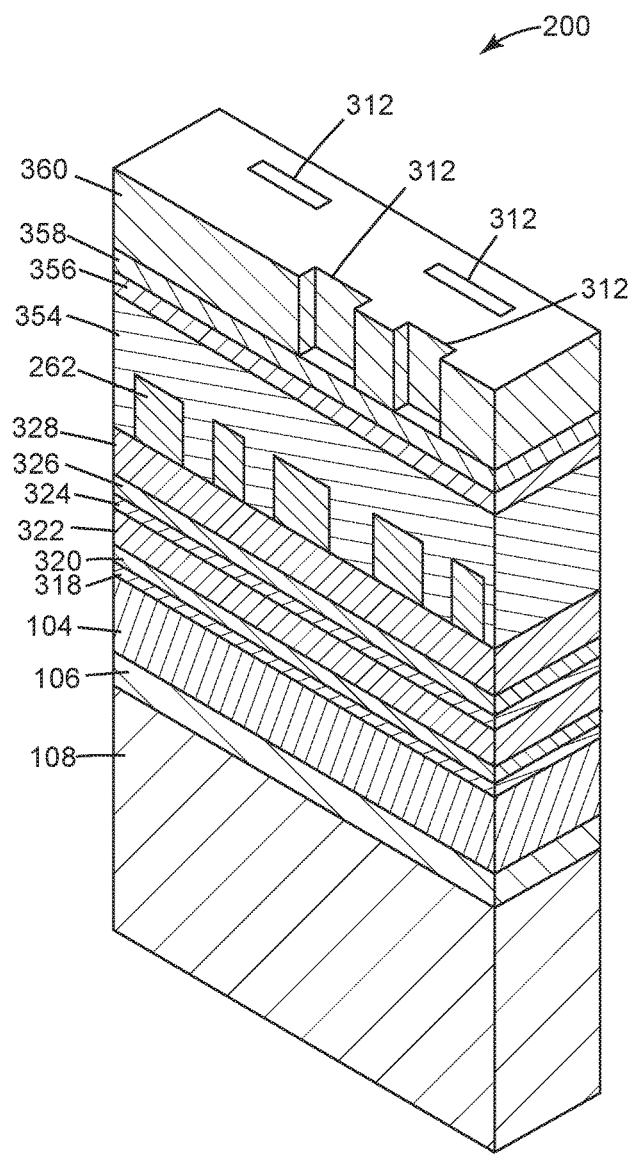
Figure 12:
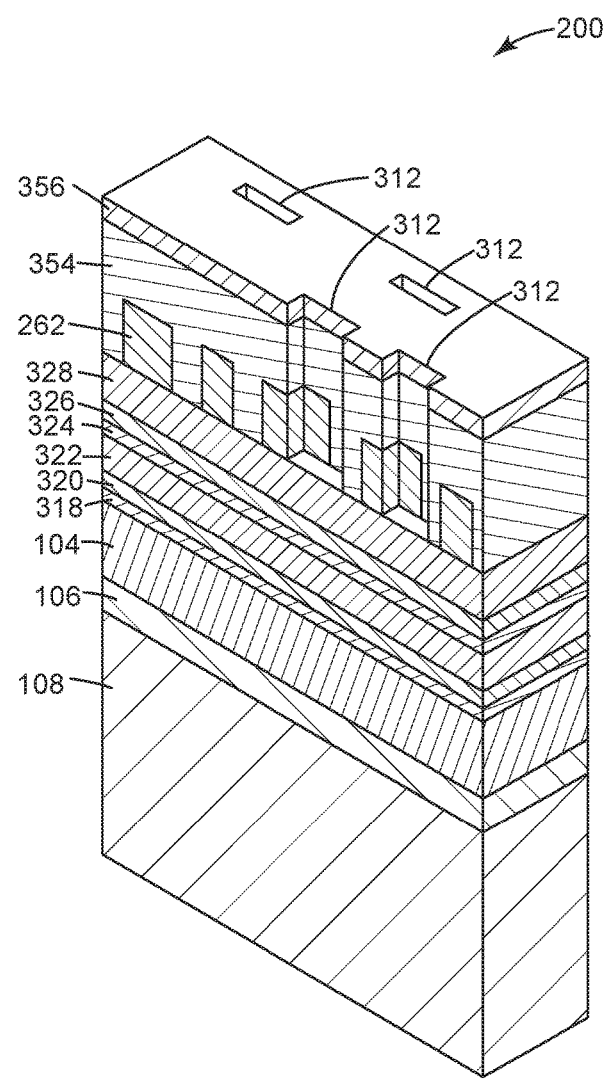
Figure 13:
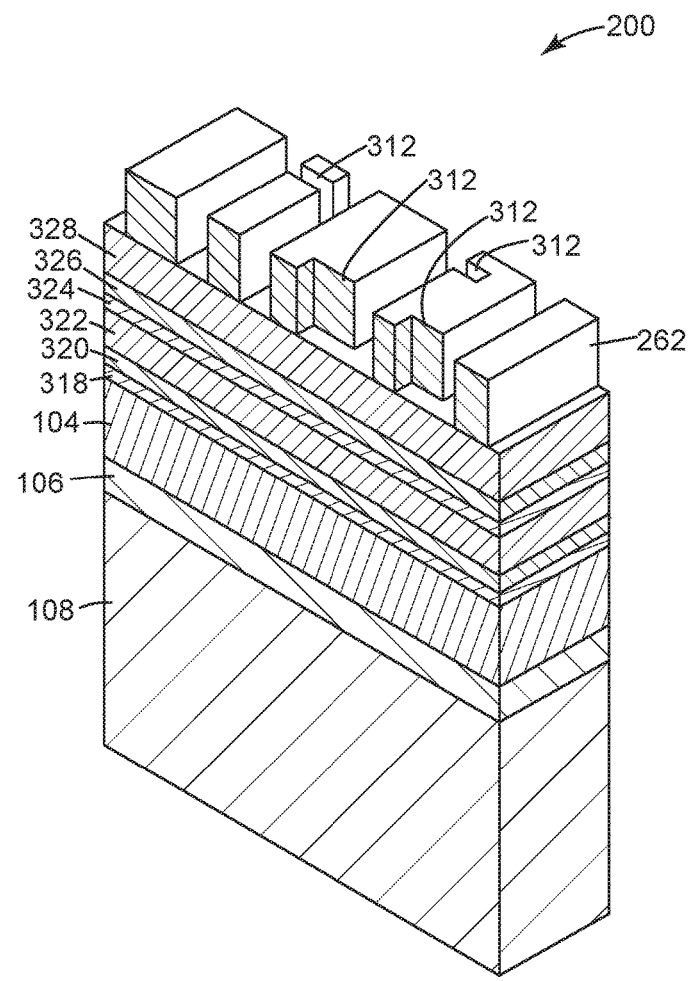
Figure 14A:
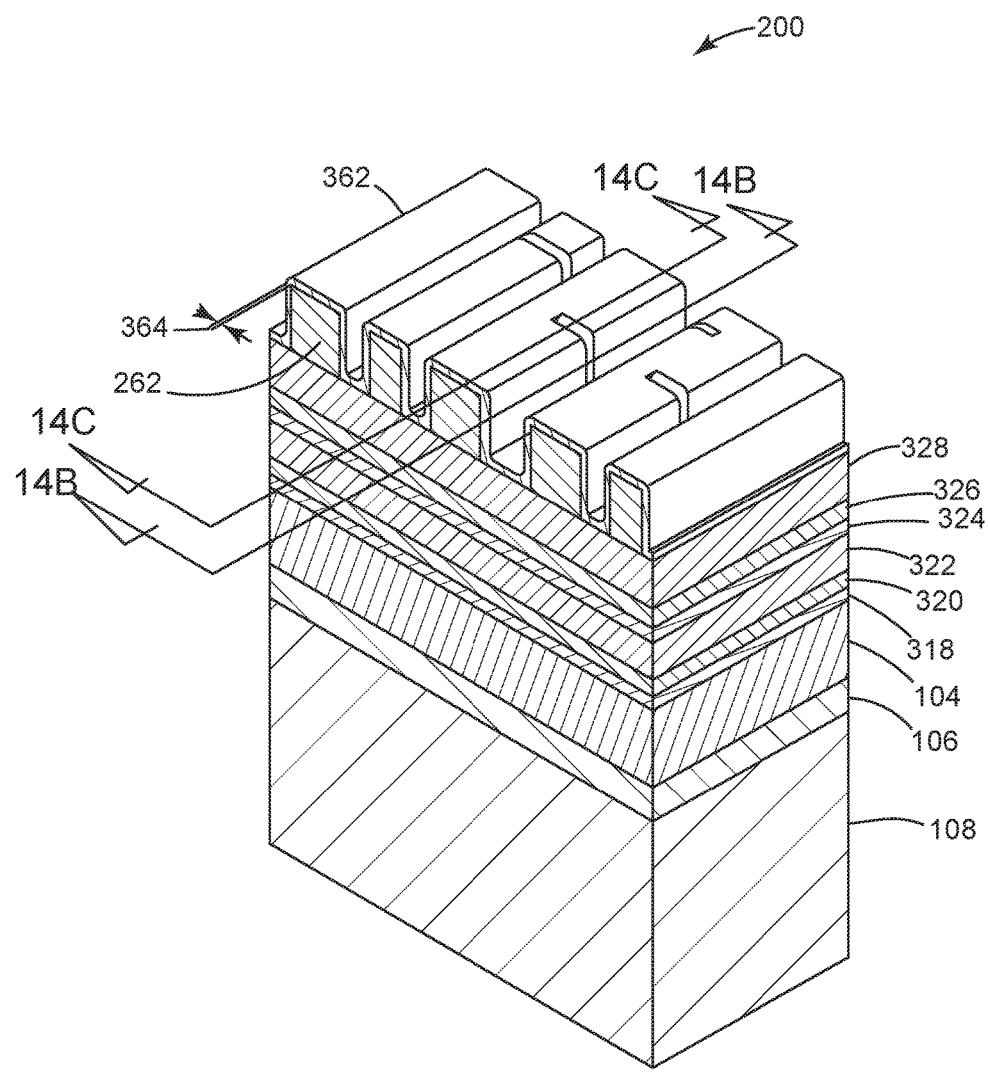
Figure 14B:
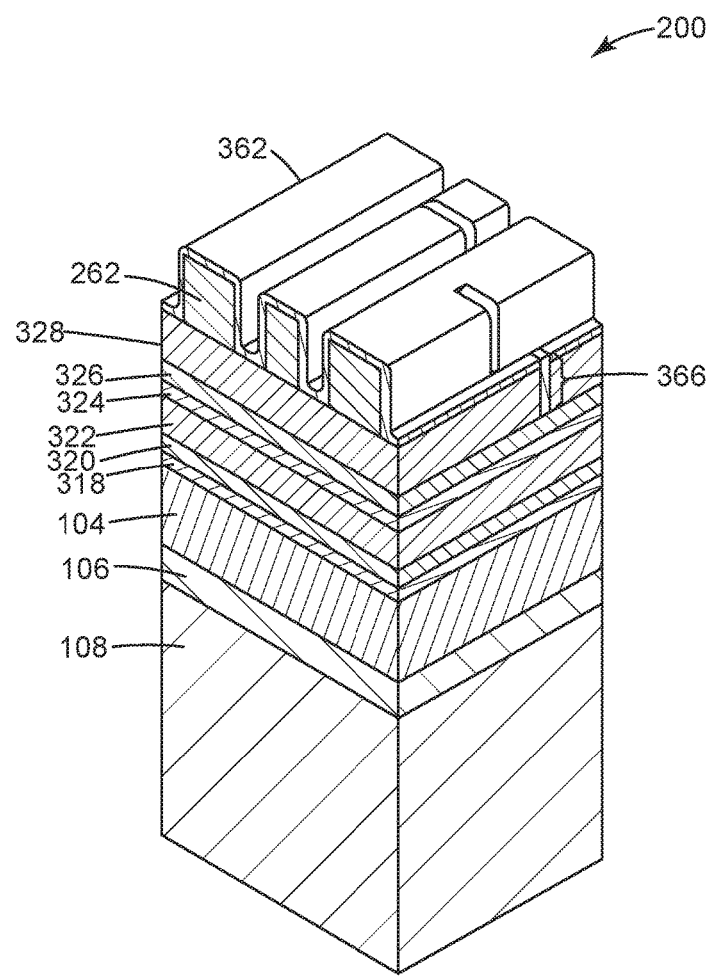
Figure 14C:
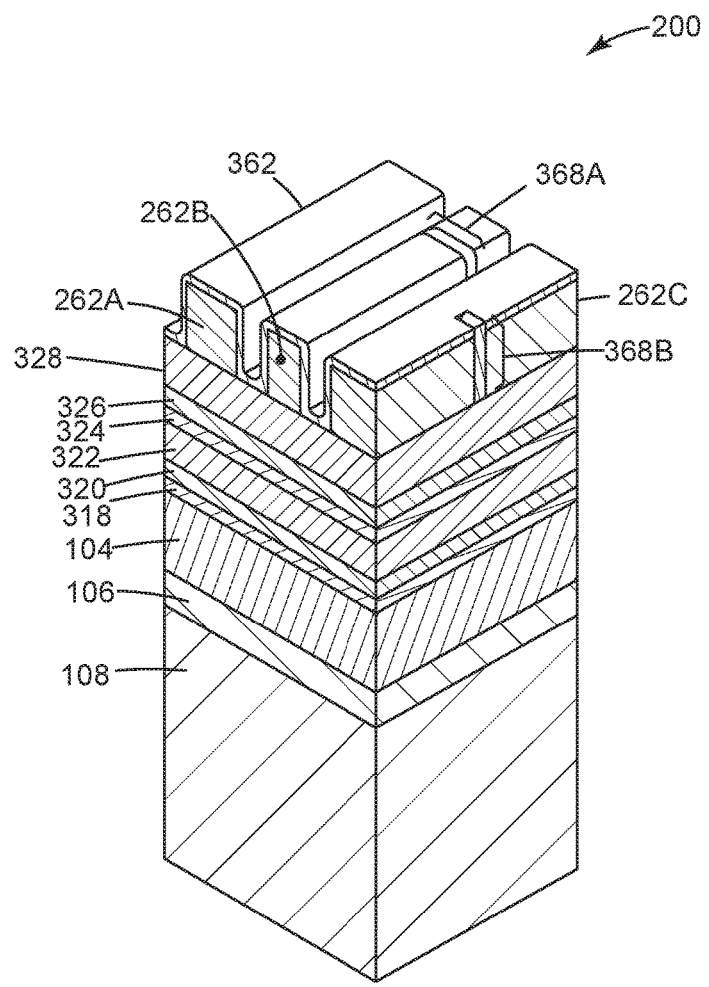
Figure 15:
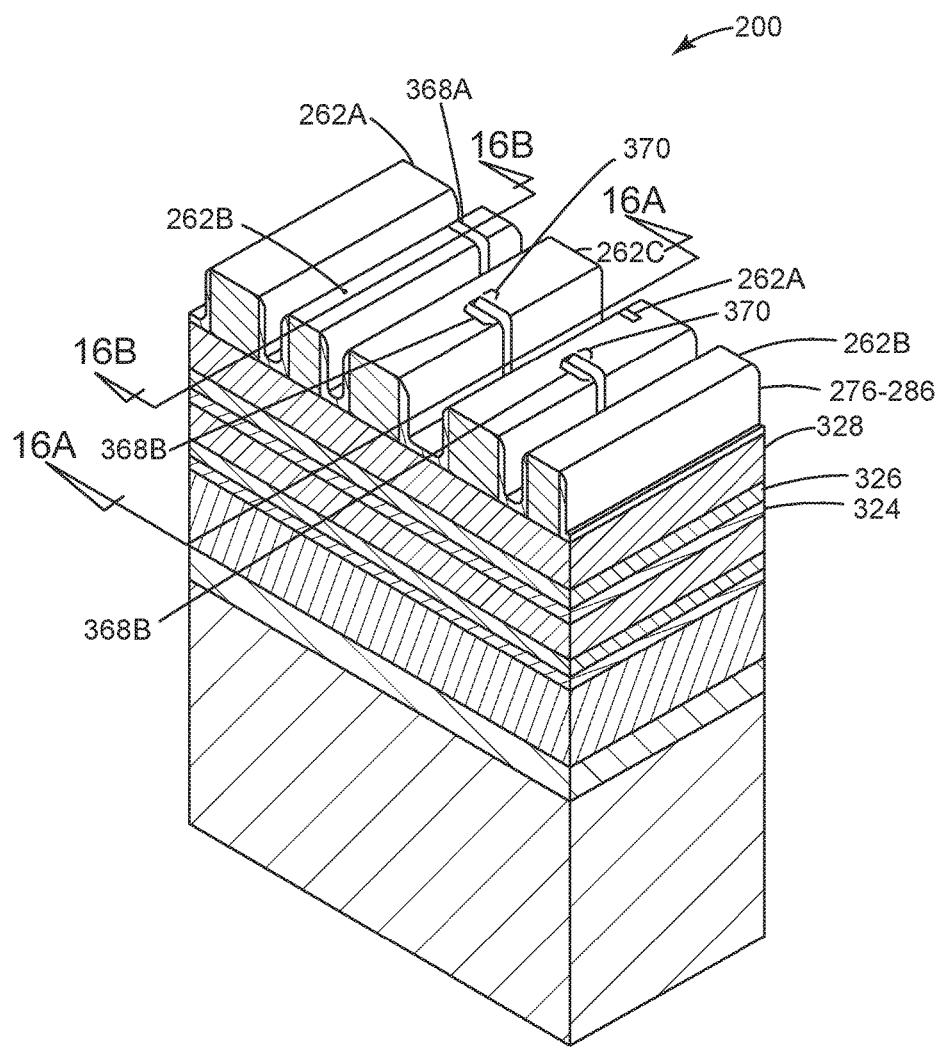
Figure 16A:
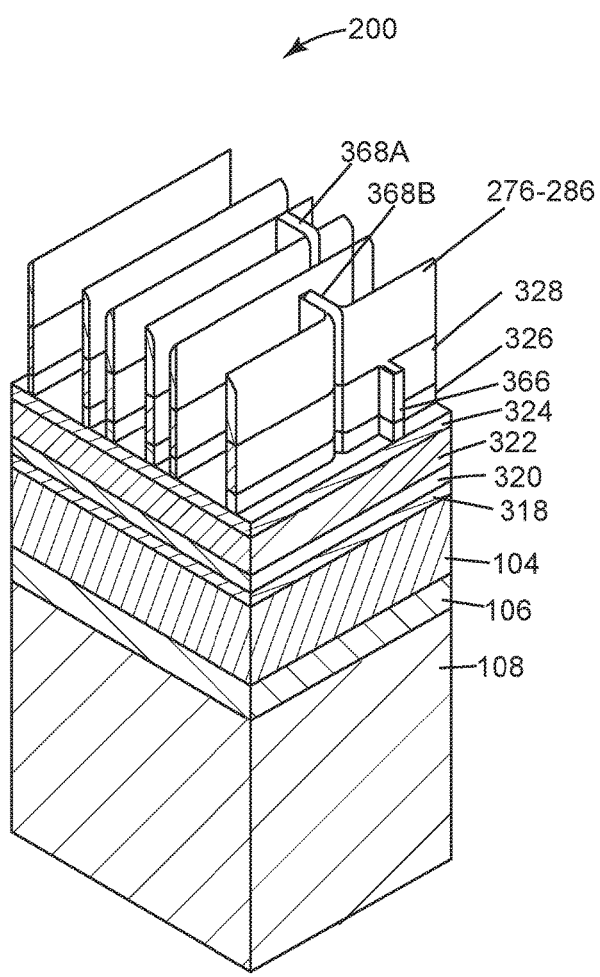
Figure 16B:
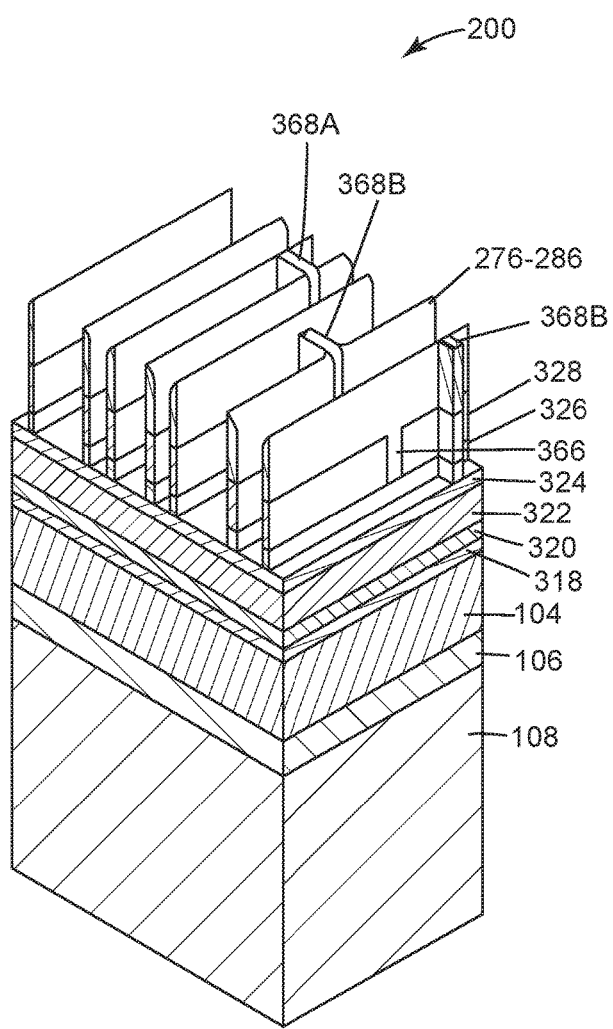
Figure 17:
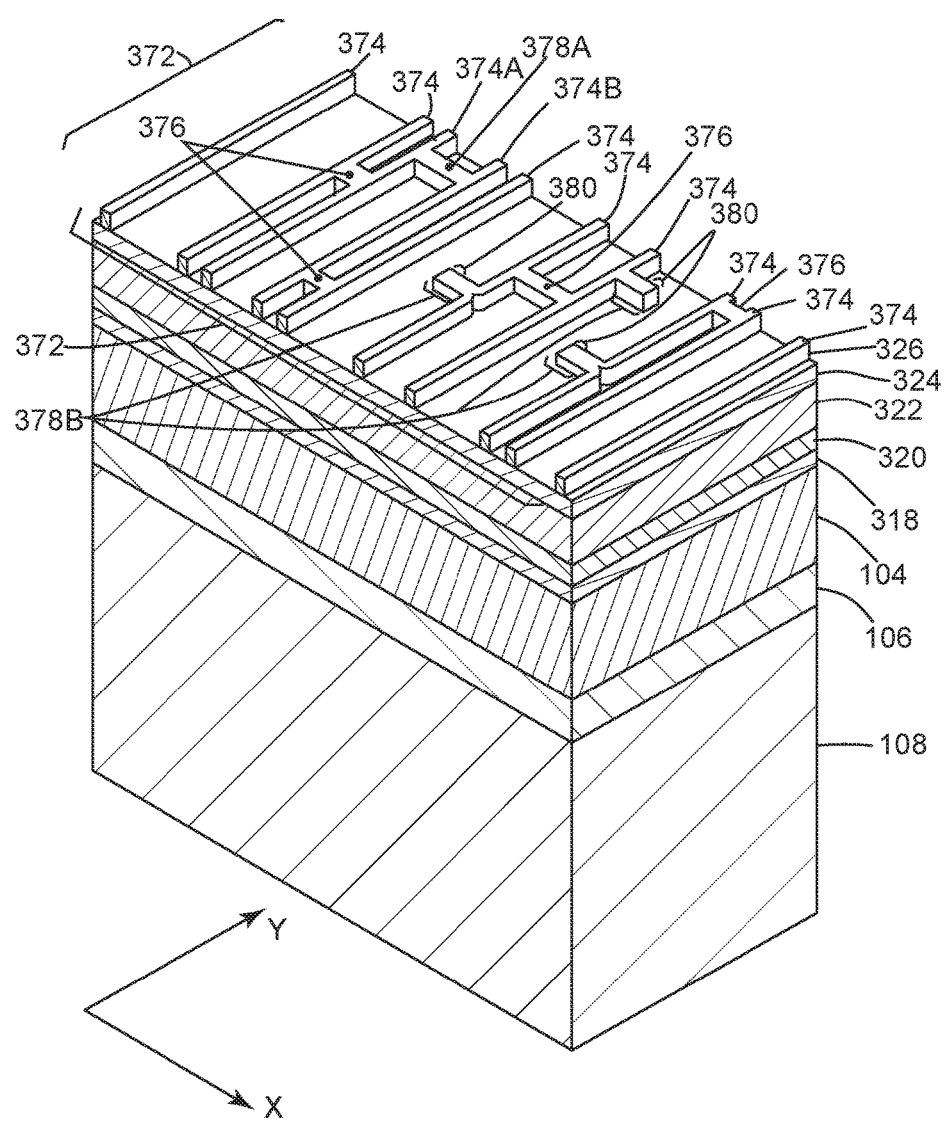
Figure 18:
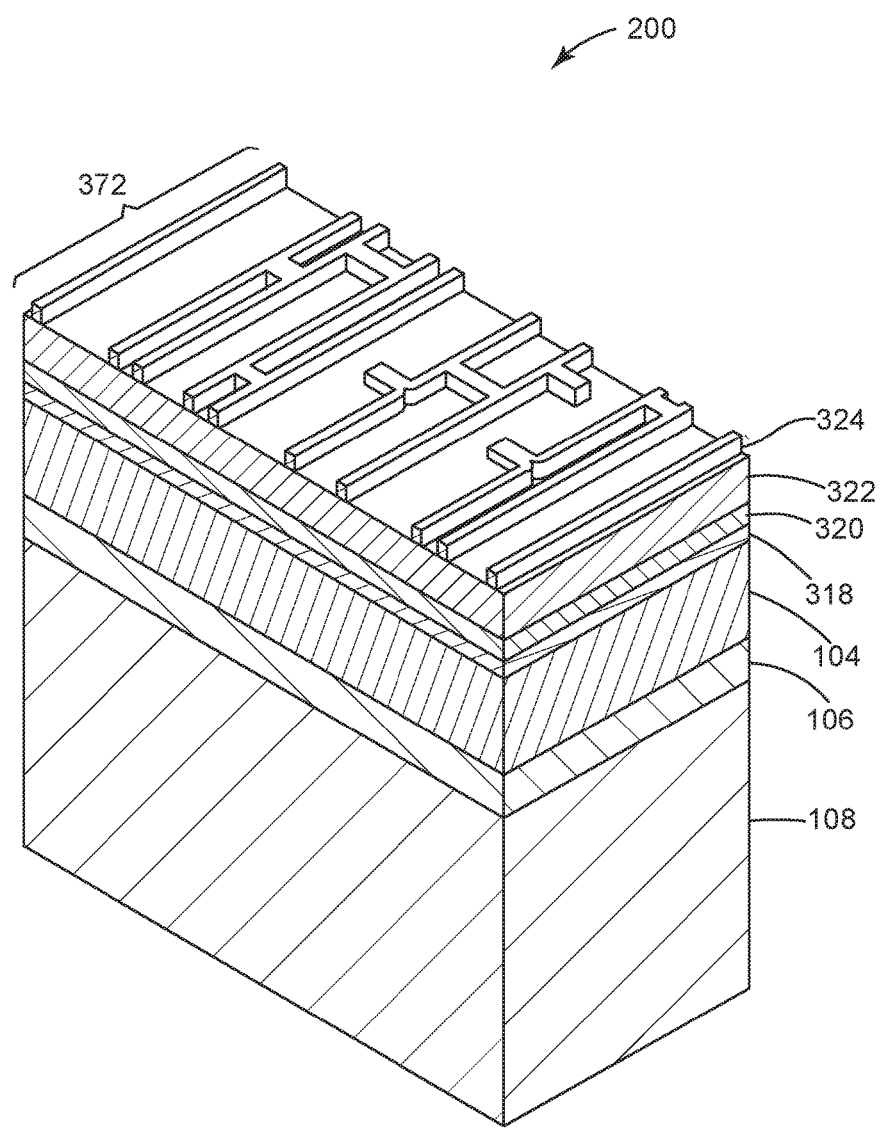
Figure 19:
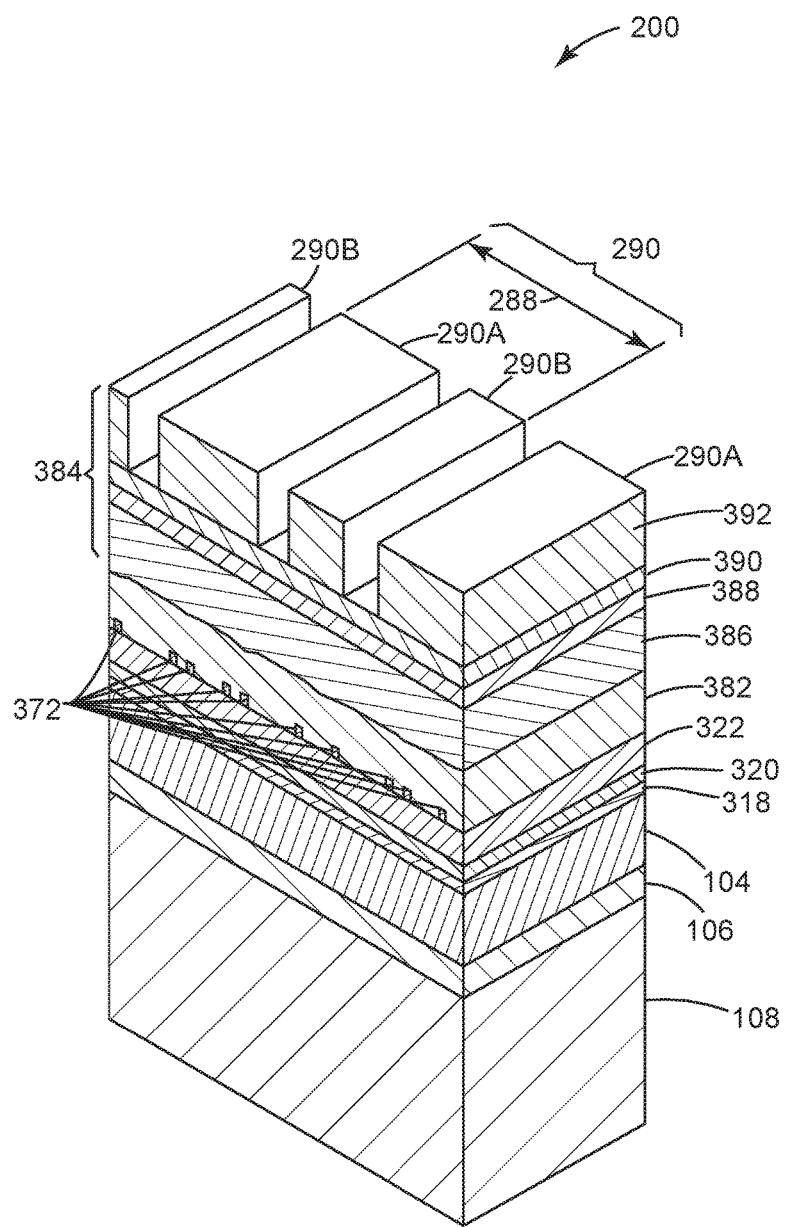
Figure 20A:
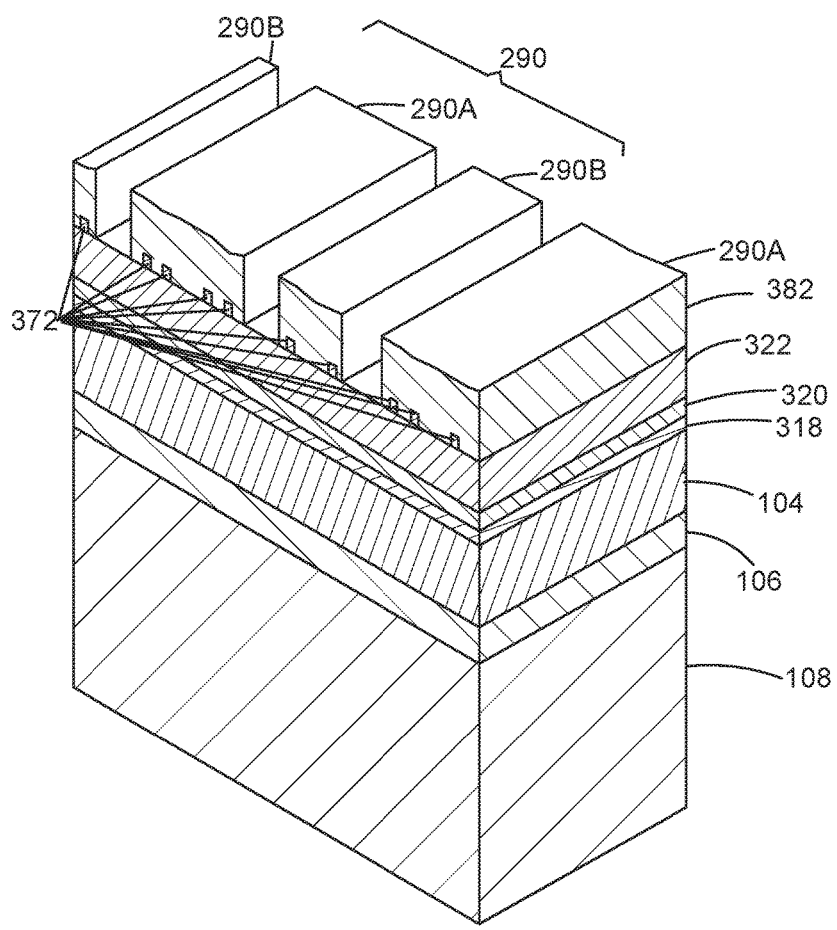
Figure 21:
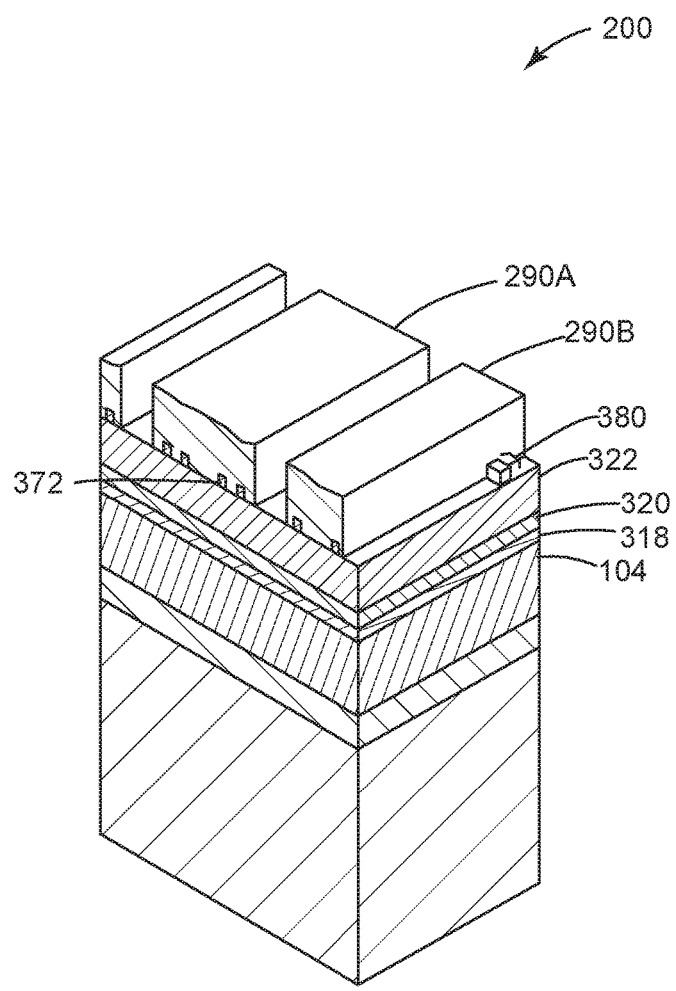
Figure 22:
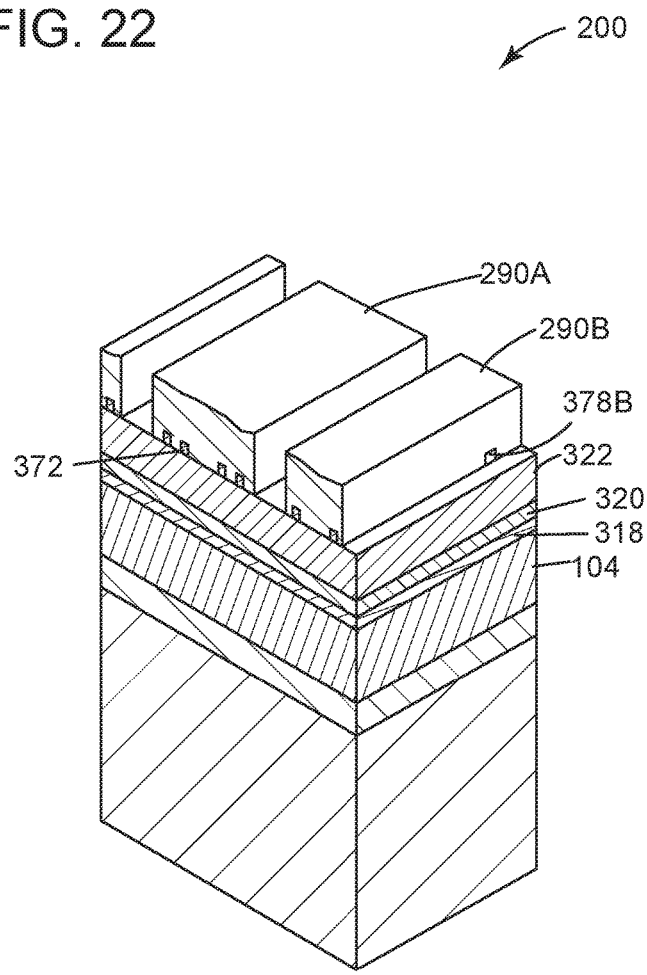
Figure 23A:
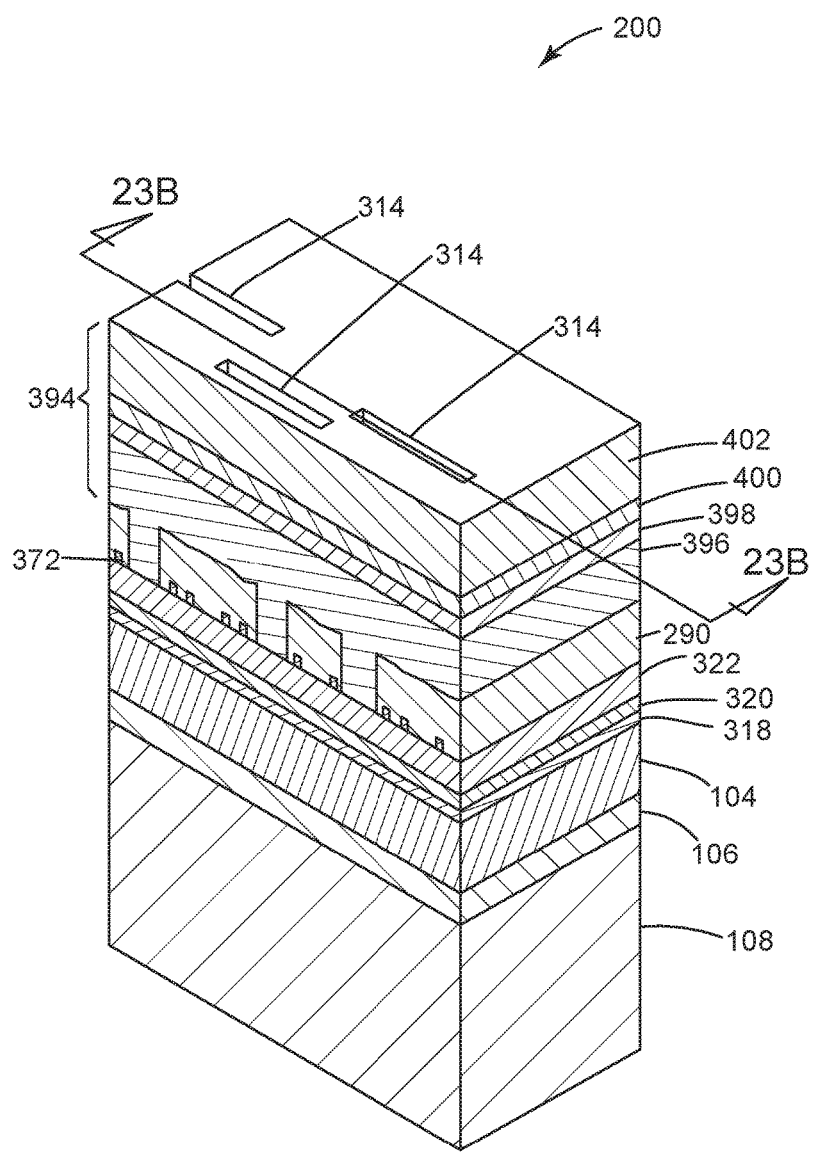
Figure 23B:
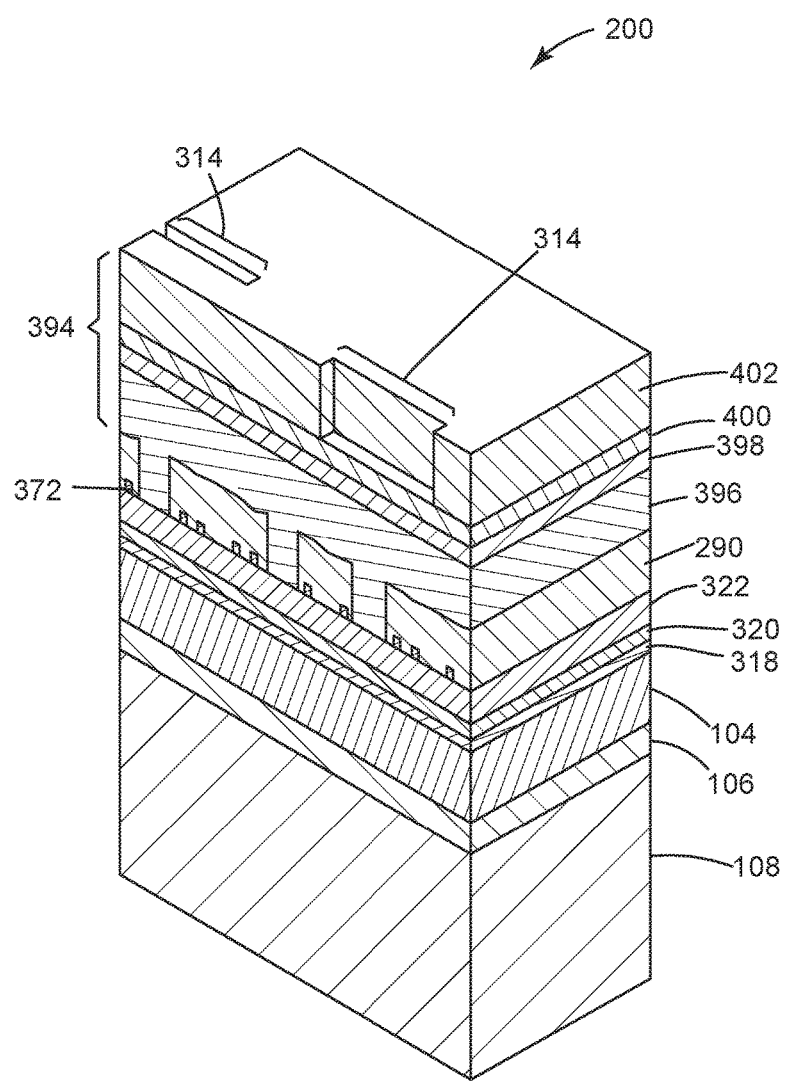
Figure 24:
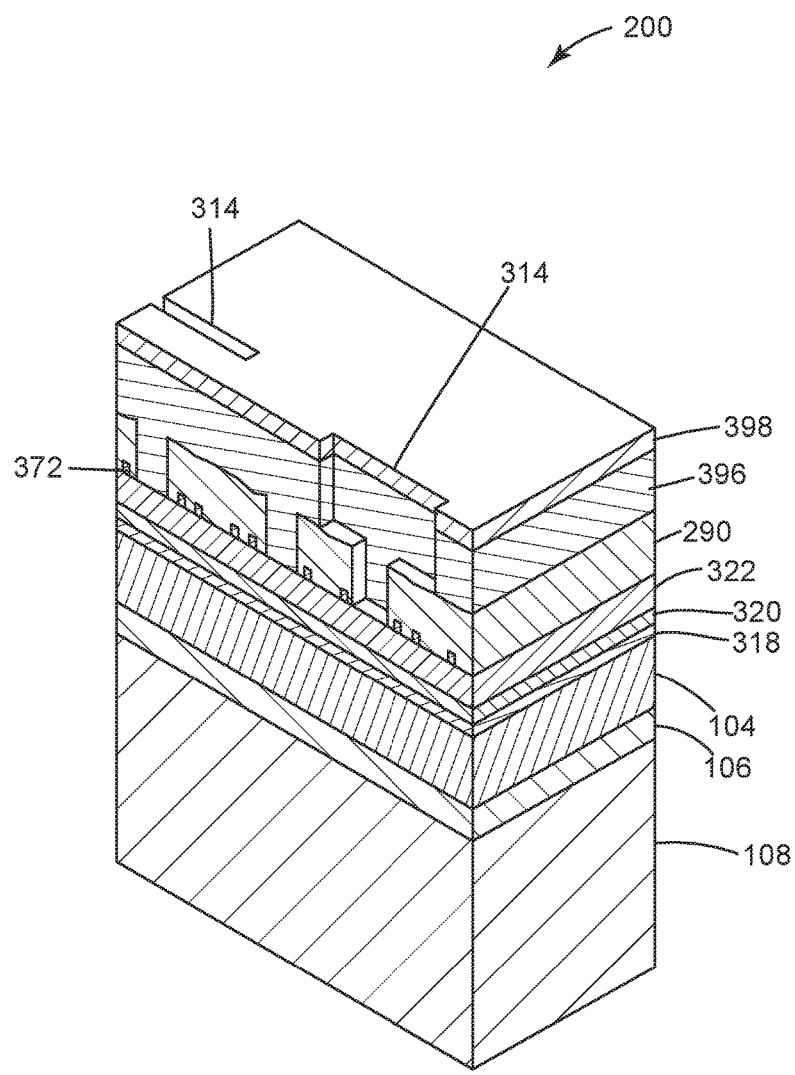
Figure 25:
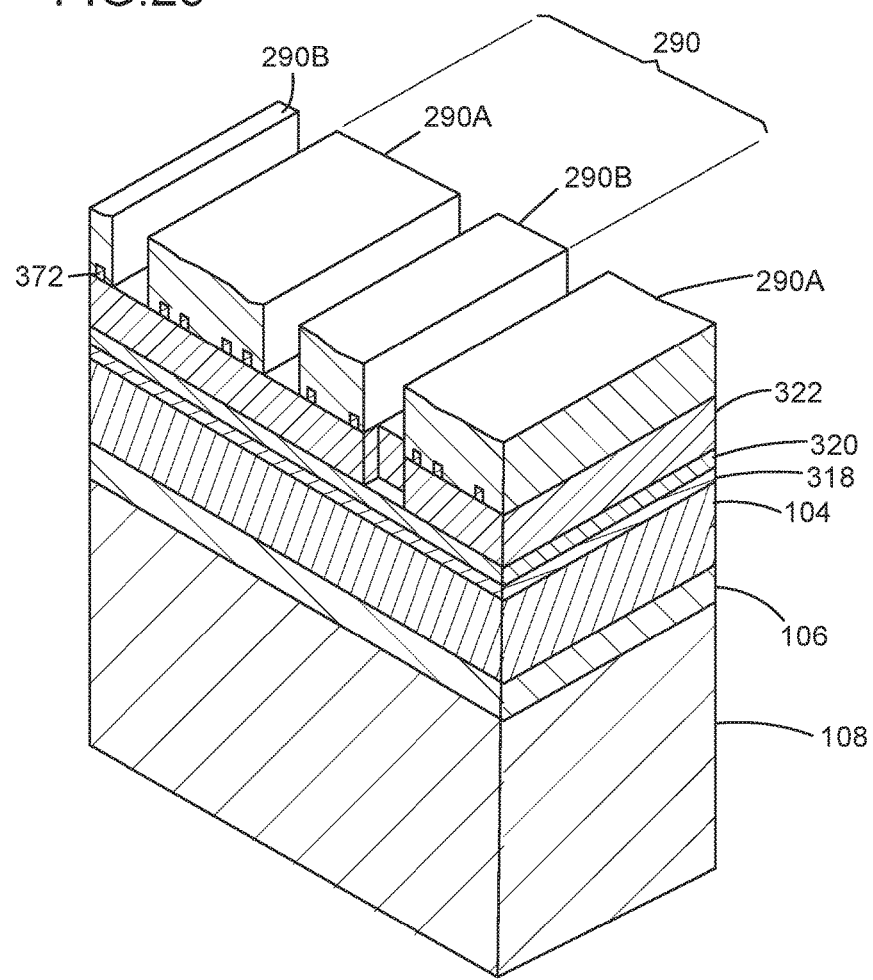
Figure 26:
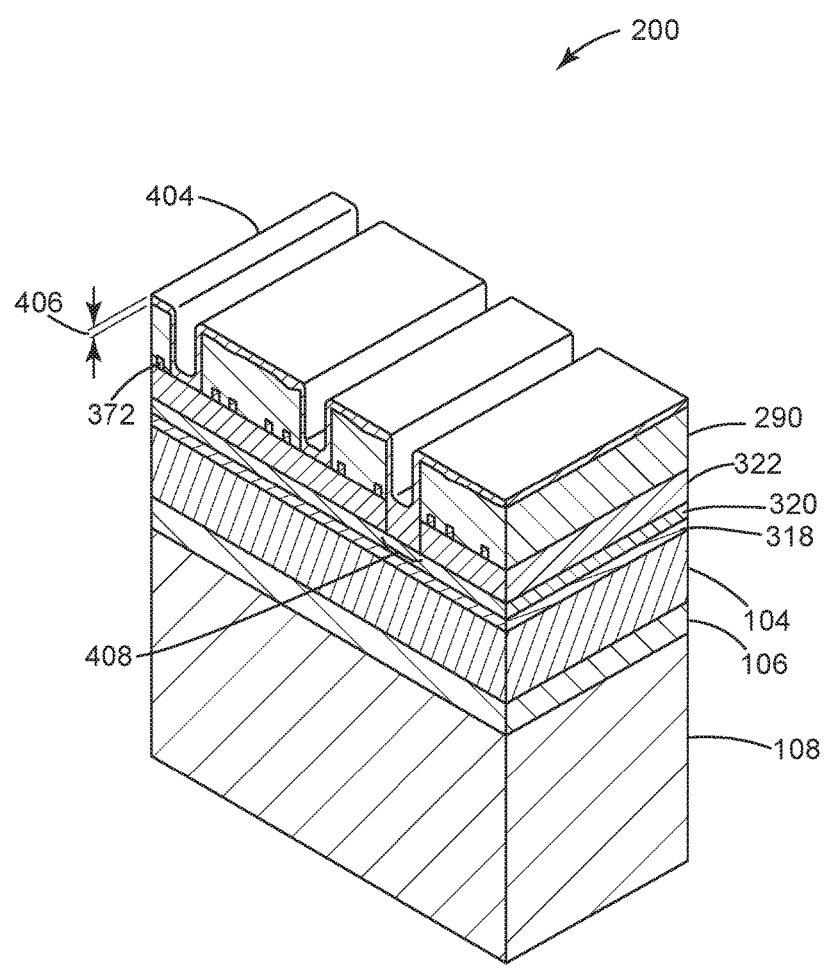
Figure 27:
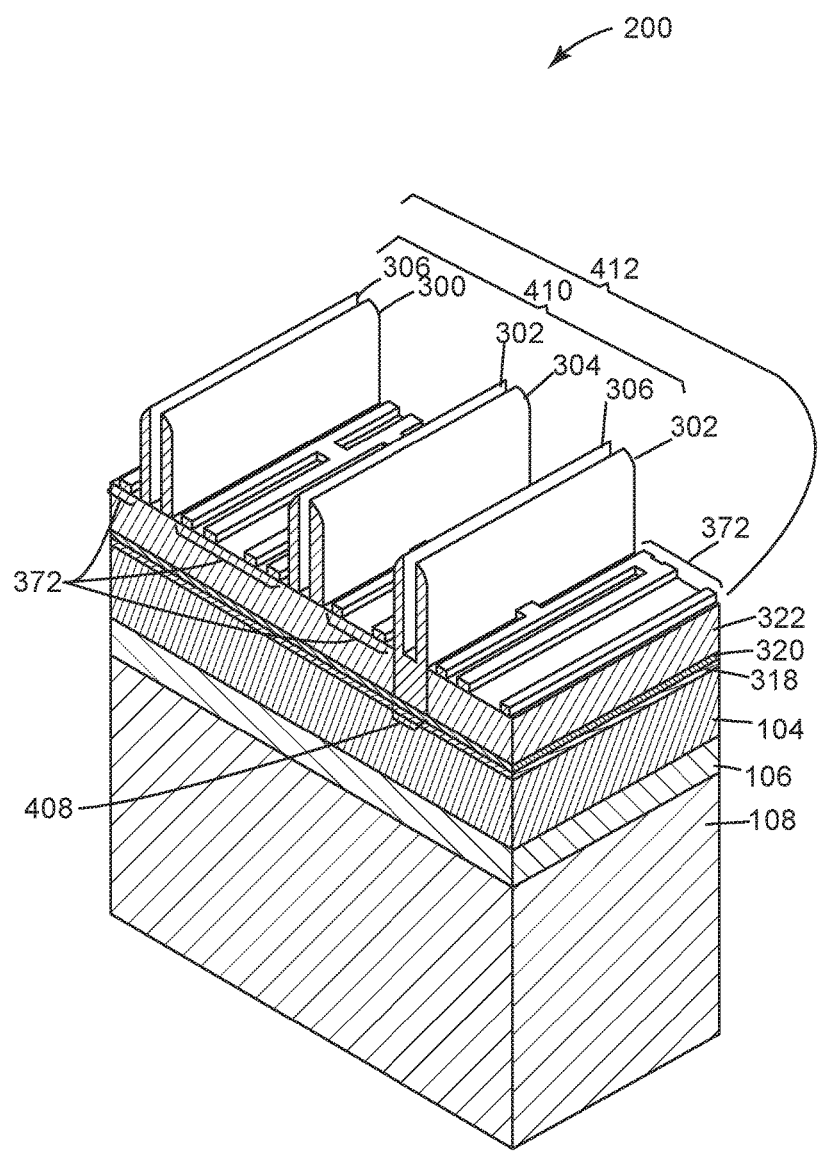
Figure 28:
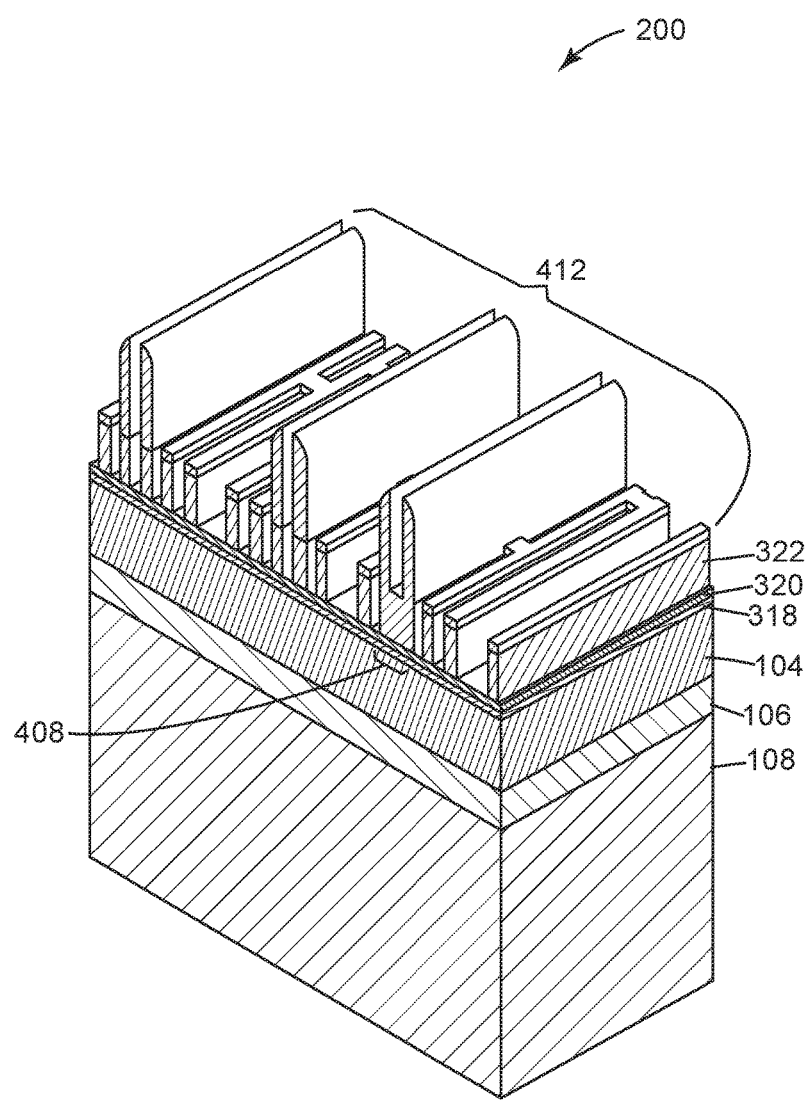
Figure 29:
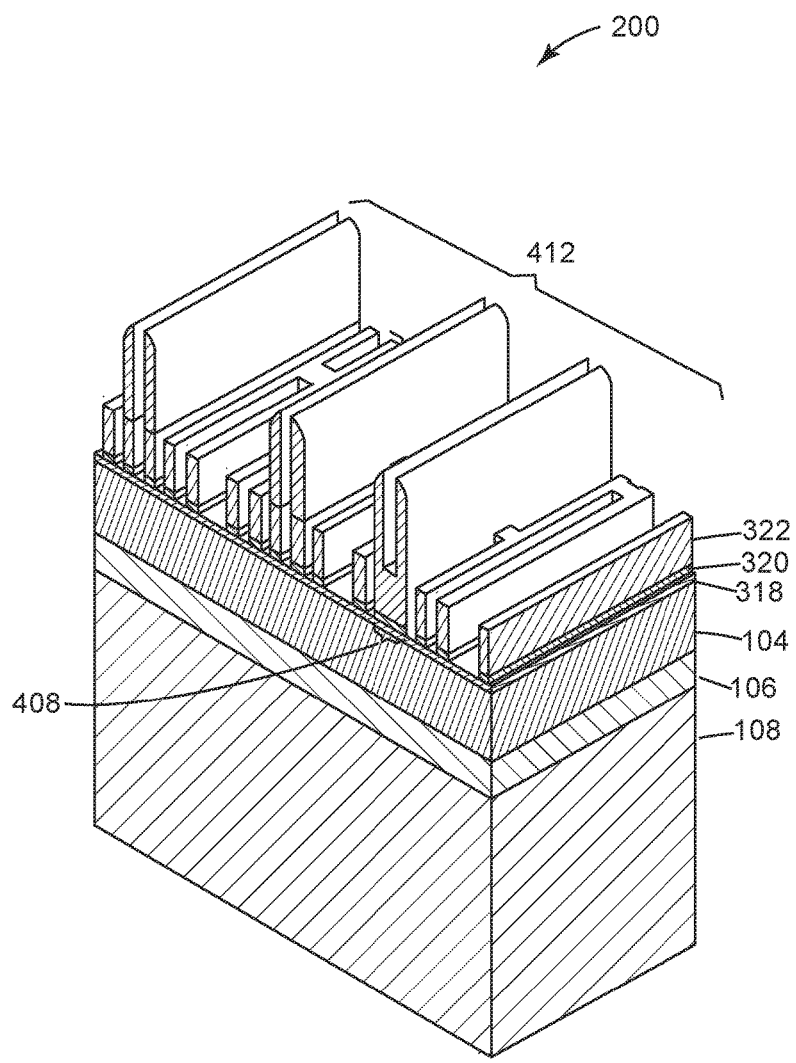
Figure 30:
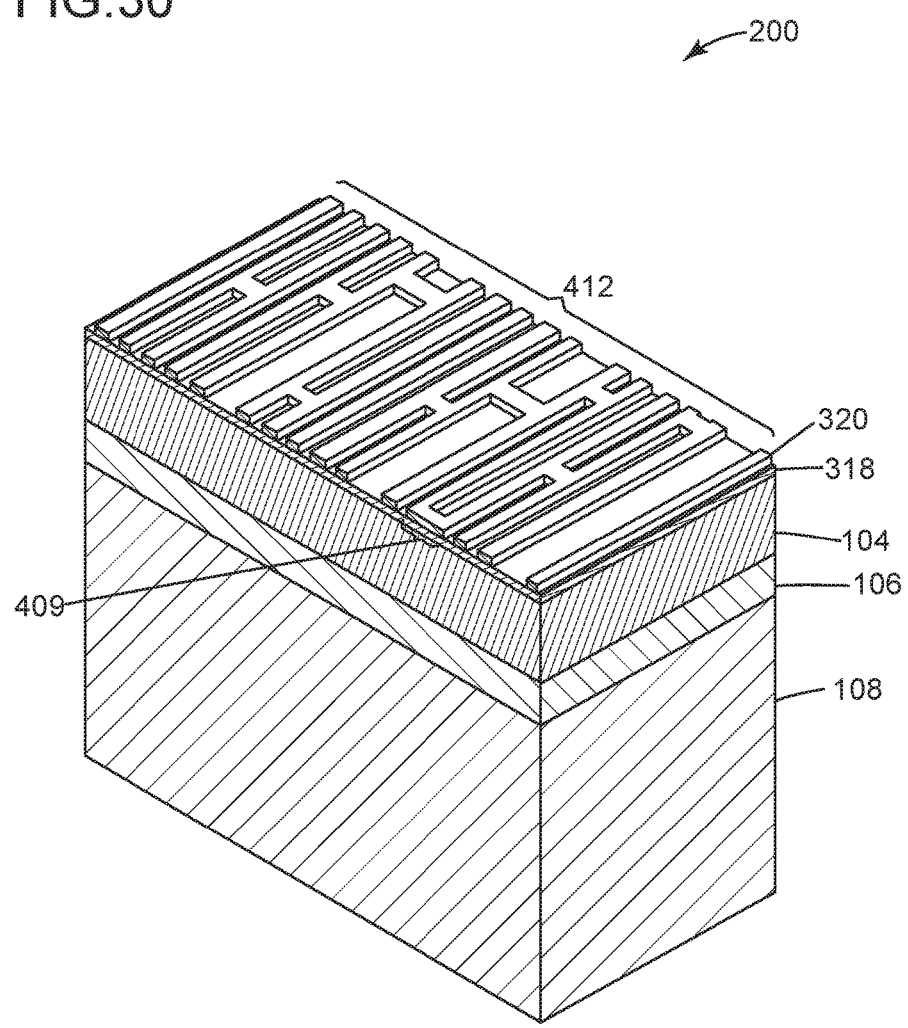
Figure 31:
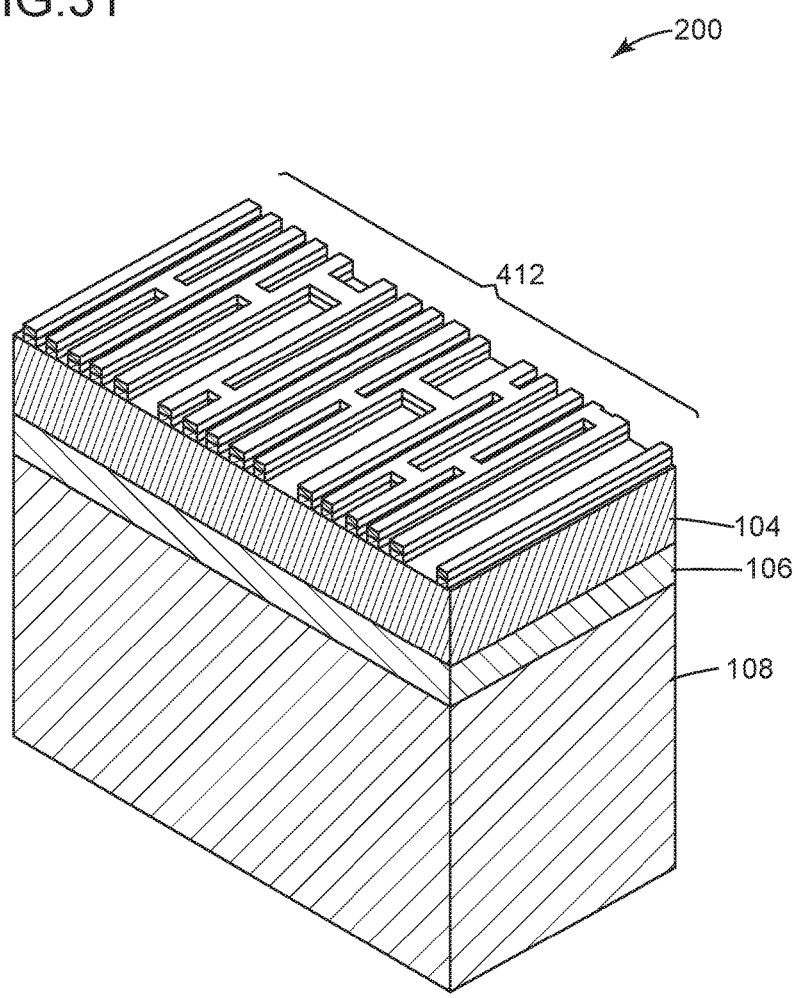
Figure 32:
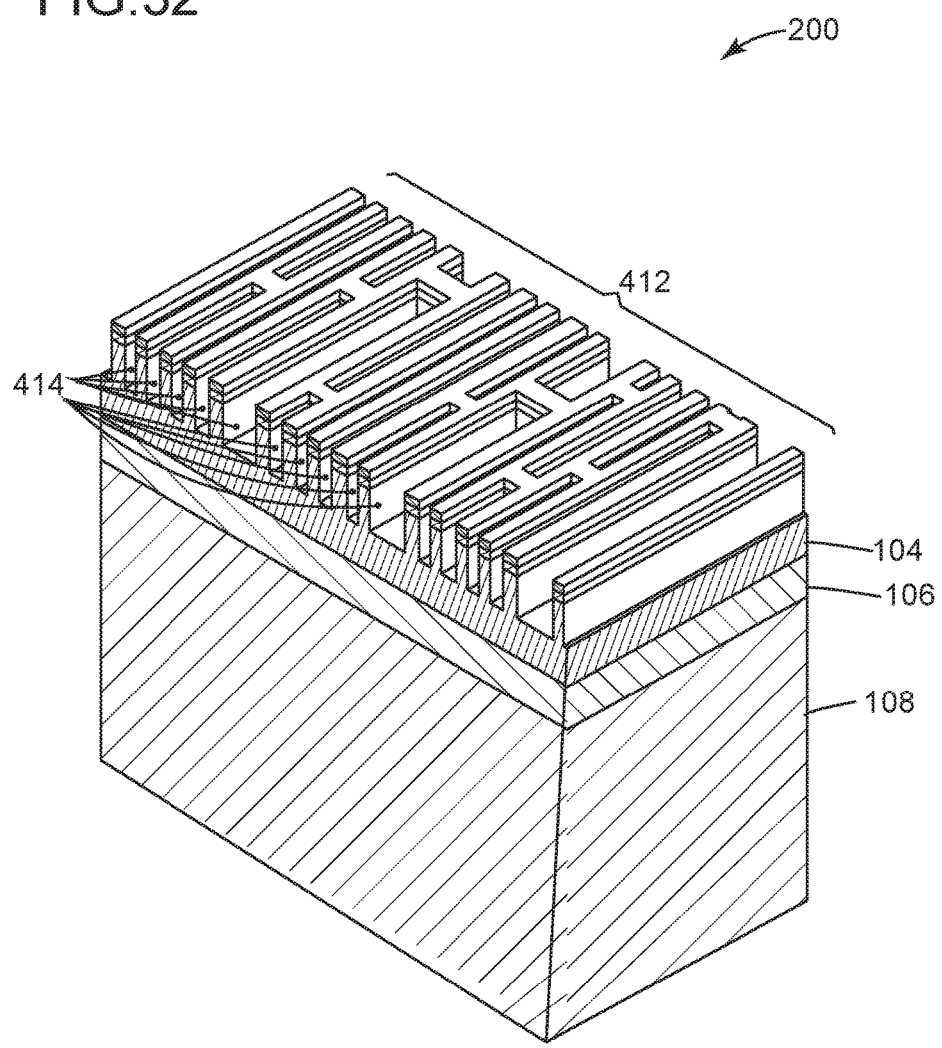
Figure 33:
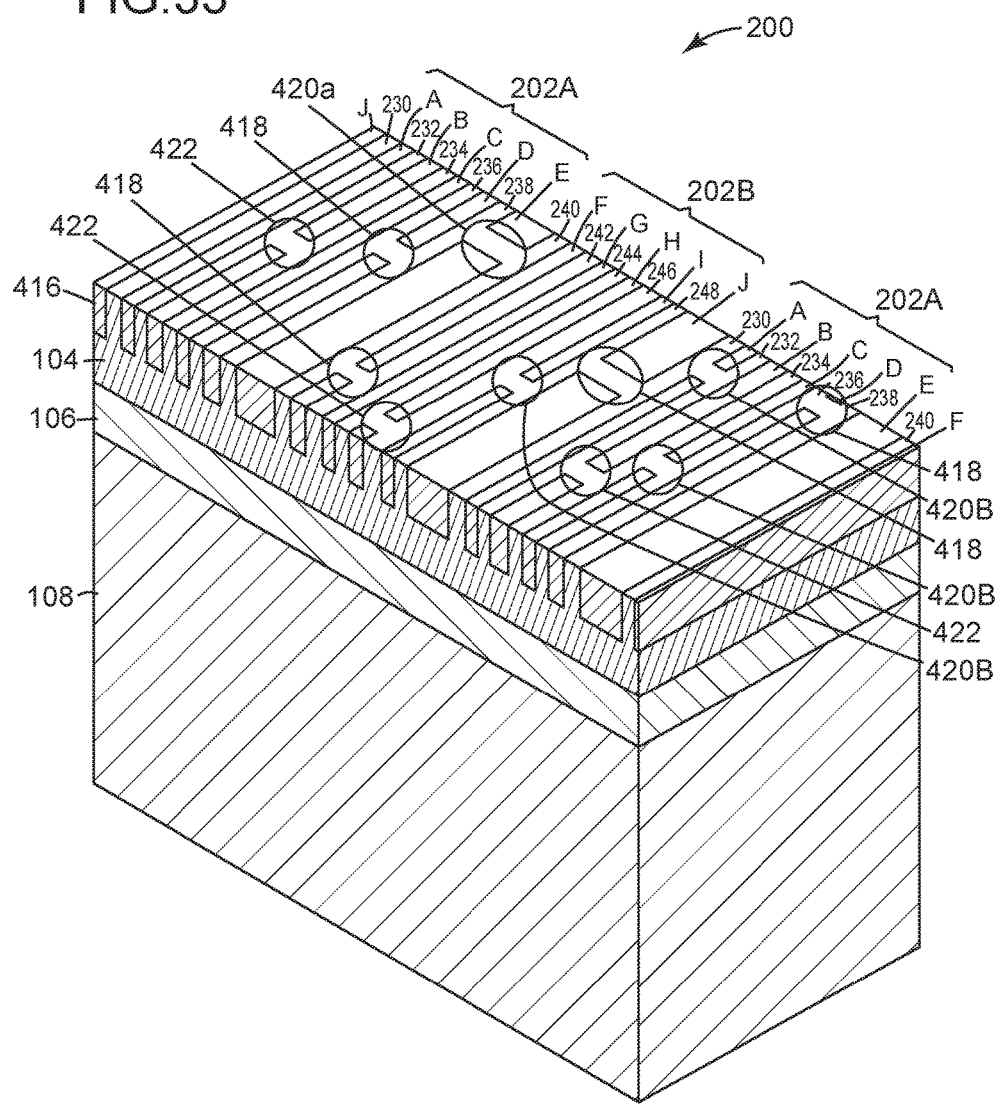
Figure 34:
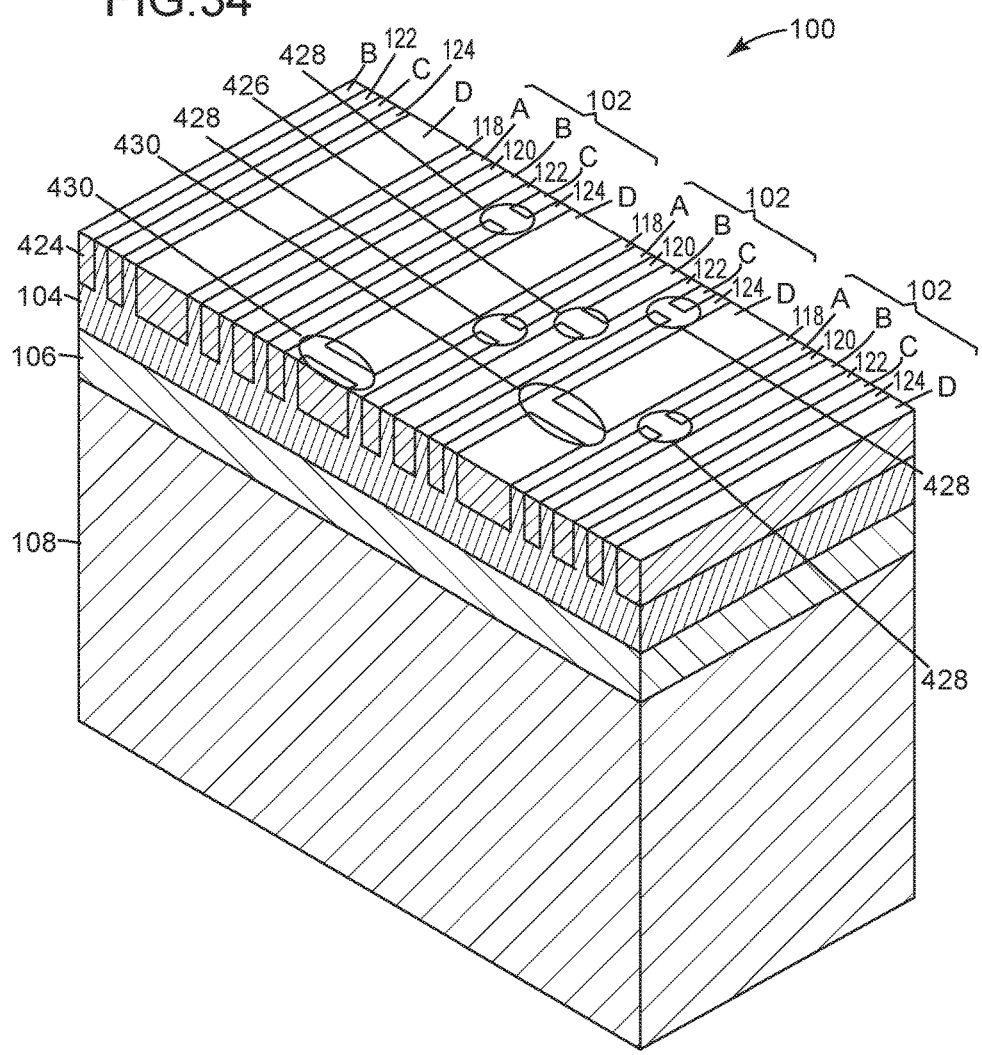

FIG. 10 is a perspective view of the structure of FIG. 9A having the 2$^{nd}$ litho stack stripped off of the structure and the 1$^{st}$ openings etched down past the 1$^{st}$ mandrels and through the 6$^{th}$ hardmask layer to land on the 5$^{th}$ hardmask layer;

FIG. 11A is a perspective view of the structure of FIG. 10 having a 3$^{rd}$ lithographic stack disposed thereon and 2$^{nd}$ openings patterned into a resist layer of the 3$^{rd}$ lithographic stack in accordance with the present invention;

FIG. 11B is a cross-sectional perspective view of FIG. 11A taken along the line 11B-11B in accordance with the present invention;

FIG. 12 is a perspective view of the structure of FIG. 11 B having the 2$^{nd}$ openings etched into the 1$^{st}$ mandrels in accordance with the present invention;

FIG. 13 is a perspective view of the structure of FIG. 12 having the 3$^{rd}$ lithographic stack removed in accordance with the present invention;

FIG. 14A is a perspective view of the structure of FIG. 13 having a 1$^{st}$ mandrel spacer layer disposed thereon in accordance with the present invention;

FIG. 14B is a cross sectional perspective view of FIG. 14A taken along the line 14B-14B in accordance with the present invention;

FIG. 14C is a cross sectional perspective view of FIG. 14A taken along the line 14C-14C in accordance with the present invention;

FIG. 15 is a perspective view of the structure of FIG. 14A having the first mandrel spacer layer anisotropically etched to form $1^{st}$ mandrel spacers in accordance with the present invention;

FIG. 16A is a cross sectional view of FIG. 15 taken along the line 16A-16A after the $1^{st}$ mandrels have been pulled and pattern transferred into underlying films;

FIG. 16B is a cross sectional view of FIG. 15 taken along the lines 16B-16B after the $1^{st}$ mandrel has been pulled and pattern transferred into underlying films;

FIG. 17 is a perspective view of the structure of FIG. 16A having the $1^{st}$ mandrels and the $6^{th}$ hardmask layer removed to reveal a $1^{st}$ pattern portion having $1^{st}$ line space molds, first cut masks and second cut masks, the second cut masks having non-self-aligned mask portions, the $1^{st}$ pattern portion being memorized into the $5^{th}$ hardmask layer and disposed over the $4^{th}$ hardmask layer in accordance with the present invention;

FIG. 18 is a perspective view of the structure of FIG. 17 having the $1^{st}$ pattern portion transferred into the $4^{th}$ hardmask layer and disposed over the $3^{rd}$ hardmask layer in accordance with the present invention;

FIG. 19 is a perspective view of the structure of FIG. 18 having a $4^{th}$ lithographic stack disposed thereon and $2^{nd}$ mandrel cells having $2^{nd}$ mandrels patterned into a resist layer of the $4^{th}$ lithographic stack in accordance with the present invention;

FIG. 20A is a perspective view the structure of FIG. 19 having the $2^{nd}$ mandrel cells patterned into the $2^{nd}$ mandrel layer in accordance with the present invention;

FIG. 20B is a top view of FIG. 20A showing the positioning of the $2^{nd}$ mandrel cells relative to the $1^{st}$ pattern portion such that they cover and protect self-aligned portions of the $1^{st}$ pattern portion and expose the non-self-aligned mask portions of the $2^{nd}$ cut masks;

FIG. 21 is a cross sectional perspective view of FIG. 20B taken along the line 21-21 showing the exposed non-self-aligned portions of the $2^{nd}$ cut mask;

FIG. 22 is a perspective view of FIG. 21 after the non-self-aligned portions of the $2^{nd}$ cut masks have been removed;

FIG. 23A is a perspective view of the structure of FIG. 22 having a $5^{th}$ lithographic stack disposed thereon and $3^{rd}$ openings patterned into a resist layer of the $5^{th}$ lithographic stack in accordance with the present invention;

FIG. 23B is a cross-sectional perspective view of FIG. 23A taken along the line 23B-23B in accordance with the present invention;

FIG. 24 is a perspective view of the structure of FIG. 23 B having the resist layer and a BARC layer of the $5^{th}$ litho stack stripped off of the structure and the $3^{rd}$ openings etched down past the $2^{nd}$ mandrel and through the $3^{rd}$ hardmask layer to land on the $2^{nd}$ hardmask layer wherein the $3^{rd}$ openings entirely span across $2^{nd}$ mandrel spaces between $2^{nd}$ mandrels in accordance with the present invention;

FIG. 25 is a perspective view of the structure of FIG. 24 having an SOH layer and a SiON cap layer of the $5^{th}$ lithographic stack removed in accordance with the present invention;

FIG. 26 is a perspective view of the structure of FIG. 25 having a $2^{nd}$ mandrel spacer layer disposed thereon and the $3^{rd}$ opening filled with a $3^{rd}$ cut plug in accordance with the present invention;

FIG. 27 is a perspective view of the structure of FIG. 26 after the $2^{nd}$ mandrel spacer layer has been anisotropically etched to form $2^{nd}$ mandrel spacers and the $2^{nd}$ mandrels have been removed to form a $2^{nd}$ pattern portion disposed on the $3^{rd}$ hardmask layer which combines with the $1^{st}$ pattern portion to form a final pattern in accordance with the present invention;

FIG. 28 is a perspective view of the structure of FIG. 27 having the final pattern transferred down to the $2^{nd}$ hardmask layer in accordance with the present invention;

FIG. 29 is a perspective view of the structure of FIG. 28 having the final pattern transferred down to the $1^{st}$ hardmask layer in accordance with the present invention;

FIG. 30 is a perspective view of the structure of FIG. 29 wherein remnants of the $3^{rd}$ hardmask layer, the $3^{rd}$ cut plugs and the $2^{nd}$ mandrel spacers are removed and the final pattern is now disposed directly over the $1^{st}$ hardmask layer in accordance with the present invention;

FIG. 31 is a perspective view of the structure of FIG. 30 having the final pattern anisotropically etched into the $1^{st}$ hardmask layer wherein the final pattern is now disposed directly over the dielectric layer in accordance with the present invention;

FIG. 32 is a perspective view of the structure of FIG. 31 having the dielectric layer anisotropically etched to transfer the final pattern into the dielectric layer in the form of a series of pattern trenches in accordance with the present invention;

FIG. 33 is a perspective view of the structure of FIG. 32 after the structure has been metalized and planarized to finalize formation of the 6 track metal interconnect cells into the dielectric layer, wherein FIG. 33 is also a perspective view of FIG. 3 in accordance with the present invention; and FIG. 34 is a perspective view of the 5 track metal interconnect cells of the structure of FIG. 1 in accordance with the present invention.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 1-34 illustrate various exemplary embodiments of an apparatus, and method of making the same, of cells of an interconnect system for a semiconductor structure, wherein the spaces between metal lines within the cell are not subject to lithographic variation and the widths of the lines are variable in accordance with the present invention. Additionally the method and apparatus can apply cuts to the signal lines and power lines of the cells that are fully self-aligned with the edges of the lines and, therefore, are not subject to lithographic overlay problems and do not inadvertently cut or notch any of the metal lines.

Moreover, the invention can be applied to semiconductor cells of interconnection lines having a minimum pitch of 38 nm or less. Additionally, the invention may be applied to semiconductor cells of any number of tracks, for example, 5 track, 6 track, 6.5 track and more.

More specifically, the following FIGS. 1-5 describe structural features of the cells in accordance with the present invention. Additionally FIGS. 6-34 describe methods of making the cells in accordance with the present invention.

Referring to FIG. 1, a simplified cross-sectional view of an exemplary embodiment of a semiconductor structure 100 of an integrated circuit in accordance with the present invention is presented. Structure 100 includes a plurality of fully formed semiconductor cells 102 of metal interconnect lines A, B, C and D, which are disposed in a dielectric layer 104.

The dielectric layer 104 is composed of a dielectric isolation material such as a low K or ultra-low K (ULK) material or various combinations of silicon, carbon, oxygen and hydrogen (an SiCOH layer). The dielectric layer may be disposed over an etch-stop hard mask layer 106, such as a silicon nitride (SiN) or similar. The etch stop layer 106 may be disposed over a complex stack of buried layers 108 from the substrate (not shown) upwards.

The top surfaces of layers 104, 106 and the buried layers of stack 108 are all planarized to be substantially parallel to each other. For purposes herein, the direction perpendicular to those top surfaces will be designated the vertical direction (as represented by the arrow 109).

The metal lines A, B, C and D of each cell 102 form an array of substantially parallel metal lines disposed within the dielectric layer 104. In this embodiment, the lines A, B and C represent signal lines for transmitting signals to and from devices in structure 100. Also, in this embodiment, the line D represents a power line for transmitting power to the devices in structure 100. As such, the power line D is required to carry significantly more current relative to signal lines A, B, C and, therefore, will be proportionally larger in width.

A plurality of first ($1^{st}$) 118, second ($2^{nd}$) 120, third ($3^{rd}$) 122 and fourth ($4^{th}$) 124 line spaces are disposed between the metal lines A, B, C, D and have the dielectric isolation material of dielectric layer 104 disposed therein. The line spaces 118, 120, 122, 124 have first 126, second 128, third 130 and fourth 132 line space widths respectively.

Figure 2:
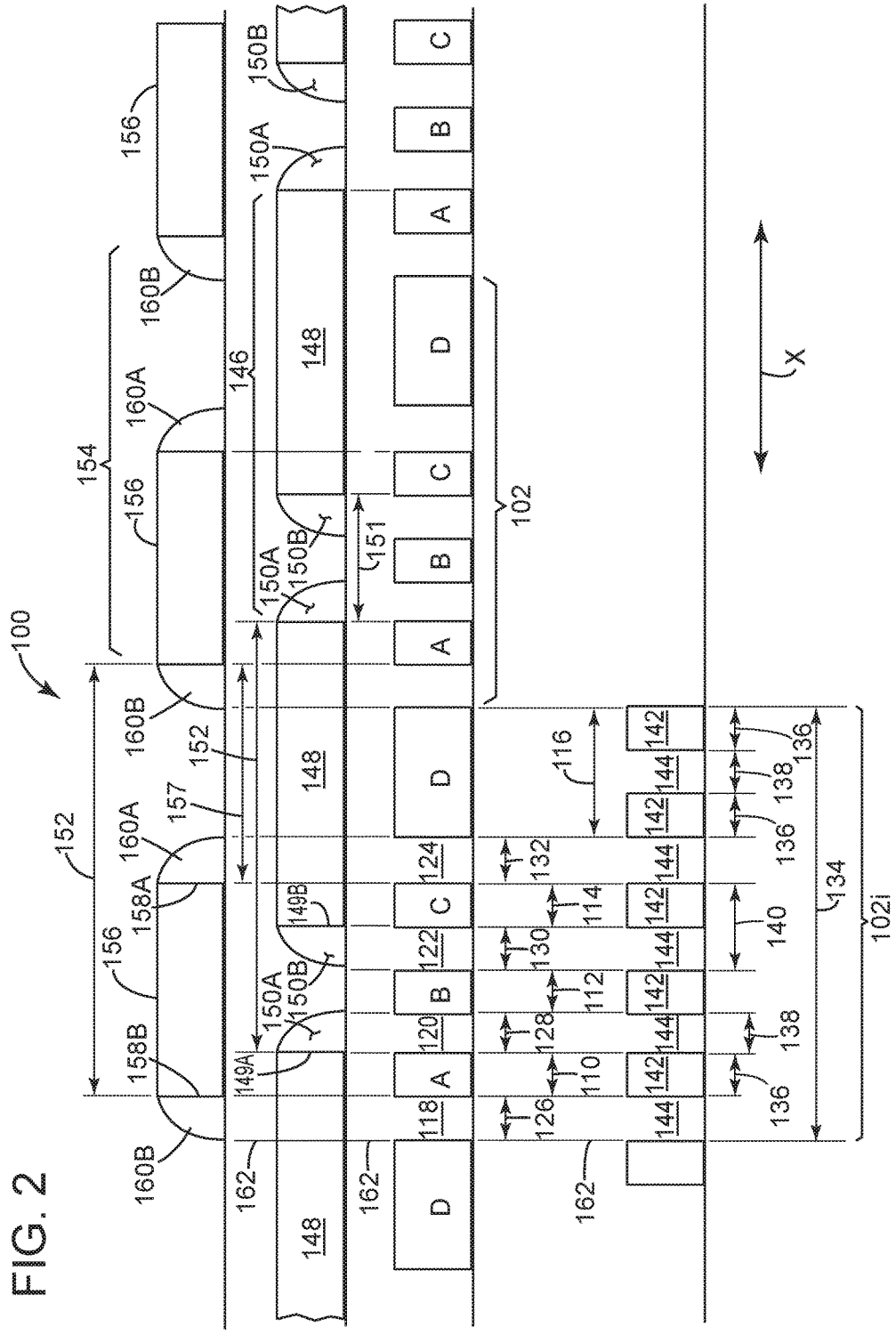

In this particular embodiment, the line widths 110, 112, and 114 of lines A, B and C respectively are set substantially equal to a predetermined minimum allowable line width 136 (best seen in FIG. 2). Also the line space widths 126, 128, 130 and 132 are set substantially equal to a predetermined minimum allowable line space width 138 (best seen in FIG. 2). Additionally, in this particular embodiment, the line width 116 of line D is set substantially equal to twice the minimum line width 136 plus the minimum line space width 138. The overall length in the X direction of cell 102 is known herein as the line cell pitch 134.

Referring to FIG. 2, a simplified cross sectional view of a plurality of the cells 102 of semiconductor structure 100, without the dielectric layer 104, is superimposed over an imaginary cell 102i. Imaginary cell 102i is composed of a plurality of parallel minimum metal lines 142 having the predetermined minimum width 136, wherein the metal lines 142 are separated by minimum line spaces 144 having the minimum line space width 138. The combination of a minimum line width 136 and minimum line space width 138 defines a cell track 140. Each cell track 140 is also considered to be a minimum line cell pitch 140 of the cells 102 and 102i. In this case, cell 102 is referred to as a 5 track cell since it has an overall cell pitch 134 of 5 minimum pitches 140.

Figure 4:
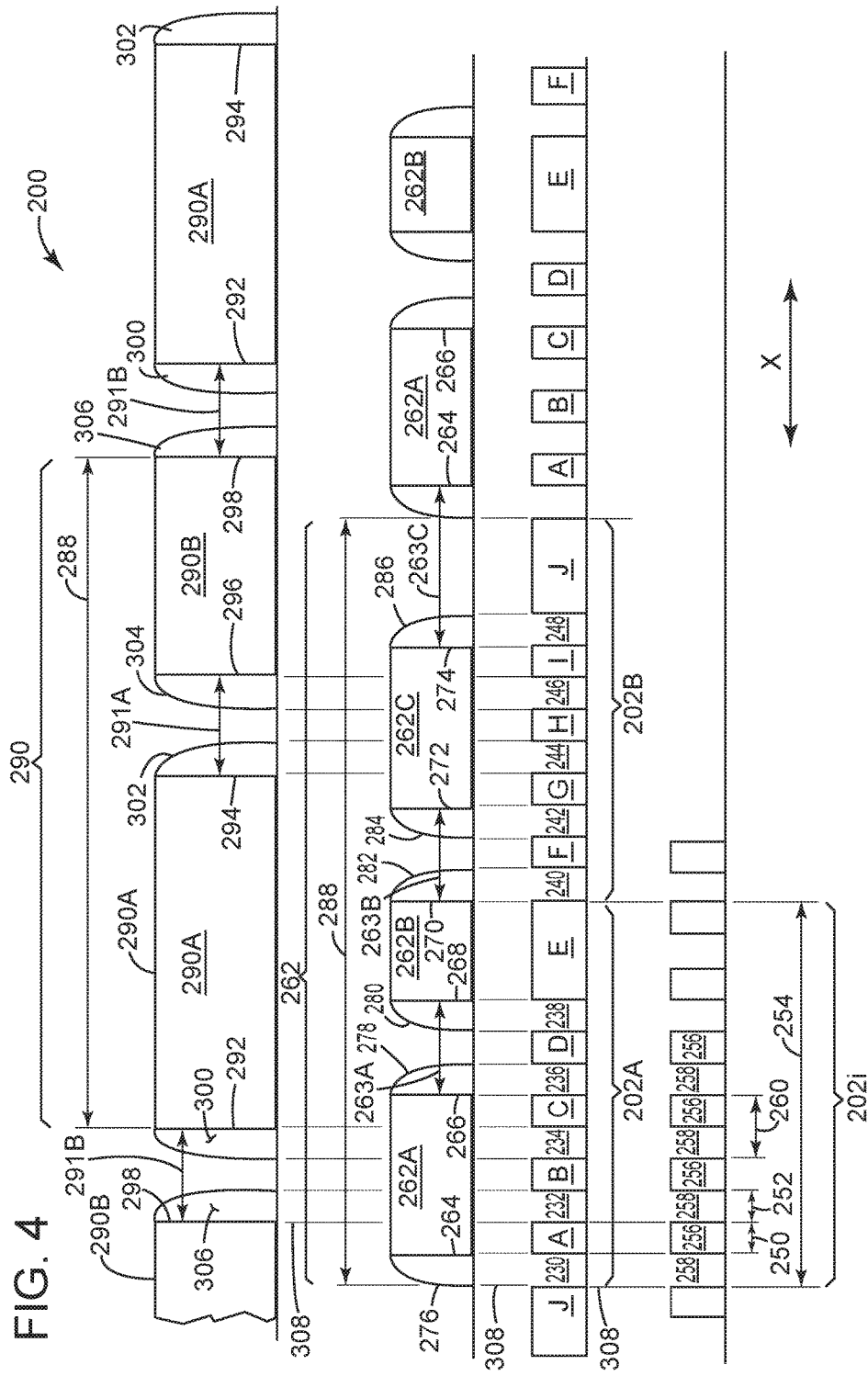

One skilled in the art would recognize that the overall cell pitch 134 may be equal to other multiples of cell track 140. For example (as illustrated in FIGS. 3 and 4), the cell pitch 134 could be equal to 6 cell tracks 260 in width, in which case the cell 102 would be referred to as a six track cell. Also, cell pitch 134 may be a non-integer multiple of the cell track 140, as in 4.5, 5.33, 5.66, 6.33 or 7.5 track and the like.

The minimum cell pitch 140 may be 38 nm or less. So, for example, the minimum cell pitch 140 of this cell 102 may be 36 nm, 32 nm, 28 nm, 26 nm or smaller, in accordance with the present invention.

Additionally the relative positions of a plurality of yet to be formed $1^{st}$ mandrel cells 146 are shown superimposed over the cells 102. The $1^{st}$ mandrel cells 146 include a repetitive pattern of $1^{st}$ mandrels 148. Each $1^{st}$ mandrel 148 has an opposing pair of sidewalls 149A, 149B located at the distal X direction ends of the $1^{st}$ mandrels. Upon the sidewalls are disposed an associated pair of $1^{st}$ mandrel spacers 150A and 150B respectively.

Each $1^{st}$ mandrel cell 146 has at least one $1^{st}$ mandrel 148 and a $1^{st}$ mandrel space 151 associated with it. The $1^{st}$ mandrel spaces 151 separate the $1^{st}$ mandrels within a cell 146 or between cells 146. The overall length in the X direction of a $1^{st}$ mandrel cell 146 is herein referred to as the mandrel cell pitch 152.

Additionally the relative positions of a plurality of yet to be formed $2^{nd}$ mandrel cells 154 are shown superimposed over the $1^{st}$ mandrel cells 146. The $2^{nd}$ mandrel cells 154 include a repetitive pattern of $2^{nd}$ mandrels 156. Each $2^{nd}$ mandrel 156 has an opposing pair of sidewalls 158A, 158B located in the X direction distal ends of the mandrels, upon which are disposed an associated pair of $2^{nd}$ mandrel spacers 160A and 160B respectively.

Each $2^{nd}$ mandrel cell 154 also has at least one $2^{nd}$ mandrel 156 and a $2^{nd}$ mandrel space 157 associated with it. The $2^{nd}$ mandrel spaces 157 separate the $2^{nd}$ mandrels within a cell 154 or between cells 154. The overall length in the X direction of a $2^{nd}$ mandrel cell 154 is substantially the same mandrel cell pitch 152 as the $1^{st}$ mandrel cells 146.

The process flow which utilizes the $1^{st}$ and $2^{nd}$ mandrels to form the 5 track cells 102 will be discussed in greater detail with reference to the formation of 6 track cells 202A and B, starting with FIG. 3. In summary though, a plurality of $1^{st}$ mandrel cells 146 are lithographically patterned into a $1^{st}$ mandrel layer (not shown) that is disposed over above the dielectric layer 104. A plurality of $2^{nd}$ mandrel cells are then lithographically patterned into a $2^{nd}$ mandrel layer (not shown) that is disposed above the $1^{st}$ mandrel layer. The $1^{st}$ and $2^{nd}$ mandrel spacers 150A, 150B, 160A, 160B are formed with a process such as atomic layer deposition (ALD).

It is important to note that the mandrels 148, 156, the spaces 151, 157 between the mandrels and the relative positions of the $1^{st}$ mandrel cells 146 to the $2^{nd}$ mandrel cells 154 are variously used to define the widths 110, 112, 114, 116 of the metal lines A, B, C, D. Since the mandrel cells 146, 154 are lithographically formed, they have a great deal of flexibility in the formation of the line widths 110, 112, 114, 116. However, for the same reason, the mandrel cells 146, 154, and therefore the line widths 110, and 114 are susceptible to lithographic tolerances.

It is also important to note that each $1^{st}$ mandrel spacer 150A, 150B of a $1^{st}$ mandrel cell 146 and each $2^{nd}$ mandrel spacer 160A, 160B of a $2^{nd}$ mandrel cell is used to form a specific line space 118, 120, 122, 124 of a single metal line cell 102. More specifically, in this embodiment (and as can be seen from vertical projections 162 in FIG. 2), within each metal line cell 102:

$2^{nd}$ mandrel spacer 160B is used to form the $1^{st}$ line space 118;

$1^{st}$ mandrel spacer 150A is used to form the $2^{nd}$ line space 120;

$1^{st}$ mandrel spacer 150B is used to form the $3^{rd}$ line space 122; and $2^{nd}$ mandrel spacer 160A is used to form the $4^{th}$ line space 124.

Since the mandrel spacers 150A, 150B, 160A, 160B are not lithographically formed, but rather are formed by an ALD process, they are not subject to lithographic variation issues. As such, the spaces 118, 120, 122, 124 can be very precisely controlled in their widths, but have less flexibility regarding the range of variations in their widths.

Additionally, it is important to note that in this embodiment there are an even number (in this case 4) of lines A, B, C, D and line spaces 118, 120, 122, 124 in each 5 track metal line cell 102. Since there are always going to be a pair of two opposing sidewalls for each mandrel, then there will necessarily always be an even number of mandrel spacers per mandrel cell available to form the line spaces in the metal line cells 102. More specifically, $1^{st}$ mandrels 148 include sidewalls 149A, 149B, upon which are formed $1^{st}$ mandrel spacers 150A, 150B, and $2^{nd}$ mandrels 156 include sidewalls 158A, 158B, upon which are formed $2^{nd}$ mandrel spacers 160A, 160B.

Accordingly, there are an even number of mandrel spacers 150A, 150B, 160A, 160B for every pair of mandrel cells 146, 154 utilized to form an even number of line spaces 118, 120, 122, 124 per line cell 102. As such, the pitch 152 of the mandrel cells 146, 154 must be set equal to the line cell pitch 134 of the metal line cells 102 in order to repetitively match the mandrel spacers to the line spaces from metal line cell to metal line cell.

Finally, as will be explained in greater detail herein, the positioning of the $2^{nd}$ mandrel cells 154 relative to the $1^{st}$ mandrel cells 146 is such that the $2^{nd}$ mandrels 156 always entirely overlays the $1^{st}$ mandrel space 151. As will be explained with reference to 6 track cell formation (beginning with FIG. 3), this overlay is important for formation of fully self-aligned continuity cuts within the metal line cells 102.

Referring to FIG. 3, a simplified cross-sectional view of another exemplary embodiment of a semiconductor structure 200 of an integrated circuit in accordance with the present invention is presented. Structure 200 includes a plurality of fully formed identical pairs of adjacent semiconductor metal line cells 202A and 202B. Line cell 202A includes metal interconnect lines A, B, C, D and E (herein A-E), which are disposed in a dielectric layer 204. Additionally, line cell 202B includes metal interconnect lines F, G, H, I and J (herein F-J), which are also disposed in the dielectric layer 204.

As will be explained in greater detail herein, line cells 202A and 202B are adjacent and substantially identical to each other. However they are formed utilizing different features of a $1^{st}$ set of mandrel cells 262 (best seen in FIG. 4) and a second set of mandrel cells 290 (best seen in FIG. 4). It is important to note that, the most significant difference between the embodiments of line cells 202A and 202B and the embodiments of line cells 102 is that line cells 202A, 202B have an odd number of metal lines A-E and F-J and metal line spaces, whereas the line cells 102 have an even number of metal lines A-D and metal line spaces.

The dielectric layer 104, similar to dielectric layer 102, is composed of a dielectric isolation material such as a low K or ultra-low K (ULK) material or various combinations of silicon, carbon, oxygen and hydrogen (an SiCOH layer). The dielectric layer may be disposed over an etch-stop hard mask layer 206, such as a silicon nitride (SiN) or similar. The etch stop layer 106 may be disposed over a complex stack of buried layers 208 from the substrate (not shown) upwards.

The top surfaces of layers 204, 206 and the buried layers of stack 208 are all planarized to be substantially parallel to each other. For purposes herein, the direction perpendicular to those top surfaces will be designated the vertical direction (as represented by the arrow 209).

The metal lines A-E and F-J of each cell 202A, 202B form an array of substantially parallel metal lines disposed within the dielectric layer 204. In this embodiment, the lines A, B, C, D (herein A-D) of cell 202A and lines F, G, H, I (herein F-I) of cell 202B represent signal lines for transmitting signals to and from devices in structure 200. Also, in this embodiment, the lines E and J represents power lines for transmitting power to the devices in structure 200. As such, the power lines E and J are required to carry significantly more current relative to signal lines A-D and F-I, therefore, will be proportionally larger in width.

The metal lines A-E have metal line widths 210, 212, 214, 216, 218 (herein 210-218) and the metal lines F-J have metal lines widths 220, 222, 224, 226, 228 (herein 220-228) respectively. A plurality of first ($1^{st}$) 230, second ($2^{nd}$) 232, third ($3^{rd}$) 234, fourth ($4^{th}$) 236 and fifth ($5^{th}$) 238 line spaces (herein 230-238) are disposed between the metal lines A-E of line cell 202A, which have line space widths 231, 233, 235, 237, 239 (herein 231-239) respectively. A plurality of sixth ($6^{th}$) 240, seventh ($7^{th}$) 242, eighth ($8^{th}$) 244, ninth ($9^{th}$) 246 and tenth (248) line spaces (herein 240-248) are disposed between the metal lines F-J of line cell 202B, which have line spaces widths 241, 243, 245, 247, 249 (herein 241-249) respectively. The line spaces 230-238 and 240-248 (collectively 230-248) have the dielectric isolation material of dielectric layer 204 disposed therein.

In this particular embodiment, the line widths 210, 212, 214, 216 of cell 202A and line widths 220, 222, 224, 226 of cell 202B are set substantially equal to a predetermined minimum allowable line width 250 (best seen in FIG. 4). Also the line space widths 231-239 and 241-249 (collectively 231-249) are set substantially equal to a predetermined minimum allowable line space width 252 (best seen in FIG. 4). Additionally, in this particular embodiment, the line width 218 of line E and line width 228 of line J are set substantially equal to twice the minimum line width 250 plus the minimum line space width 252. The overall length in the X direction of cells 202A and 202B are known herein as the minimum line cell pitch 254.

Referring to FIG. 4, a simplified cross sectional view of a plurality of the cells 202A and 202B of semiconductor structure 200, without the dielectric layer 204, is superimposed over an imaginary cell 202i. Imaginary cell 202i is composed of a plurality of parallel minimum metal lines 256 having the predetermined minimum line width 250, wherein the metal lines 256 are separated by minimum line spaces 258 having the minimum line space width 252. The combination of a minimum line width 250 and minimum line space width 252 defines a cell track 260. Each cell track 260 is also considered to be a minimum line pitch 260 of the cells 202A, 202B and 202i. In this case, cells 202A and 202B are referred to as a 6 track cells since they have an overall cell pitch 254 of 6 minimum pitches 260.

Additionally the relative positions of a plurality of yet to be formed $1^{st}$ mandrel cells 262 are shown superimposed over the cells 202A and 202B. The $1^{st}$ mandrel cells 262 include a repetitive pattern of $1^{st}$ mandrels 262A, 262B, 262C. Each $1^{st}$ mandrel 262A, 262B, 262C has an opposing pair of sidewalls 264-274 upon which are disposed an associated pair of $1^{st}$ mandrel spacers 276-286. More specifically, $1^{st}$ mandrel 262A includes opposing sidewalls 264, 266 upon which are disposed $1^{st}$ mandrel spacers 276, 278 respectively. Also, $1^{st}$ mandrel 262B includes opposing sidewalls 268, 270 upon which are disposed $1^{st}$ mandrel spacers 280, 282 respectively. Additionally, $1^{st}$ mandrel 262C includes opposing sidewalls 272, 274 upon which are disposed $1^{st}$ mandrel spacers 284, 286 respectively.

Associated with each $1^{st}$ mandrel cell 262A, 262B, 262C is a respective $1^{st}$ mandrel cell spaces 263A, 263B, 263C (collectively 263). The $1^{st}$ mandrel spaces 263A, 263B, 263C separate the $1^{st}$ mandrels 262A, 262B, 262C within a cell 262 or between cells 262. The overall length in the X direction of a $1^{st}$ mandrel cell 262 is herein referred to as the mandrel cell pitch 288.

Additionally the relative positions of a plurality of yet to be formed $2^{nd}$ mandrel cells 290 are shown superimposed over the $1^{st}$ mandrel cells 262. The $2^{nd}$ mandrel cells 290 include a repetitive pattern of $2^{nd}$ mandrels 290A, 290B. Each $2^{nd}$ mandrel 290A, 290B has an opposing pair of sidewalls 292-298 upon which are disposed an associated pair of $1^{st}$ mandrel spacers 300-306. More specifically, $2^{nd}$ mandrel 290A includes opposing sidewalls 292, 294 upon which are disposed $2^{nd}$ mandrel spacers 300, 302 respectively. Also, $2^{nd}$ mandrel 290B includes opposing sidewalls 296, 298 upon which are disposed $2^{nd}$ mandrel spacers 304, 306 respectively.

Associated with each $2^{nd}$ mandrel cell 290A, 290B is a respective $2^{nd}$ mandrel cell spaces 291A, 291B (collectively 291). The $2^{nd}$ mandrel spaces 291A, 291B separate the $2^{nd}$ mandrels 290A, 290B within a cell 290 or between cells 290. The overall length in the X direction of a $2^{nd}$ mandrel cell 290 is substantially the same mandrel cell pitch 288.

The process flow that utilizes $1^{st}$ and $2^{nd}$ mandrel cells 262, 290 to form line cells 202A and 202B will be discussed in greater detail herein. The superposition in FIG. 4 of the mandrel cells 262, 290 over the line cells 202A and B are used to illustrate which specific structures within the mandrel cells control and define the lines A-E of line cell 202A and lines F-J of line cell 202B during the process flow of semiconductor structure 200.

In summary though, a plurality of the $1^{st}$ mandrel cells 262 are lithographically patterned into a $1^{st}$ mandrel layer 330 (best seen in FIG. 8) that is disposed over the dielectric layer 204. A plurality of $2^{nd}$ mandrel cells 290 are then lithographically patterned into a $2^{nd}$ mandrel layer 382 (best seen in FIG. 20A) that is disposed above the $1^{st}$ mandrel layer. The $1^{st}$ and $2^{nd}$ mandrel spacers 276-286 and 300-306 are formed with a process such as atomic layer deposition (ALD).

It is important to note that the $1^{st}$ and $2^{nd}$ mandrels 262A, 262B, 262C 290A, 290B, the $1^{st}$ and $2^{nd}$ mandrel spaces 263A, 263B, 263C, 291A, 291B between the mandrels and the relative positions of the $1^{st}$ mandrel cells 262 to the $2^{nd}$ mandrel cells 290 are variously used to define the metal lines A-E and J-E. Since the mandrel cells 262, 290 are lithographically formed, they have a great deal of flexibility in the formation of the line widths 210-226 (best seen in FIG. 3). However, for the same reason, the mandrel cells 262, 290, and therefore the line widths 210, 214, 220 and 224 are susceptible to lithographic variation.

It is also important to note that each $1^{st}$ mandrel spacer 276-286 of a $1^{st}$ mandrel cell 262 and each $2^{nd}$ mandrel spacer 300-306 of a $2^{nd}$ mandrel cell 290 is used to form a specific line space 230-248 of a single metal line cell 202A, 202B. More specifically, in this embodiment (and as can be seen from vertical projections 308 in FIG. 4), within each metal line cell 202A, 202B:

$1^{st}$ mandrel spacer 276 is used to form $1^{st}$ line space 230
$2^{nd}$ mandrel spacer 306 is used to form $2^{nd}$ line space 232
$2^{nd}$ mandrel spacer 300 is used to form $3^{rd}$ line space 234
$1^{st}$ mandrel spacer 278 is used to form $4^{th}$ line space 236
$1^{st}$ mandrel spacer 280 is used to form $5^{th}$ line space 238
$1^{st}$ mandrel spacer 282 is used to form $6^{th}$ line space 240
$1^{st}$ mandrel spacer 284 is used to form $7^{th}$ line space 242
$2^{nd}$ mandrel spacer 302 is used to form $8^{th}$ line space 244
$2^{nd}$ mandrel spacer 304 is used to form $9^{th}$ line space 246
$1^{st}$ mandrel spacer 286 is used to form $10^{th}$ line space 248.

Since the mandrel spacers 276-286 and 300-306 are not lithographically formed, but rather are formed by an ALD process, they are not subject to lithographic tolerance issues. As such, the line spaces 230-248 can be very precisely controlled in their widths, but have less flexibility regarding the range of variations in their widths.

More specifically, the mandrel spacers 276-286, 300-306, and therefore the line spaces 230-248, can typically be held to a tolerance of plus or minus 2 nm and more preferably to a tolerance of plus or minus 1 nm. The width of the mandrel can typically be maintained within a tolerance of plus or minus 2 nm and the final line spaces can typically be held to within a tolerance of plus or minus 3 nm or better. Though the $1^{st}$ mandrel spacers 276-286 and $2^{nd}$ mandrel spacers 300-306 are often set to the same thickness, they can also be set to two separate and distinct widths within the range specified. As such, the $1^{st}$, $4^{th}$, $5^{th}$, $6^{th}$ and $10^{th}$ line spaces (reference nos. 230, 236, 238, 240, 248) can be set to one line space width since they are formed from the $1^{st}$ mandrel spacers 276-286. Additionally, the $2^{nd}$, $3^{rd}$, $8^{th}$ and $9^{th}$ line spaces (reference nos. 232, 234, 244, 246) can be set to a different line space width (for example a difference of 4 nm to 12 nm) since they are formed from the $2^{nd}$ mandrel spacers 300-306. For purposes of this particular embodiment though, the line spaces 230-248 are all set to the minimum line space width 252.

Additionally, it is important to note that in this embodiment there are an odd number (in this case 5) of lines and line spaces per cell 202A, 202B. More specifically, there are 5 metal lines A-E and 5 metal line spaces 230-238 in cell 202A. Additionally, there are 5 metal lines F-J and 5 metal line spaces 240-248 in the substantially identical cell 202B.

Since there are always going to be a pair of two opposing sidewalls for each mandrel, then there will necessarily always be an even number of mandrel spacers per mandrel cell utilized to form the line spaces in the metal line cells. However, since the metal line cells in this embodiment have an odd number of metal lines and associate metal line spaces per cell, then the metal line cells must be processed as an identical pair 202A, 202B in order to match the even number of sidewalls and associated mandrel spacers in the mandrel cells 262, 290 that form them. Otherwise the flow process will not be able to repeat itself from line cell to line cell within the dielectric layer 204.

More specifically, in this embodiment, the line cells 202A and 202B have 5 metal lines and line spaces each, which is an odd number. Therefore the paired cells 202A, 202B have a combined total of 10 metal lines A-J and 10 line spaces 230-248. In $1^{st}$ mandrel cell 262 there are three $1^{st}$ mandrels 262A, B, C and six $1^{st}$ mandrel spacers 276-286. Additionally, in $2^{nd}$ mandrel cell 290 there are two mandrels 290A, B and four $2^{nd}$ mandrel spacers 300-306. Therefore the paired mandrel cells 262, 290 have a combined total of ten mandrels 262A, B, C, 290A, B and ten mandrel spacers, which match the number of metal lines and line spaces in 202A, and B. Accordingly, the flow process will be able to repeat itself from line cell to line cell within the dielectric layer 204.

It is important to note that for the flow process described in the embodiment illustrated in FIGS. 3 and 4, when the number of metal lines A-E and F-J of metal line cells 202A, 202B of structure 200 are an odd number (5, in this embodiment), the number of metal lines within the line cell are equal to the sum of the number of $1^{st}$ mandrels 262A, B, C within the $1^{st}$ mandrel cell 262 plus the number of $2^{nd}$ mandrels 290A, B within the $2^{nd}$ mandrel cell 290. Additionally for the flow process described in the embodiment illustrated in FIGS. 1 and 2, when the number of metal lines A-D of metal line cell 102 of structure 100 are an even number (4, in this embodiment), the number of metal lines within the line cell are equal to twice the sum of the number of $1^{st}$ mandrels 148 within the $1^{st}$ mandrel cell 146 plus the number of $2^{nd}$ mandrels 156 within the $2^{nd}$ mandrel cell 154.

It is also important to note that for the flow process described in the embodiment illustrated in FIGS. 3 and 4, when the number of metal lines A-E and F-J of metal line cells 202A, 202B of structure 200 are an odd number (5, in this embodiment), the line cell pitch 254 is substantially equal to half the mandrel cell pitch 288. Additionally for the flow process described in the embodiment illustrated in FIGS. 1 and 2, when the number of metal lines A-D of metal line cell 102 of structure 100 are an even number (4, in this embodiment), the line cell pitch 134 is substantially equal to the mandrel cell pitch 152.

Additionally, it is important to note that the positioning of the $2^{nd}$ mandrel cells 290 relative to the $1^{st}$ mandrel cells 262 is such that the $2^{nd}$ mandrels 290A, 290B entirely overlay the $1^{st}$ mandrel spaces 263A, 263B, 263C. As will be explained in greater detail herein, this overlay is important for formation of fully self-aligned continuity cuts within the metal line cells 202A and 202B.

More specifically, in the embodiment illustrated in FIGS. 3 and 4, the $2^{nd}$ mandrel 290A entirely overlays $1^{st}$ mandrel spaces 263A and 263B by completely spanning across $1^{st}$ mandrel 262B and having its distal ends (defined by sidewalls 292 and 294) overlap with a distal end of $1^{st}$ mandrel 262A (defined by sidewall 266) and a distal end of $1^{st}$ mandrel 262C (defined by sidewall 272). Additionally, $2^{nd}$ mandrel 290B entirely overlays $1^{st}$ mandrel space 263C by having its distal ends (defined by sidewalls 296 and 298) overlap with a distal end of $1^{st}$ mandrel 262C (defined by sidewall 274) and a distal end of $1^{st}$ mandrel 262A (defined by sidewall 264).

Figure 5:
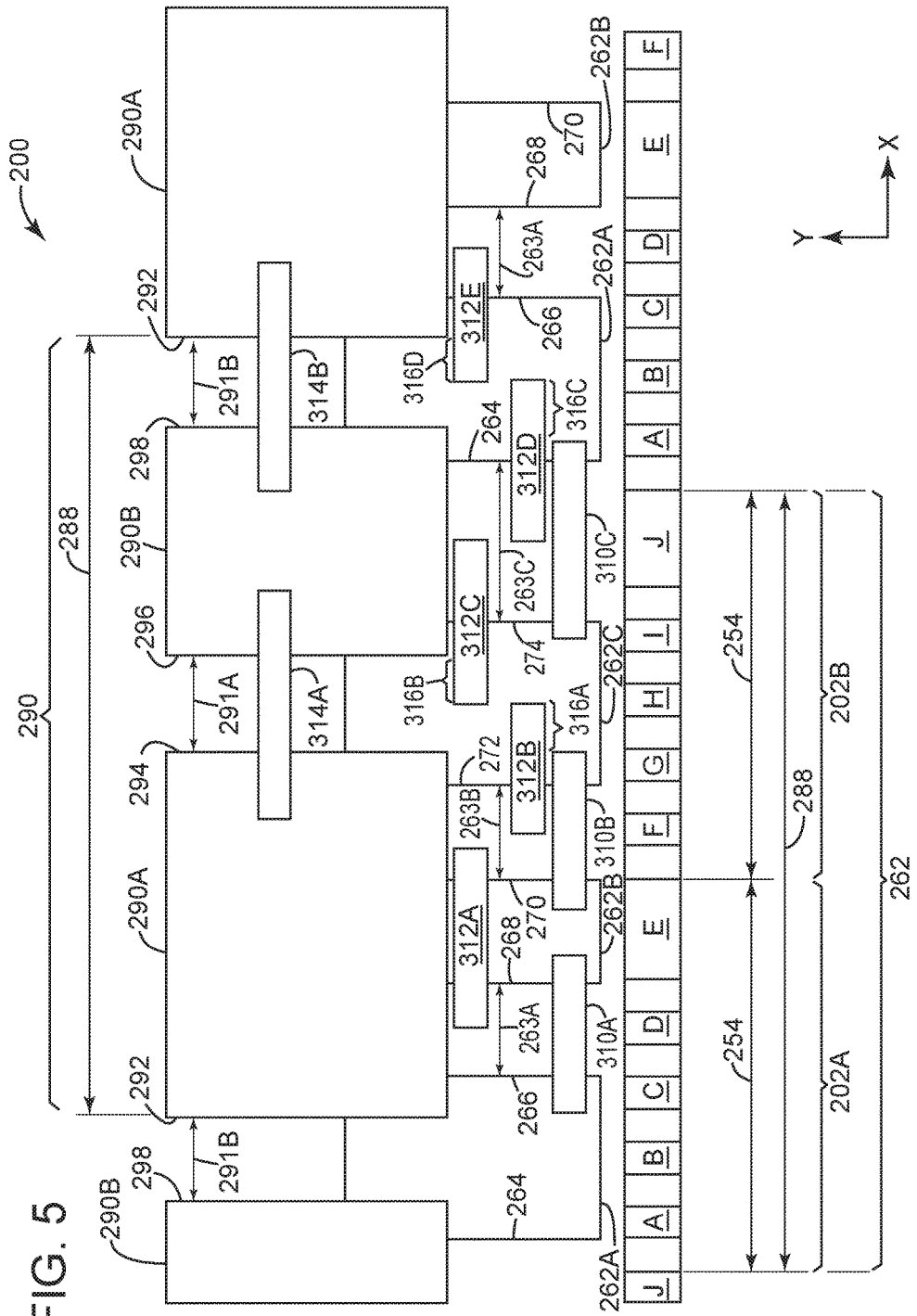

Referring to FIG. 5, a simplified top view of a plurality of the cells 202A, 202B of semiconductor structure 200 is presented. Additionally, superimposed over the cells 202A, 202B are the yet to be formed $1^{st}$ mandrel cells 290 and $2^{nd}$ mandrel cells 262. Finally, superimposed over the mandrel cells 290, 262 are yet to be formed $1^{st}$, $2^{nd}$ and $3^{rd}$ openings 310, 312, 314, which will be patterned into resist layers during the process flow of structure 200. The openings 310, 312, 314 will be utilized to form self-aligned continuity cuts (or continuity blocks) 418, 420A, 420B, 422 (best seen in FIG. 33) in the metal lines of cells 202A and 202B The process flow that forms those continuity cuts will be discussed in greater detail herein. The superposition in FIG. 3 of these structures over the cells 202A, 202B are used to illustrate which specific structures control and define the openings 310, 312, 314 (and ultimately the continuity cuts 418, 420A, 420B, 422) of the cells 202A, 202B during the process flow of semiconductor structure 200.

In summary though:

The $1^{st}$ openings 310 are lithographically patterned into the $1^{st}$ mandrel cells 262 such that they entirely span the $1^{st}$ mandrel spaces 263A, B, C. The $1^{st}$ openings 310 are then etched down to be self-aligned at opposing distal ends (i.e., fully self-aligned) with the sidewalls of the $1^{st}$ mandrels 262A, B, C.

The $2^{nd}$ openings 312 are also lithographically patterned into the $1^{st}$ mandrel cell 262 such that they either partially or entirely span the $1^{st}$ mandrels 262A, B, C. The $2^{nd}$ openings 312 are then etched down to be self-aligned with at least one sidewall of the $1^{st}$ mandrels 262A, B, C. It is important to note, that at this stage of the process flow those $2^{nd}$ openings 312 that entirely span a $1^{st}$ mandrel are fully self-aligned on both opposing distal ends, while those $2^{nd}$ openings 312 that only partially span a $1^{st}$ mandrel are only self-aligned at one distal end (i.e., partially self-aligned).

The $3^{rd}$ openings 314 are lithographically patterned into the $2^{nd}$ mandrel cells 290 such that they entirely span the $2^{nd}$ mandrel spaces 291A, B. The $3^{rd}$ mandrel openings 314 are then etched down to be fully self-aligned at opposing distal ends with the sidewalls of the $2^{nd}$ mandrels 290A, B.

Importantly, the $2^{nd}$ mandrel cells 290 are positioned relative $1^{st}$ mandrel cells 262 such that they cover and protect the self-aligned portions of the $1^{st}$ and $2^{nd}$ openings 310, 312 from any etching processes performed on the $3^{rd}$ openings 314. However, the positioning of the $2^{nd}$ mandrel cells 290 leaves exposed any non-self-aligned portions 316 of the $2^{nd}$ openings 312. As such, the non-self-aligned portions 316 will be etched down during the etching process of the $3^{rd}$ openings 314 to be "repaired" and self-aligned with sidewalls of the $2^{nd}$ mandrels 290A, B. The net result is that the $2^{nd}$ openings become fully self-aligned with sidewalls of both the $1^{st}$ mandrels 262A, B, C and $2^{nd}$ mandrels 290A, B, C.

It is important to note that in order for $2^{nd}$ mandrel cells 290 to properly cover and protect the self-aligned portions of the $1^{st}$ and $2^{nd}$ openings 310, 312, then the positioning of the $2^{nd}$ mandrel cells 290 relative to the $1^{st}$ mandrel cells 262 must be such that the $2^{nd}$ mandrels 290A, B entirely overlay at least the $1^{st}$ mandrel spaces 263A, B, C.

The $1^{st}$, $2^{nd}$ and $3^{rd}$ openings 310, 312, 314 are then etched down to form fully self-aligned continuity cuts in the metal lines of cells 202A, 202B.

More specifically:

$1^{st}$ opening 310A entirely spans $1^{st}$ mandrel space 263A and is fully self-aligned with $1^{st}$ mandrel sidewalls 266 and 268.

$1^{st}$ opening 310B entirely spans $1^{st}$ mandrel space 263B and is fully self-aligned with $1^{st}$ mandrel sidewalls 270 and 272.

$1^{st}$ opening 310C entirely spans $1^{st}$ mandrel space 263C and is fully self-aligned with $1^{st}$ mandrel sidewalls 274 and 264.

$2^{nd}$ opening 312A entirely spans $1^{st}$ mandrel 262B and is fully self-aligned with $1^{st}$ mandrel sidewalls 268 and 270.

$2^{nd}$ opening 312B partially spans $1^{st}$ mandrel 262C and is self-aligned with $1^{st}$ mandrel sidewall 272. Later in the process flow, the non-self-aligned portion 316A is removed during an etching process on $3^{rd}$ opening 314A to self-align $2^{nd}$ opening 312B with $2^{nd}$ mandrel sidewall 294.

$2^{nd}$ opening 312C partially spans $1^{st}$ mandrel 262C and is self-aligned with $1^{st}$ mandrel sidewall 274. Later in the process flow, the non-self-aligned portion 316B is removed during an etching process on $3^{rd}$ opening 314A to self-align $2^{nd}$ opening 312C with $2^{nd}$ mandrel sidewall 296.

$2^{nd}$ opening 312D partially spans $1^{st}$ mandrel 262A and is self-aligned with $1^{st}$ mandrel sidewall 264. Later in the process flow, the non-self-aligned portion 316C is removed during an etching process on $3^{rd}$ opening 314B to self-align $2^{nd}$ opening 312D with $2^{nd}$ mandrel sidewall 298.

$2^{nd}$ opening 312E partially spans $1^{st}$ mandrel 262A and is self-aligned with $1^{st}$ mandrel sidewall 266. Later in the process flow, the non-self-aligned portion 316D is removed during an etching process on $3^{rd}$ opening 314B to self-align $2^{nd}$ opening 312E with $2^{nd}$ mandrel sidewall 292.

$3^{rd}$ opening 314A entirely spans $2^{nd}$ mandrel space 291A and is fully self-aligned with $2^{nd}$ mandrel sidewalls 294 and 296.

$3^{rd}$ opening 314B entirely spans $2^{nd}$ mandrel space 291B and is fully self-aligned with $2^{nd}$ mandrel sidewalls 298 and 292.

The $1^{st}$ openings 310A, B and C will be etched down to form fully self-aligned continuity cuts 418 (best seen in FIG. 33) in lines D, F and J of cells 202A and 202B.

The $2^{nd}$ openings 312A, B, C, D and E will be etched down to form fully self-aligned continuity cuts 420A, 420B (best seen in FIG. 33) in lines A, C, E, G and I of cells 202A and 202B.

The $3^{rd}$ openings 314A and B will be etched down to form fully self-aligned continuity cuts 422 (best seen in FIG. 33) in lines H and B of cells 202A and 202B.

The following FIGS. 6-34 will describe the detailed process flow utilized to form 6 track cells 202A and 202B having an odd number of metal lines and line spaces. The process flow can also be applied to the formation of 5 track cells 102 having an even number of metal lines and line spaces. The process flow will also include formation of fully self-aligned continuity cuts.

Figure 6:
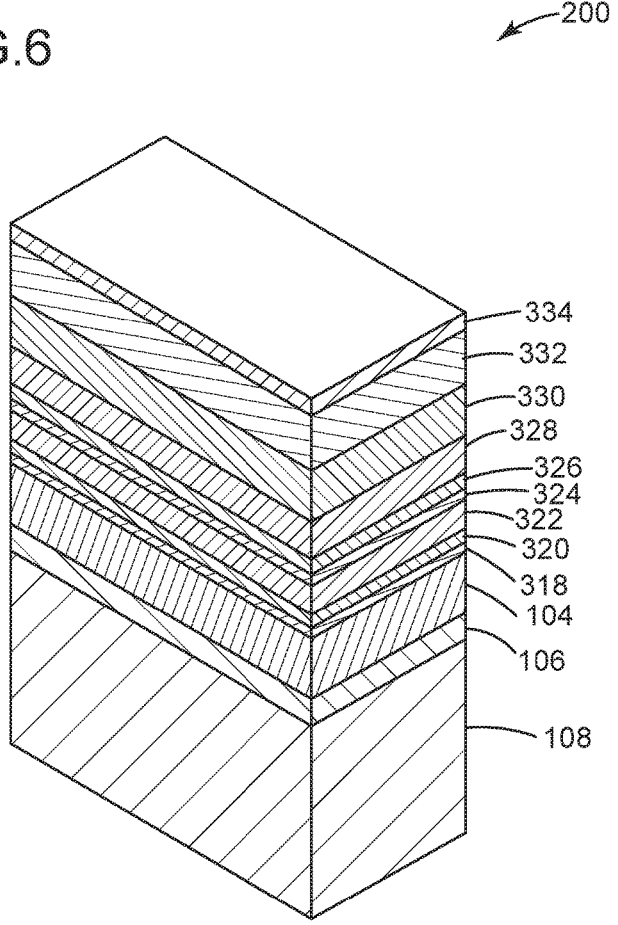

Referring to FIG. 6, a stack is provided which includes the buried layers 108, the etch stop layer 106 and the dielectric layer 104 as discussed earlier. Disposed respectively over the dielectric layer are a $1^{st}$ hardmask layer 318 composed of a titanium nitride (TiN) or similar material, a $2^{nd}$ hardmask layer 320 composed of an amorphous silicon (aSi) or similar, a $3^{rd}$ hardmask layer 322 composed of a silicon nitride (SiN) or similar, a $4^{th}$ hardmask layer 324 composed of a TiN or similar, a $5^{th}$ hardmask layer 326 composed of an aSi or similar, and a $6^{th}$ hardmask layer 328 composed of a SiN or similar. Disposed over the $6^{th}$ hardmask layer 328 is a $1^{st}$ mandrel layer 330 composed of an aSi or similar.

Disposed over the $1^{st}$ mandrel layer 330 is a $1^{st}$ spin-on hardmask (SOH) layer 332 and a $1^{st}$ SiON cap layer 334. The $1^{st}$ SOH layer 332 may be an organic planarization layer (OPL) deposited through a spin-on process and may be composed of an organic material such as amorphous carbon (aC) or similar. The $1^{st}$ SOH layer 332 and $1^{st}$ SiON cap layer 334 are the first two layer of an exemplary $1^{st}$ lithographic (litho) stack 336 (best seen in FIG. 7).

Figure 7:
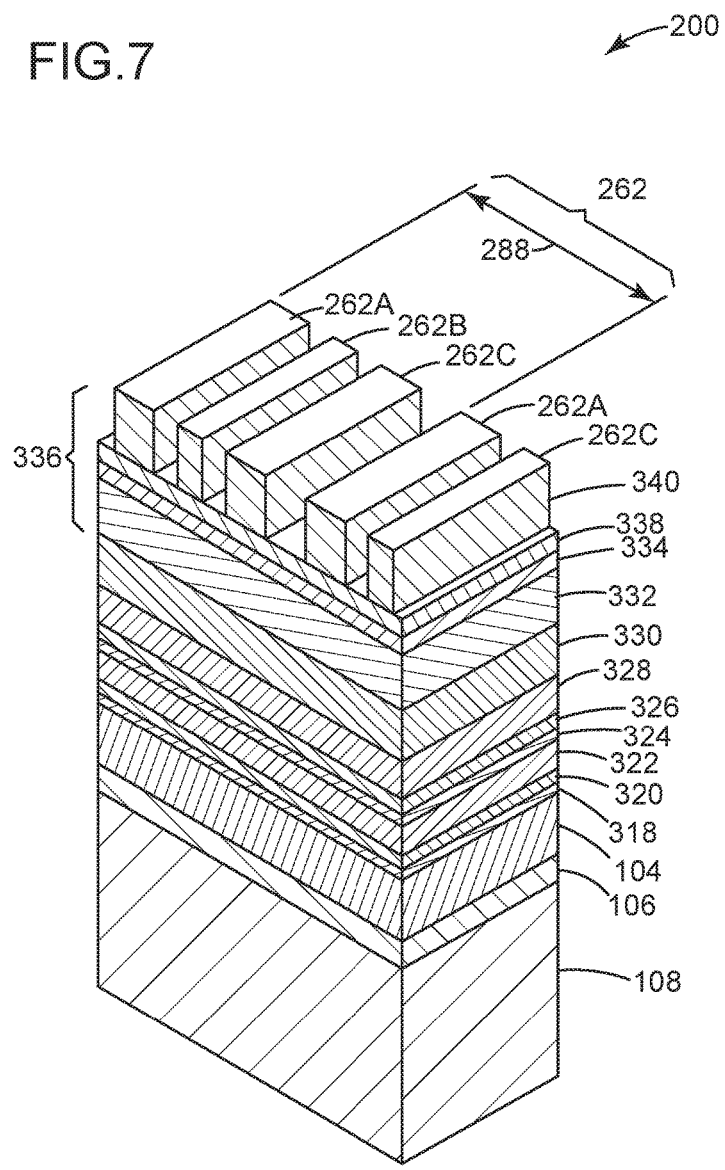

Referring to FIG. 7, the $1^{st}$ litho stack 336 is next completed and disposed onto the $1^{st}$ mandrel layer 330. The litho stack 336 can be composed of several different kinds of layers, depending on such parameters as the application requirements, design or proprietary preferences or the like. One such stack of layers includes a stack of four thin films which includes (from bottom to top) the $1^{st}$ SOH layer 332, the $1^{st}$ SiON cap layer 334, a $1^{st}$ bottom antireflective coating (BARC) layer 338, and a $1^{st}$ resist layer 340.

Once the stack 336 is disposed over the $1^{st}$ mandrel layer 330, the $1^{st}$ mandrel cells 262, which include $1^{st}$ mandrels 262A, B, and C, are patterned into the resist layer 340 through well-known lithographic techniques. The $1^{st}$ mandrel cells 262 are formed with the predetermined $1^{st}$ mandrel pitch 288.

Figure 8:
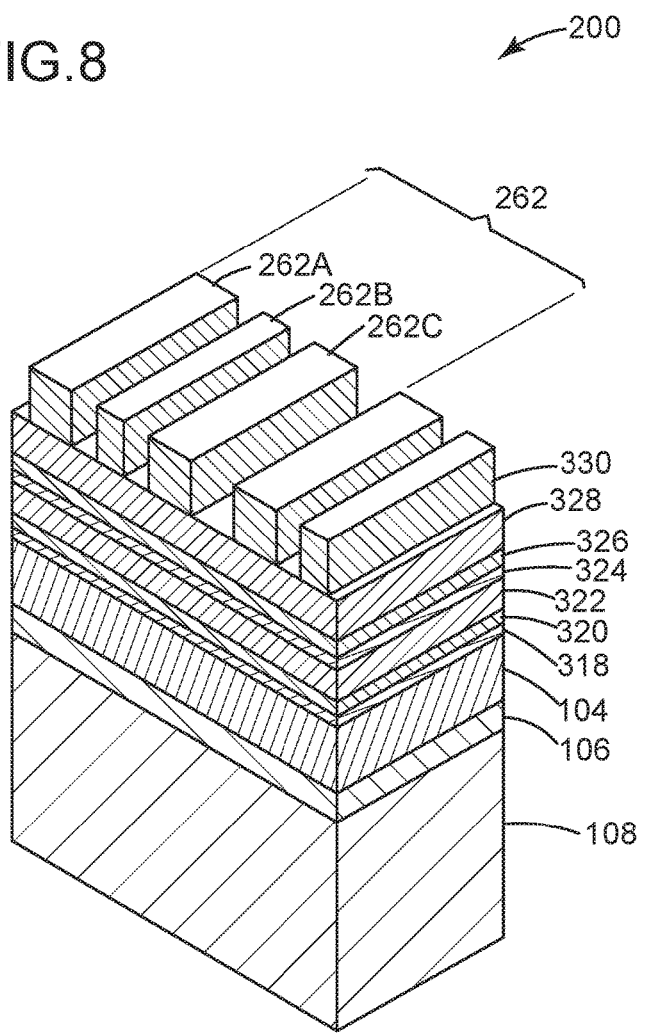
FIG. 8 is a perspective view the structure of FIG. 7 having the 1$^{st}$ mandrels patterned into the 1$^{st}$ mandrel layer in accordance with the present invention.

Referring to FIG. 8, the $1^{st}$ mandrel cells 262 are next patterned down to the $1^{st}$ mandrel layer 330. For purposes of clarity, any feature herein, such as a spacer, a trench, an opening, a plug, a mandrel or the like, that is etched down (i.e., formed or patterned) from an original feature will be referred to as such original feature if it has the same form and function as the original feature. However, it is well-known that the etched down feature will be a translation of the original feature and will be composed of remnants of the various layers involved in the etching process. More specifically, in the case of the mandrel cells 262, the original mandrel cells 262 were etched into the resist layer 340 and may be composed primarily of material from resist layer 340 (best seen in FIG. 7). However, once the mandrel cells 262 have been etched down and translated into the $1^{st}$ mandrel layer 330, the mandrel cells 262 may be composed primarily of the aSi material of the $1^{st}$ mandrel layer 330 (best seen in FIG. 8).

Referring to FIG. 9A, the process of patterning the $1^{st}$ openings 310 into the structure 200 is initiated by next disposing a $2^{nd}$ litho stack 342 over the $1^{st}$ mandrel cells 262. Similar to the $1^{st}$ litho stack 336, the $2^{nd}$ litho stack 342 can be composed of a $2^{nd}$ SOH layer 344, a $2^{nd}$ SiON cap layer 346, a $2^{nd}$ BARC layer 348, and a $2^{nd}$ resist layer 350. The $1^{st}$ openings 310 are then lithographically patterned into the $2^{nd}$ resist layer 350 such that they at least span the $1^{st}$ mandrel spaces 263 (best seen in FIG. 5). The $1^{st}$ openings 310 also span targeted locations of fully self-aligned continuity cuts 418 (best seen in FIG. 33) in metal lines D, F and J.

Referring to FIG. 9B, a cross sectional view of FIG. 9A taken along the line 9B-9B is presented. In FIG. 9B it can be seen that the $1^{st}$ openings 310 are patterned through the $2^{nd}$ resist layer 350 down to the $2^{nd}$ BARC layer 348.

Referring to FIG. 10, the $1^{st}$ openings 310 are next anisotropically etched (as, for example, by a reactive ion etching (RIE) process or similar) down, past the aSi $1^{st}$ mandrel cells 262, and through the SiN $6^{th}$ hardmask layer 328 to land on the aSi $5^{th}$ hardmask layer 326. Because the mandrel cells 262 and $5^{th}$ hardmask layer 326 are composed of the same or similar aSi material, the SiN $6^{th}$ hardmask layer 328 may be anisotropically etched selective to the mandrel cells 262 and $5^{th}$ hardmask layer 326 such that the sidewalls 264-274 (best seen in FIG. 5) of the $1^{st}$ mandrel cells 262 define (or self-align with) the edges of the $1^{st}$ openings 310 in the SiN $6^{th}$ hardmask layer 328.

After the $1^{st}$ openings 310 are self-aligned with the sidewalls 264-274 of the $1^{st}$ mandrel cells 262 within the $6^{th}$ hardmask layer 328, the $2^{nd}$ SOH layer 344 is stripped off of structure 200. This may be done by several well-known processes, such as wet etching, ashing or similar.

Referring to FIG. 11A, the process of patterning the $2^{nd}$ openings 312 into the structure 200 is initiated by next disposing a $3^{rd}$ litho stack 352 over the $1^{st}$ mandrel cells 262. Similar to the $1^{st}$ and $2^{nd}$ litho stacks 336 and 342, the $3^{rd}$ litho stack can be composed of a 3$^{rd}$ SOH layer 354, a 3$^{rd}$ SiON cap layer 356, a 3$^{rd}$ BARC layer 358, and a 3$^{rd}$ resist layer 360. The 2$^{nd}$ openings 312 are then lithographically patterned into the 3$^{rd}$ resist layer 360 such that they either partially or entirely span the 1$^{st}$ mandrels 262A, B, C.

Referring to FIG. 11B, a cross sectional view of FIG. 11A taken along the line 11B-11B is presented. In FIG. 11B it can be seen that the 2$^{nd}$ openings 312 are patterned through the 3$^{rd}$ resist layer 360 down to the top of the 3$^{rd}$ BARC layer 358.

Referring to FIG. 12, the 2$^{nd}$ openings 312 are then etched down to encompass at least one sidewall 264-274 (best seen in FIG. 5) of the 1$^{st}$ mandrels 262A, B, C. It is important to note, that at this stage of the process flow those 2$^{nd}$ openings 312 that entirely span a 1$^{st}$ mandrel (such as 2$^{nd}$ opening 312A entirely spanning 1$^{st}$ mandrel 262B in FIG. 5) will be fully self-aligned on both opposing distal ends, while those 2$^{nd}$ openings 312 that only partially span a 1$^{st}$ mandrel (such as 2$^{nd}$ mandrel opening 312B partially spanning 1$^{st}$ mandrel 262C in FIG. 5) will only self-aligned at one distal end (i.e., partially self-aligned).

Referring to FIG. 12, the 2$^{nd}$ openings 312 are next anisotropically etched (as, for example, by a RIE process or similar) down through the 3$^{rd}$ SOH layer 354 and into targeted locations of specific aSi 1$^{st}$ mandrels 262A, B, C to land on the SiN 6$^{th}$ hardmask layer 328. However, contrary to the etching process for the 1$^{st}$ opening 310, the etching process for the 2$^{nd}$ openings 312 does not penetrate through the SiN 6$^{th}$ hardmask layer 328.

The 2$^{nd}$ openings 312 are etched through targeted locations of the 1$^{st}$ mandrels 262A, B, C such that at least one end of each opening 312 spans over at least one sidewall 264-274 (best seen in FIG. 5) of the 1$^{st}$ mandrels to become self-aligned with that sidewall. It is important to note, that at this stage of the process flow those 2$^{nd}$ openings 312 that entirely span a 1$^{st}$ mandrel (such as 2$^{nd}$ opening 312A entirely spanning 1$^{st}$ mandrel 262B in FIG. 5) will be fully self-aligned on both opposing distal ends, while those 2$^{nd}$ openings 312 that only partially span a 1$^{st}$ mandrel (such as 2$^{nd}$ mandrel opening 312B partially spanning 1$^{st}$ mandrel 262C in FIG. 5) will only self-aligned at one distal end (i.e., partially self-aligned). These targeted locations also span across predetermined locations of the A, C, E, G and I lines and will be used to form fully self-aligned continuity cuts 420A, 420B (best seen in FIG. 33) later in the process flow.

It is also important to note, that due to lithographic tolerances, the non-self-aligned portions 316 (best seen in FIG. 5) of the 2$^{nd}$ openings, that do not span over a 1$^{st}$ mandrel sidewall, will almost certainly over-extend to metal lines that are adjacent to the targeted lines A, C, E, G. As such, if these non-self-aligned portions 316 are not repaired (or removed) later in the process flow, they will end up forming unwanted notches or cuts in the neighboring lines.

It is also important to note that the lithographic variability control is precise enough to prevent the 2$^{nd}$ openings 312 from spanning across the entire 1$^{st}$ mandrel spaces 263A, B, C (best seen in FIG. 5) between the mandrels 262A, B, C. Accordingly, the 1$^{st}$ mandrels adjacent to the targeted 1$^{st}$ mandrels of the 2$^{nd}$ openings 312 are not notched by this etching process.

Referring to FIG. 13, the 3$^{rd}$ SOH layer 354 is stripped off of structure 200. This may be done by several well-known processes, such as wet etching, ashing or similar.

Referring to FIG. 14A, a perspective view of FIG. 13 having a 1$^{st}$ mandrel spacer layer 362 dispose thereon is presented. The 1$^{st}$ mandrel spacer layer 362 has a predetermined first mandrel spacer layer thickness 364 and is conformally coated over first mandrels 262A, B, C. The first mandrel spacer layer 362 may be an oxide layer (such as SiO2) and may be coated over the first mandrels 262A, B, C by an atomic layer deposition (ALD) process.

Referring to FIG. 14B, a cross sectional view of FIG. 14A taken along the line 14B-14B is presented. As can be seen from this view, the 1$^{st}$ mandrel spacer layer 362 has filled the 1$^{st}$ openings 310 to form 1$^{st}$ cut plugs 366. The 1$^{st}$ cut plugs 366 penetrate the entire depth of the SiN 6$^{th}$ hardmask layer 328.

The oxide 1$^{st}$ cut plugs 366 will be subjected to certain etching processes later during the process flow. The height of the cut plug 366 is defined by the thickness of the 6$^{th}$ hardmask layer 328. For that reason, the 6$^{th}$ hardmask layer 328 must be thick enough to allow the 1$^{st}$ cut plug 366 to survive those etching processes without being entirely etched away. Typically, the thickness of the 6$^{th}$ hardmask layer 328 is within a range of 30-100 nm and is at least two, three or even four times as thick as the 4$^{th}$ and 5$^{th}$ hardmask layers 324, 326.

Referring to FIG. 14C, a cross sectional view of FIG. 14A taken along the line 14C-14C is presented. As can be seen from this view, the 1$^{st}$ mandrel spacer layer 362 has also filled the 2$^{nd}$ openings 312A to form a 2$^{nd}$ cut plug 368A. Additionally, the spacer layer 362 has also filled the 2$^{nd}$ openings 312B, C, D, E to form 2$^{nd}$ cut plugs 368B.

It is important to note that, at this stage of the process flow, the 2$^{nd}$ cut plugs 368A are fully self-aligned with the sidewalls 268, 270 of 1$^{st}$ mandrel 262B (best seen FIG. 5), because the 2$^{nd}$ cut plugs 368A fully span 1$^{st}$ mandrels 262B in this embodiment. This is important because the sidewalls 268, 270 will ultimately define the widths of lines E, across which the 2$^{nd}$ cut plugs 368A will be utilized to form self-aligned 2$^{nd}$ continuity cuts 420A (best seen in FIG. 33).

It is also important to note that, at this stage of the process flow, the 2$^{nd}$ cut plugs 368B are partially self-aligned with one sidewall 264, 266, 272, 274 of the 1$^{st}$ mandrels 262A, 262C (best seen in FIG. 5), because the 2$^{nd}$ cut plugs 368B partially span 1$^{st}$ mandrels 262A, C in this embodiment. This is important because the sidewalls 264, 266, 272, 274 will ultimately define one edge of lines A, C, G, I, across which the 2$^{nd}$ cut plugs 368B will be utilized to form self-aligned 2$^{nd}$ continuity cuts 420B (best seen in FIG. 33). The 2$^{nd}$ cut plugs 368A, B penetrate through the 1$^{st}$ mandrels 262A, B, C, but do not penetrate the 6$^{th}$ hardmask layer 328.

Referring to FIG. 15, the SiO2 1st mandrel spacer layer 362 is anisotropically etched to form the 1$^{st}$ mandrel spacers 276-286 on sidewalls 264-274 of the 1$^{st}$ mandrels 262A, B, C (best seen in FIG. 5). In this embodiment, the 1$^{st}$ mandrel spacers 276-286 have a width that is equal to the line space width 252 and is also equal to the 1$^{st}$ mandrel spacer layer thickness 364.

As noted with reference to FIG. 14, the 2$^{nd}$ cut plugs 368A are fully self-aligned with both the sidewalls of the 1$^{st}$ mandrels 262B and the 2$^{nd}$ cut plugs 368B are partially self-aligned with only one sidewall of 1$^{st}$ mandrels 262 A, C. Note also, that the portions of the 2$^{nd}$ cut plugs 368B that fill the non-self-aligned portions 316 of the 2$^{nd}$ openings 312 (best seen in FIG. 5) form a plurality of non-self-aligned plug portions 370 that need to be repaired (i.e., removed).

It is also important to note that the 1$^{st}$ cut plugs 366 are now fully self-aligned with the edges of the 1$^{st}$ mandrel spacers 276-286. This is important because the spacers 276-286 will ultimately define the widths of lines D, F, J, across which the 1$^{st}$ cut plugs 366 will be utilized to form self-aligned 1$^{st}$ continuity cuts 418 (best seen in FIG. 33).

Referring to FIGS. 16A and 16B wherein FIG. 16A is a cross sectional view of FIG. 15 taken along the line 16A-16A after the $1^{st}$ mandrels have been pulled and wherein FIG. 16B is a cross sectional view of FIG. 15 taken along the lines 16B-16B after the $1^{st}$ mandrel has been pulled. Next in the process flow the $1^{st}$ mandrels 262A, B, C are then removed or stripped. The removal of the $1^{st}$ mandrels 262A, B, C can be done with anyone of several well-known processes, such as a wet etching process, a RIE process or similar.

Thereafter, the structure 200 can be anisotropically etched selective to the oxide mandrel spacers 276-286, $1^{st}$ cut plugs 366 and $2^{nd}$ cut plugs 368A, B. The etching process substantially vertically etches down through the SiN $6^{th}$ hardmask layer 328 and aSi $5^{th}$ hardmask layer 326 to land on the TiN $4^{th}$ hardmask layer 324.

Referring more specifically to FIG. 16A, the $1^{st}$ cut plug 366 can best be seen. First cut plug 366 penetrates the entire SiN $6^{th}$ hardmask layer 328.

Referring more specifically to FIG. 16B, the $2^{nd}$ cut plugs 368A, B can best be seen. Second cut plugs 368A, B do not penetrate the SiN $6^{th}$ hardmask layer 328.

Referring to FIG. 17, the mandrel spacers 276-286, cut plugs 366, 368 and remainder of the SiN $6^{th}$ hardmask layer 328 are removed via any one of several well-known processes to reveal a $1^{st}$ pattern portion 372 that has been memorized into the aSi $5^{th}$ hardmask layer 326 and disposed over the TiN $4^{th}$ hardmask layer 324.

The $1^{st}$ pattern portion 372 includes a plurality of $1^{st}$ line space molds 374 which were formed from the $1^{st}$ mandrel spacers 276-286. The $1^{st}$ line space molds 374 extend longitudinally in the Y direction. The $1^{st}$ line space molds 374 define the locations of the lines spaces 230, 236, 238, 240, 242 and 248 that will be patterned into the dielectric layer 104.

The $1^{st}$ pattern portion 372 also includes a plurality of $1^{st}$ cut masks 376, formed from the $1^{st}$ cut plugs 366. The $1^{st}$ cut masks extend between and are fully self-aligned with the line space molds 374 in the X direction. The $1^{st}$ cut masks originated from the $1^{st}$ openings 310 and therefore span the $1^{st}$ mandrel spaces 263 (best seen in FIG. 5). In this embodiment, $1^{st}$ cut masks define the locations of the continuity cuts through lines D, F, and J.

Further, the $1^{st}$ pattern portion 372 includes a plurality of $2^{nd}$ cut masks 378A and B which were formed directly the $2^{nd}$ cut plugs 368. Since the $2^{nd}$ cut masks originated from the $2^{nd}$ openings 312, at least one end will extend from a line space mold 374.

More specifically, some of the $2^{nd}$ cut masks (such as $2^{nd}$ cut mask 378A) originated from $2^{nd}$ openings (such as $2^{nd}$ opening 312A (best seen in FIG. 5)) that completely span a $1^{st}$ mandrel (such as $1^{st}$ mandrel 262B (as best seen in FIG. 5)). In that case, the $2^{nd}$ cut mask 378A will extend between and be fully self-aligned with two adjacent line space molds (such as line space molds 374A and 374B).

However, some of the $2^{nd}$ cut masks (such as $2^{nd}$ cut masks 378B) originated from $2^{nd}$ openings (such as $2^{nd}$ openings 312B, C, D, E (best seen in FIG. 5)) which only partially span a $1^{st}$ mandrel (such as $1^{st}$ mandrels 262A and C (best seen in FIG. 5)). In that case, the $2^{nd}$ cut masks 378B will only extend from and will only be partially aligned with one line space mold 374. These $2^{nd}$ cut masks 378B will have a non-self-aligned mask portion 380, which corresponds with the non-self-aligned plug portions 370 of the $2^{nd}$ cut plugs 368 that they were directly formed from.

In this embodiment, fully self-aligned $2^{nd}$ cut mask 378A defines the locations of the continuity cuts through line E.

Also, in this embodiment, the partially self-aligned $2^{nd}$ cut masks 378B define locations of the continuity cuts through lines A, C, G and I.

Referring to FIG. 18, the $1^{st}$ pattern portion 372 is then transferred into the TiN $4^{th}$ hardmask layer. This can be done with an anisotropic etch process such as a RIE process.

Referring to FIG. 19, a $2^{nd}$ aSi mandrel layer 382 is next disposed over the $1^{st}$ pattern portion 372. This aSi mandrel layer 382 will be deposited and planarized using processing techniques consistent with common practices. A $4^{th}$ litho stack 384 is then disposed over the $2^{nd}$ mandrel layer 382. As in the previous litho stacks, the $4^{th}$ litho stack 384 can be composed of a $4^{th}$ SOH layer 386, a $4^{th}$ SiON cap layer 388, a $4^{th}$ BARC layer 390, and a $4^{th}$ resist layer 392.

Once the stack 384 is disposed over the $2^{nd}$ mandrel layer 382, the $2^{nd}$ mandrel cells 290, which include $2^{nd}$ mandrels 290A and B, are patterned into the resist layer 392 through well-known lithographic techniques. The $2^{nd}$ mandrel cells 262 are formed with the substantially same mandrel pitch 288 as the $1^{st}$ mandrel cells 262.

Referring to FIG. 20A, the $2^{nd}$ mandrel cells 290 are next patterned down to the $2^{nd}$ mandrel layer 382. This can be done through such techniques as a RIE process or similar.

Referring to FIG. 20B, a top view of FIG. 20A is presented. As can be seen, the $2^{nd}$ mandrel cells 290 are positioned relative to the $1^{st}$ pattern portion 372 such that they cover and protect the self-aligned portions of the $1^{st}$ pattern portion 372. As such, only the non-self-aligned mask portions 380 are left exposed and are not covered by the $2^{nd}$ mandrels 290A and B.

In order to properly cover the self-aligned portions of the $1^{st}$ pattern portion 372, the positioning of the $2^{nd}$ mandrel cells 290 relative to the $1^{st}$ mandrel cells 262 must be such that the $2^{nd}$ mandrels 290A, B entirely overlay at least the $1^{st}$ mandrel spaces 263A, B, C (best seen in FIG. 5). Additionally in this case, the mandrel 290A completely spans the positions of the $1^{st}$ mandrels 262B (best seen in FIG. 5) in order to cover the self-aligned $2^{nd}$ cut masks 378B.

Referring to FIG. 21, an enlarged perspective cross-sectional view of FIG. 20B taken along the line 21-21 is presented. As can be seen, the non-self-aligned mask portions 380 are the only part of $1^{st}$ pattern portion 372 that is exposed and not protected by the $2^{nd}$ mandrel cells 290A, 290B.

Referring to FIG. 22, the non-self-aligned mask portions 380 are next removed (or repaired) such that the $2^{nd}$ cut masks 378B now become self-aligned with the sidewalls of the $2^{nd}$ mandrels 290A, B. Removal is done using conventional anisotropic etching techniques, like RIE.

As such, the $2^{nd}$ cut masks 378B are now fully-self aligned at both of their distal ends with one of the sidewalls of the $1^{st}$ mandrels 262A, B, C and one of the sidewalls of the $2^{nd}$ mandrels 290A, B. This is important because the $1^{st}$ mandrel sidewalls 264, 266, 272, 274 will ultimately define one edge of lines A, C, G, I and the $2^{nd}$ mandrel sidewalls 292, 294, 296, 298 will ultimately define the opposing edge of lines A, C, G, I, across which the now fully self-aligned $2^{nd}$ cut masks 378B will be utilized to form self-aligned $2^{nd}$ continuity cuts 420B (best seen in FIG. 33).

Referring to FIG. 23A, next a $5^{th}$ litho stack 394 is disposed over the $2^{nd}$ mandrel cells 290. As before, the $5^{th}$ litho stack can be composed of a $5^{th}$ SOH layer 396, a $5^{th}$ SiON cap layer 398, a $5^{th}$ BARC layer 400, and a $5^{th}$ resist layer 402.

The $3^{rd}$ openings 314 are then lithographically patterned into the $5^{th}$ resist layer 402 such that they span the $2^{nd}$ mandrel spaces 291 (best seen in FIG. 5). The $3^{rd}$ openings 314 also span targeted locations of fully self-aligned continuity cuts 422 (best seen in FIG. 33) in metal lines B and H.

Referring to FIG. 23B, a cross sectional view of FIG. 23A taken along the line 23B-23B is presented. In FIG. 23B it can be seen that the $3^{rd}$ openings 314 are etched through the $5^{th}$ resist layer 402 down to the $5^{th}$ BARC layer 400.

Referring to FIG. 24, the $3^{rd}$ openings 314 are next anisotropically etched (as, for example, by a reactive ion etching (RIE) process or similar) down past the aSi $2^{nd}$ mandrel cells 290 and through the SiN $3^{rd}$ hardmask layer 322 to land on the aSi $2^{nd}$ hardmask layer 320. Because the mandrel cells 290 and $2^{nd}$ hardmask layer 320 are composed of the same or similar aSi material, the SiN $3^{rd}$ hardmask layer 322 may be anisotropically etched selective to the mandrel cells 290 and $2^{nd}$ hardmask layer 320 such that the sidewalls 292-298 (best seen in FIG. 5) of the $2^{nd}$ mandrel cells 290 define (or self-align with) the edges of the $3^{rd}$ openings 314 in the SiN $3^{rd}$ hardmask layer 322.

Referring to FIG. 25, after the $3^{rd}$ openings 314 are self-aligned with the sidewalls 292-298 of the $2^{nd}$ mandrel cells 290 within the $3^{rd}$ hardmask layer 322, the $5^{th}$ SOH layer 396 is stripped off of structure 200. This may be done by several well-known processes, such as wet etching, ashing or similar.

Referring to FIG. 26, a perspective view of FIG. 25 having a $2^{nd}$ mandrel spacer layer 404 dispose thereon is presented. The $2^{nd}$ mandrel spacer layer 404 has a predetermined $2^{nd}$ mandrel spacer layer thickness 406 and is conformally coated over $2^{nd}$ mandrel cells 290. The $2^{nd}$ mandrel spacer layer 404 may be an oxide layer (such as SiO2) and may be coated over the $2^{nd}$ mandrel cells 290 by an atomic layer deposition (ALD) process.

As can be seen from this view, the $2^{nd}$ mandrel spacer layer 404 has filled the $3^{rd}$ openings 314A, B to form $3^{rd}$ cut plugs 408. The $3^{rd}$ cut plugs 408 penetrate the entire depth of the SiN $3^{rd}$ hardmask layer 322. The $3^{rd}$ cut plugs 408 span the entire length of the a $2^{nd}$ mandrel spaces 291A, B and are self-aligned with the sidewalls 292-298 of the $2^{nd}$ mandrels 290A, B (best seen in FIG. 5).

Referring to FIG. 27, a perspective view of the structure 200 of FIG. 26 after the $2^{nd}$ mandrel spacer layer 404 has been anisotropically etched and the $2^{nd}$ mandrel cells 290 have been removed is presented. The SiO2 $2^{nd}$ mandrel spacer layer 404 is next anisotropically etched to form the $2^{nd}$ mandrel spacers 300-306 on sidewalls of the $2^{nd}$ mandrels 290A, B (best seen in FIG. 4). Then the $2^{nd}$ mandrel cells 290 are removed or stripped utilizing anyone of several well-known processes, such as a wet etching process, a RIE process or similar. Importantly, by stripping away the mandrel cells 290, the $1^{st}$ pattern portion 372 is now exposed on the surface of the $3^{rd}$ hardmask layer 322.

As can be seen from FIG. 27, the $2^{nd}$ mandrel spacers 300-306 have their $2^{nd}$ spacer width, which in this embodiment, is set equal to minimum line space width 252 (best seen in FIG. 4). The $2^{nd}$ spacer width is equal to and defined by the $2^{nd}$ mandrel spacer layer thickness 406.

It is important to note that at this stage of the process flow the $3^{rd}$ cut plugs 408 are now fully self-aligned with the edges of the $2^{nd}$ mandrel spacers 300-306 This is important because the $2^{nd}$ mandrel spacers 300-306 will ultimately define the widths of lines B, H, across which the $3^{rd}$ cut plugs 408 will be utilized to form self-aligned $3^{rd}$ continuity cuts 422 (best seen in FIG. 33).

The $2^{nd}$ mandrel spacers 300-306 and the $3^{rd}$ cut plugs 408 collectively form a $2^{nd}$ pattern portion 410. Additionally, the $2^{nd}$ pattern portion 410 and the exposed $1^{st}$ pattern portion 372 combine to form a final pattern 412 (best seen in FIG. 30) which will be utilized to form the lines A, B, C, D, E, F, J, I and continuity cuts 418, 420A, 420B, 422 of the cells 202A, 202B (best seen in FIG. 33).

Referring to FIG. 28, the final pattern 412 is next transferred through the $3^{rd}$ hardmask layer 322, down to the $2^{nd}$ hardmask layer 320. This can be done by a RIE process or similar.

Referring to FIG. 29, the final pattern 412 is next transferred into the $2^{nd}$ hardmask layer 320 and down to the TiN $1^{st}$ hardmask layer 318. This can also be done by a RIE process or similar.

Referring to FIG. 30, the remnants of the $3^{rd}$ hardmask layer 322, the $3^{rd}$ cut plugs 408 and the $2^{nd}$ mandrel spacers 300-306 are removed through well-known processes. The final pattern 412 now is disposed in the $2^{nd}$ hardmask layer 320, directly over the TiN $1^{st}$ hardmask layer 318.

Note also that the removal of the $3^{rd}$ cut plugs 408 forms the $3^{rd}$ cut mask 409. The $3^{rd}$ cut mask 409 is fully self-aligned with the positions of the sidewalls of the $2^{nd}$ mandrels 290A, B.

Referring to FIG. 31, the pattern 412 is anisotropically etched into the TiN $1^{st}$ hardmask layer 318. This can also be done by a RIE process or similar. The pattern 412 is now disposed directly over the dielectric layer 104.

Referring to FIG. 32, the dielectric layer 104 is next anisotropically etched to transfer the final pattern 412 into the dielectric layer in the form of a series of pattern trenches 414. This can be done by a RIE process of similar.

Referring to FIG. 33, a perspective view of FIG. 32 after structure 200 has been metalized is presented. It is important to note that FIG. 33 is also a perspective view of FIGS. 3, 4 and 5.

Next during the process flow, the structure 200 is metalized. That is, a metal layer 416 is next disposed over structure 200 to fill the trenches 414. This can be done by PVD, CVD or electroless metal plating or similar. The metal layer 416 may be composed of tungsten, copper, cobalt, ruthenium or similar.

The metal layer 416 is next planarized down to finalize the formation of the cells 202A and 202B into the dielectric layer 104 of the structure 200. This may be done by chemical mechanical polishing or similar.

As can be seen, the structure 200 now includes the fully formed metal lines A-E of cells 202A and fully formed the metal lines F-J of cells 202B. The metal lines A-E are substantially identical to each other.

The metal lines A-E of cells 202A are separated by fully formed line spaces 230-238. Additionally, the metal lines F-J of cells 202B are separated by fully formed line spaces 240-248. The line spaces 230-238 are substantially identical to line spaces 240-248. As discussed in FIGS. 3, 4 and 5, the lines spaces 230-248 are substantially equal in width to each other and to the minimum line space width 252. Advantageously, the line spaces are not subject to lithographic variation.

Also, the metal signal lines A-D are set substantially equal in width to each other and to the minimum line width 250. The power lines E and J have widths 218, 228 that are set to be substantially equal to two signal line widths plus one line space width. Advantageously, the widths of the metal lines A-J may vary depending on performance specifications as long as they take into consideration worst case lithographic variation.

However, no matter what the variations of the metal line widths, the widths of the line spaces will not be affected by them. Therefore, the cell structure may be scaled down to minimum pitches of 36 nm, 32 nm, 28 nm, 26 nm or less and still be able to prevent inadvertent electrical shorting between lines.

Additionally, the cells 202A, B include a series of $1^{st}$ continuity cuts (or continuity blocks) 418, second continuity cuts 420A, 420B and third continuity cuts 422 disposed in the lines A-J. Advantageously, all of the cuts are fully self-aligned.

The $1^{st}$ continuity cuts 418 are disposed in metal lines D, F, J and correspond to $1^{st}$ openings 310A, B, C (best seen in FIG. 5). The $1^{st}$ openings 310A, B, C originally spanned the $1^{st}$ mandrel spaces 263A, B, C and were self-aligned with $1^{st}$ mandrel sidewalls 264, 266, 268, 270, 272, 274. The $1^{st}$ mandrel spacer layer 362 was disposed over the $1^{st}$ openings 310A, B, C to form the $1^{st}$ cut plugs 366. The $1^{st}$ cut plugs 366 were then etched down to form the $1^{st}$ cut masks 376 of the final pattern 412. The final pattern 412 was then etched into the dielectric layer 104 to form the $1^{st}$ continuity cuts 418.

The $2^{nd}$ continuity cuts 420A are disposed in metal line E and correspond to $2^{nd}$ openings 312A (best seen in FIG. 5). The $2^{nd}$ openings 312A originally fully spanned the $1^{st}$ mandrels 262B and were self-aligned with both $1^{st}$ mandrel sidewalls 268, 270. The $1^{st}$ mandrel spacer layer 362 was disposed over the $1^{st}$ openings 312A to form the $2^{nd}$ cut plugs 368A. The $2^{nd}$ cut plugs 368A were then etched down to form the $2^{nd}$ cut masks 378A of the final pattern 412. The final pattern 412 was then etched into the dielectric layer 104 to form the $2^{nd}$ continuity cuts 420A.

The $2^{nd}$ continuity cuts 420B are disposed in metal lines A, C, G, I and correspond to $2^{nd}$ openings 312B, C, D, E (best seen in FIG. 5). The $2^{nd}$ openings 312B, C, D, E originally partially spanned the $1^{st}$ mandrels 262A, C and were self-aligned with only one $1^{st}$ mandrel sidewall 264, 266, 272, 274. The $1^{st}$ mandrel spacer layer 362 was disposed over the $2^{nd}$ openings 312B, C, D, E to form the $2^{nd}$ cut plugs 368B.

The $2^{nd}$ cut plugs 368B had a non-self-aligned plug portion 370 that had to be repaired (i.e., removed). In order to accomplish this repair, the $2^{nd}$ mandrel cells 290 were then disposed over the $1^{st}$ mandrel cells 262 such that the $2^{nd}$ mandrels 290A, B entirely overlaid the $1^{st}$ mandrel spaces 263A, B, C. More specifically, $2^{nd}$ mandrel 290A entirely overlaid $1^{st}$ mandrel spaces 263A, 263B and $1^{st}$ mandrel 262B. Also more specifically, the $2^{nd}$ mandrel 290B entirely overlaid $1^{st}$ mandrel space 263C. Accordingly, the positioning of the $2^{nd}$ mandrel cells 290 entirely covered and protected the $1^{st}$ cut plugs 366 and $2^{nd}$ cut plugs 368A. The mandrel cells 290 also covered the $2^{nd}$ cut plugs 368B except for the non-self-aligned plug portion 370. The exposed non-self-aligned plug portions 370 could then be removed by an anisotropic etching process, such as a RIE process or similar. As such, the $2^{nd}$ cut plugs were now fully self-aligned with one sidewall of a $1^{st}$ mandrel 262A, C and one sidewall of a $2^{nd}$ mandrel 290A, B.

The fully aligned $2^{nd}$ cut plugs 368B were then etched down to form the $2^{nd}$ cut masks 378B of the final pattern 412. The final pattern 412 was then etched into the dielectric layer 104 to form the $2^{nd}$ continuity cuts 420B.

The $3^{rd}$ continuity cuts 422 are disposed in metal lines B, H and correspond to $3^{rd}$ openings 314A, B (best seen in FIG. 5). The $3^{rd}$ openings 314A, B originally spanned the $2^{nd}$ mandrel spaces 291A, B and were self-aligned with $2^{nd}$ mandrel sidewalls 292, 294, 296, 298. The $2^{nd}$ mandrel spacer layer 404 was disposed over the $3^{rd}$ openings 314A, B to form the $3^{rd}$ cut plugs 408. The $3^{rd}$ cut plugs 408 were then etched down to form the $3^{rd}$ cut masks 409 of the final pattern 412. The final pattern 412 was then etched into the dielectric layer 104 to form the self-aligned $3^{rd}$ continuity cuts 422.

Referring to FIG. 34, a perspective view of structure 100 of FIGS. 1 and 2 is presented. By way of a comparison to the 6 track cells 202A, B of FIG. 33 having an odd number of metal lines per cell, FIG. 34 is a series of 5 track cells 102 having an even number of metal lines per cell.

Though structure 100 is shown as having cells 102 that are 5 track cells with four metal lines per cell, the cells 102 could be any size track with any even number of metal lines per cell and still be in accordance with the present invention. For example structure 100 could have cells that are 7.5 track cells with 6 metal lines per cell.

Though structure 200 is shown as having cells 202A, 202B that are 6 track cells with five metal lines per cell, the cells 202A, 202B could be any size track with any odd number of metal lines per cell and still be in accordance with the present invention. For example structure 200 could have cells that are 8.5 track cells with 7 metal lines per cell.

Structure 100 has been formed with a similar method to that described in the formation of structure 200 in accordance with one or more aspects of the present invention. As can be seen, the structure 100 now includes the fully formed metal lines A, B, C, D of cells 102, which were formed from the deposition and planarization of a metal layer 424.

The metal lines A-D of cells 102 are separated by fully formed line spaces 118-124. As discussed in FIGS. 1 and 2, the lines spaces 118-124 are substantially equal in width to each other and to the minimum space width 138. Advantageously, the line spaces are not subject to lithographic variation.

Also, the metal signal lines A-C are set substantially equal in width to each other and to the minimum line width 136. The power lines D have a width 116 that is set to be substantially equal to two signal line widths plus one line space width. Advantageously, the widths of the metal lines A-D may vary depending on performance specifications as long as they take into consideration worst case lithographic variations.

However, no matter what the variations of the metal line widths, the widths of the line spaces will not be affected by them. Therefore, the cell structure may be scaled down to minimum pitches of 36 nm, 32 nm, 28 nm, 26 nm or less and still be able to prevent inadvertent electrical shorting between lines.

Additionally, the cells 102 include a series of $1^{st}$ continuity cuts (or continuity blocks) 426, second continuity cuts 428 and third continuity cuts 430 disposed in the lines A-D. Advantageously, all of the cuts are fully self-aligned. More specifically, in this embodiment, the $1^{st}$ continuity cuts 426 are formed in metal lines B, the $2^{nd}$ continuity cuts are formed into metal lines A, C and the $3^{rd}$ continuity cuts are formed into metal lines D.

As before, the $2^{nd}$ continuity cuts will have a non-aligned portion (not shown) that must be repaired during formation of the cell 102. In order to accomplish this the $2^{nd}$ mandrel cells 154 must be positioned relative to the $1^{st}$ mandrel cells 146 such that the $2^{nd}$ mandrels 156 entirely overlay the $1^{st}$ mandrel spaces 151 (best seen in FIG. 2).

The main differences in the formation of cells structures 100 and 200 are:
  cell 102 has an even number of lines A-D and line spaces 118-124;
  cells 202A, B have an odd number of lines A-J and line spaces 230-248;

the pitch of cell 102 is substantially equal to the mandrel pitch;

the pitch of cells 202A, B is substantially equal to half the mandrel cell pitch 288;

the number of metal lines within cell 102 are equal to twice the sum of the number of $1^{st}$ mandrels 148 within the $1^{st}$ mandrel cell 146 plus the number of $2^{nd}$ mandrels 156 within the $2^{nd}$ mandrel cell 154; and the number of metal lines within cells 202A, B are equal to the sum of the number of $1^{st}$ mandrels 262A, B, C within the $1^{st}$ mandrel cell 262 plus the number of $2^{nd}$ mandrels 290A, B within the $2^{nd}$ mandrel cell 290.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A method comprising:
patterning a $1^{st}$ mandrel cell into a $1^{st}$ mandrel layer disposed above a dielectric layer of a semiconductor structure, the $1^{st}$ mandrel cell having at least one $1^{st}$ mandrel, at least one $1^{st}$ mandrel space and a mandrel cell pitch;
patterning a $2^{nd}$ mandrel cell into a $2^{nd}$ mandrel layer disposed above the $1^{st}$ mandrel layer, the $2^{nd}$ mandrel cell having at least one $2^{nd}$ mandrel, at least one $2^{nd}$ mandrel space, and substantially the same mandrel cell pitch; and
utilizing the $1^{st}$ and $2^{nd}$ mandrel cells to form a metal line cell into the dielectric layer, the metal line cell having metal lines, spaces between metal lines and a line cell pitch;
wherein the line cell pitch is substantially equal to the mandrel cell pitch when the metal lines of the metal line cell are an even number, and
wherein the line cell pitch is substantially equal to half the mandrel cell pitch when the metal lines of the metal line cell are an odd number.

2. The method of claim 1 wherein:
the number of metal lines within the line cell are equal to the sum of the number of $1^{st}$ mandrels within the $1^{st}$ mandrel cell plus the number of $2^{nd}$ mandrels within the $2^{nd}$ mandrel cell when the metal lines of the metal line cell are an odd number; and
the number of metal lines within the line cell are equal to twice the sum of the number of $1^{st}$ mandrels within the $1^{st}$ mandrel cell plus the number of $2^{nd}$ mandrels within the $2^{nd}$ mandrel cell when the metal lines of the metal line cell are an even number.

3. The method of claim 1 comprising:
patterning a plurality of substantially identical $1^{st}$ mandrel cells into the $1^{st}$ mandrel layer;
patterning a plurality of substantially identical $2^{nd}$ mandrel cells into the $2^{nd}$ mandrel layer; and
utilizing the $1^{st}$ and $2^{nd}$ mandrel cells to form a plurality of substantially identical metal line cells into the dielectric layer.

4. The method of claim 3 comprising positioning the $2^{nd}$ mandrel cells relative to the $1^{st}$ mandrel cells such that the $2^{nd}$ mandrels entirely overlay the $1^{st}$ mandrel spaces.

5. The method of claim 4 comprising:
forming $1^{st}$ mandrel spacers on sidewalls of the $1^{st}$ mandrels;
forming $2^{nd}$ mandrel spacers on sidewalls of the $2^{nd}$ mandrels;
utilizing the $1^{st}$ and $2^{nd}$ mandrels to form the metal lines; and
utilizing the $1^{st}$ and $2^{nd}$ mandrel spacers to form the spaces between metal lines.

6. The method of claim 5 comprising:
forming $1^{st}$ and $2^{nd}$ adjacent substantially identical metal line cells into the dielectric layer from the $1^{st}$ and $2^{nd}$ mandrel cells, the $1^{st}$ mandrel cell including three $1^{st}$ mandrels per cell and the $2^{nd}$ mandrel cell including two $2^{nd}$ mandrels per cell, wherein:
the $1^{st}$ metal line cell includes consecutive A, B, C, D and E lines respectively separated by $1^{st}$, $2^{nd}$, $3^{rd}$, $4^{th}$ and $5^{th}$ line spaces, the A, B, C and D lines being signal lines and the E line being a power line having an E line width that is larger than any width of the A, B, C and D lines, and
the $2^{nd}$ metal line cell includes consecutive F, J, K, L and M lines respectively separated by $6^{th}$, $7^{th}$, $8^{th}$, $9^{th}$ and $10^{th}$ line spaces, the F, J, K and L lines being signal lines and the M line being a power line having an M line width that is larger than any width of the F, J, K and L lines,
etching the $1^{st}$ mandrel spacers into the dielectric layer to form the $1^{st}$, $4^{th}$, $5^{th}$, $6^{th}$, $7^{th}$ and $10^{th}$ lines spaces; and
etching the $2^{nd}$ mandrel spacers into the dielectric layer to form the $2^{nd}$ $3^{rd}$ $8^{th}$ and $9^{th}$ line spaces.

7. The method of claim 6 wherein the metal line cells have a line cell pitch that is substantially equal to a 6 track cell pitch.

8. A method comprising:
patterning a $1^{st}$ mandrel cell into a $1^{st}$ mandrel layer disposed above a dielectric layer of a semiconductor structure, the $1^{st}$ mandrel cell having at least one $1^{st}$ mandrel, at least one $1^{st}$ mandrel space and a $1^{st}$ mandrel cell pitch;
patterning a $2^{nd}$ mandrel cell into a $2^{nd}$ mandrel layer disposed above the $1^{st}$ mandrel layer, the $2^{nd}$ mandrel cell having at least one $2^{nd}$ mandrel, at least one $2^{nd}$ mandrel space and a $2^{nd}$ mandrel cell pitch; and
utilizing the $1^{st}$ and $2^{nd}$ mandrel cells to form a metal line cell into the dielectric layer, the metal line cell having metal lines, metal line spaces and a line cell pitch;
wherein the number of metal lines within the line cell are equal to the sum of the number of $1^{st}$ mandrels within the $1^{st}$ mandrel cell plus the number of $2^{nd}$ mandrels within the $2^{nd}$ mandrel cell when the metal lines of the metal line cell are an odd number; and
the number of metal lines within the line cell are equal to twice the sum of the number of $1^{st}$ mandrels within the $1^{st}$ mandrel cell plus the number of $2^{nd}$ mandrels within the $2^{nd}$ mandrel cell when the metal lines of the metal line cell are an even number.

9. The method of claim 8 comprising the $1^{st}$ mandrel cell pitch being substantially equal to the $2^{nd}$ mandrel cell pitch.

10. The method of claim 9 comprising:
patterning a plurality of substantially identical $1^{st}$ mandrel cells into the $1^{st}$ mandrel layer;
patterning a plurality of substantially identical $2^{nd}$ mandrel cells into the $2^{nd}$ mandrel layer; and
utilizing the $1^{st}$ and $2^{nd}$ mandrel cells to form a plurality of metal line cells into the dielectric layer.

11. The method of claim 10 comprising positioning the $2^{nd}$ mandrel cells relative to the $1^{st}$ mandrel cells such that the $2^{nd}$ mandrels entirely overlay the $1^{st}$ mandrel spaces.

12. A method comprising:

patterning a $1^{st}$ mandrel cell into a $1^{st}$ mandrel layer disposed above a dielectric layer of a semiconductor structure, the $1^{st}$ mandrel cell having at least one $1^{st}$ mandrel, at least one $1^{st}$ mandrel space and a mandrel cell pitch;

patterning a $2^{nd}$ mandrel cell into a $2^{nd}$ mandrel layer disposed above the $1^{st}$ mandrel layer, the $2^{nd}$ mandrel cell having at least one $2^{nd}$ mandrel, at least one $2^{nd}$ mandrel space, and substantially the same mandrel cell pitch;

positioning the $2^{nd}$ mandrel cell relative to the $1^{st}$ mandrel cell such that the $2^{nd}$ mandrels entirely overlay the $1^{st}$ mandrel spaces; and utilizing the $1^{st}$ and $2^{nd}$ mandrel cells to form a metal line cell into the dielectric layer, the metal line cell having metal lines, metal line spaces and a line cell pitch.

13. The method of claim 12 wherein:
the line cell pitch is substantially equal to the mandrel cell pitch when the metal lines of the metal line cell are an even number, and
the line cell pitch is substantially equal to half the mandrel cell pitch when the metal lines of the metal line cell are an odd number.

14. The method of claim 12 wherein:
the number of metal lines within the line cell are equal to the sum of the number of $1^{st}$ mandrels within the $1^{st}$ mandrel cell plus the number of $2^{nd}$ mandrels within the $2^{nd}$ mandrel cell when the metal lines of the metal line cell are an odd number; and
the number of metal lines within the line cell are equal to twice the sum of the number of $1^{st}$ mandrels within the $1^{st}$ mandrel cell plus the number of $2^{nd}$ mandrels within the $2^{nd}$ mandrel cell when the metal lines of the metal line cell are an even number.

15. The method of claim 13 comprising:
patterning a plurality of substantially identical $1^{st}$ mandrel cells into the $1^{st}$ mandrel layer;
patterning a plurality of substantially identical $2^{nd}$ mandrel cells into the $2^{nd}$ mandrel layer; and
utilizing the $1^{st}$ and $2^{nd}$ mandrel cells to form a plurality of substantially identical metal line cells into the dielectric layer.

16. The method of claim 15 comprising:
disposing the $1^{st}$ mandrel cells over a hardmask layer;
patterning and etching $1^{st}$ openings into the hardmask layer, the $1^{st}$ openings entirely spanning the $1^{st}$ mandrel spaces between the $1^{st}$ mandrels such that the $1^{st}$ openings are fully self-aligned with adjacent $1^{st}$ mandrel sidewalls of the $1^{st}$ mandrels; and utilizing the $1^{st}$ mandrel openings to form self-aligned $1^{st}$ continuity cuts into the metal lines of the metal lines cells.

17. The method of claim 15 comprising:
disposing the $1^{st}$ mandrel cells over a hardmask layer;
patterning and etching $2^{nd}$ openings into the $1^{st}$ mandrels, the $2^{nd}$ openings partially spanning a plurality of $1^{st}$ mandrels such that the $2^{nd}$ openings are partially self-aligned with only one sidewall of the $1^{st}$ mandrels, the $2^{nd}$ openings have a non-self-aligned portion extending partially through the $1^{st}$ mandrels;
disposing $2^{nd}$ cut plugs into the $2^{nd}$ openings, the portion of the $2^{nd}$ cut plugs that fill the non-self-aligned portions of the $2^{nd}$ openings forming a plurality of non-self-aligned plug portions;
disposing the $2^{nd}$ mandrel cells over the $2^{nd}$ cut plugs such that the $2^{nd}$ mandrels cover the $2^{nd}$ cut plugs except for the non-self-aligned portions;
removing the expose non-self-aligned portions to fully self-align the $2^{nd}$ cut plugs with sidewalls of the $2^{nd}$ mandrels and $1^{st}$ mandrels; and
utilizing the 2 cut plugs to form self-aligned $2^{nd}$ continuity cuts into the metal lines of the metal lines cells.

18. The method of claim 15 comprising:
disposing the $1^{st}$ mandrel cells over a hardmask layer;
patterning and etching $2^{nd}$ openings into the $1^{st}$ mandrels, the $2^{nd}$ openings entirely spanning a plurality of $1^{st}$ mandrels such that the $2^{nd}$ openings are fully self-aligned with only opposing sidewalls of the $1^{st}$ mandrels; and
utilizing the $2^{nd}$ openings to form self-aligned $2^{nd}$ continuity cuts into the metal lines of the metal lines cells.

19. The method of claim 18 comprising:
disposing $2^{nd}$ cut plugs into the $2^{nd}$ openings;
disposing the $2^{nd}$ mandrel cells over the $2^{nd}$ cut plugs such that the $2^{nd}$ mandrels entirely cover the $2^{nd}$ cut plugs; and
utilizing the 2 cut plugs to form self-aligned $2^{nd}$ continuity cuts into the metal lines of the metal lines cells.

20. The method of claim 15 comprising:
disposing the $2^{nd}$ mandrel cells over a hardmask layer;
patterning and etching $3^{rd}$ openings into the hardmask layer, the $3^{rd}$ openings entirely spanning the $2^{nd}$ mandrel spaces between the $2^{nd}$ mandrels such that the $3^{rd}$ openings are fully self-aligned with adjacent $2^{nd}$ mandrel sidewalls of the $2^{nd}$ mandrels; and
utilizing the $3^{rd}$ mandrel openings to form self-aligned $3^{rd}$ continuity cuts into the metal lines of the metal lines cells.

* * * * *